US010164120B2

(12) United States Patent
Kurata et al.

(10) Patent No.: US 10,164,120 B2
(45) Date of Patent: Dec. 25, 2018

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Motomu Kurata, Kanagawa (JP); Shinya Sasagawa, Kanagawa (JP); Katsuaki Tochibayashi, Kanagawa (JP); Satoru Okamoto, Kanagawa (JP); Akihisa Shimomura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/576,445

(22) PCT Filed: May 18, 2016

(86) PCT No.: PCT/IB2016/052879
§ 371 (c)(1),
(2) Date: Nov. 22, 2017

(87) PCT Pub. No.: WO2016/189425
PCT Pub. Date: Dec. 1, 2016

(65) Prior Publication Data

US 2018/0151742 A1     May 31, 2018

(30) Foreign Application Priority Data

May 28, 2015  (JP) ................. 2015-108219
Jun. 16, 2015  (JP) ................. 2015-121182

(51) Int. Cl.
*H01L 29/786*      (2006.01)
*H01L 29/66*       (2006.01)
(Continued)

(52) U.S. Cl.
CPC .......... *H01L 29/7869* (2013.01); *G06F 9/327* (2013.01); *G06K 19/0723* (2013.01);
(Continued)

(58) Field of Classification Search
CPC combination set(s) only.
See application file for complete search history.

(56) References Cited

U.S. PATENT DOCUMENTS 6,764,884 B1   7/2004  Yu et al.
8,547,771 B2  10/2013  Koyama
(Continued)

FOREIGN PATENT DOCUMENTS

CN     001771589 A    5/2006
CN     105190902 A   12/2015
(Continued)

OTHER PUBLICATIONS

International Search Report (Application No. PCT/IB2016/052879) dated Sep. 13, 2016.
(Continued)

*Primary Examiner* — Mamadou Diallo
(74) *Attorney, Agent, or Firm* — Fish & Richardson P.C.

(57) ABSTRACT

A transistor including a semiconductor, a first conductor, a second conductor, a third conductor, a first insulator, and a second insulator is manufactured by forming a hard mask layer including a fourth conductor over the second insulator, a third insulator over the fourth conductor, forming an opening portion in the second insulator with the hard mask layer as the mask, eliminating the hard mask layer by forming the opening portion, and forming the first insulator and the first conductor in the opening portion.

7 Claims, 50 Drawing Sheets

(51) Int. Cl.

| | | |
|---|---|---|
| *H01L 21/8234* | (2006.01) | |
| *H01L 21/8238* | (2006.01) | |
| *H01L 21/28* | (2006.01) | |
| *H01L 29/417* | (2006.01) | |
| *H01L 29/423* | (2006.01) | |
| *H01L 29/49* | (2006.01) | |
| *H01L 27/06* | (2006.01) | |
| *H01L 27/08* | (2006.01) | |
| *H01L 27/088* | (2006.01) | |
| *H01L 27/092* | (2006.01) | |
| *H01L 27/105* | (2006.01) | |
| *H01L 27/108* | (2006.01) | |
| *H01L 29/788* | (2006.01) | |
| *H01L 29/792* | (2006.01) | |
| *H01L 27/115* | (2017.01) | |
| *H01L 51/50* | (2006.01) | |
| *H01L 27/146* | (2006.01) | |
| *H05B 33/14* | (2006.01) | |
| *G06F 9/32* | (2018.01) | |
| *G06K 19/07* | (2006.01) | |
| *H01L 23/31* | (2006.01) | |
| *H01L 23/498* | (2006.01) | |
| *H01L 23/00* | (2006.01) | |
| *H01L 27/12* | (2006.01) | |
| *G02F 1/1368* | (2006.01) | |
| *H01L 27/32* | (2006.01) | |

(52) U.S. Cl.
CPC .......... *H01L 21/28* (2013.01); *H01L 21/8234* (2013.01); *H01L 21/8238* (2013.01); *H01L 23/3114* (2013.01); *H01L 23/49861* (2013.01); *H01L 24/48* (2013.01); *H01L 27/06* (2013.01); *H01L 27/08* (2013.01); *H01L 27/088* (2013.01); *H01L 27/092* (2013.01); *H01L 27/105* (2013.01); *H01L 27/108* (2013.01); *H01L 27/1052* (2013.01); *H01L 27/115* (2013.01); *H01L 27/124* (2013.01); *H01L 27/1207* (2013.01); *H01L 27/1225* (2013.01); *H01L 27/1255* (2013.01); *H01L 27/146* (2013.01); *H01L 27/14616* (2013.01); *H01L 27/14621* (2013.01); *H01L 27/14627* (2013.01); *H01L 27/14645* (2013.01); *H01L 29/417* (2013.01); *H01L 29/423* (2013.01); *H01L 29/49* (2013.01); *H01L 29/66969* (2013.01); *H01L 29/786* (2013.01); *H01L 29/788* (2013.01); *H01L 29/78609* (2013.01); *H01L 29/78648* (2013.01); *H01L 29/792* (2013.01); *H01L 51/50* (2013.01); *H05B 33/14* (2013.01); *G02F 1/1368* (2013.01); *H01L 27/3262* (2013.01); *H01L 2224/48227* (2013.01)

(56) References Cited

U.S. PATENT DOCUMENTS

| | | | |
|---|---|---|---|
| 8,883,577 B2 | 11/2014 | Nara | |
| 8,995,174 B2 | 3/2015 | Koyama | |
| 9,209,795 B2 | 12/2015 | Okamoto et al. | |
| 9,337,344 B2 | 5/2016 | Hanaoka | |
| 9,559,211 B2* | 1/2017 | Yamazaki | H01L 21/0237 |
| 9,704,886 B2 | 7/2017 | Takemura | |
| 2010/0167475 A1 | 7/2010 | Nara | |
| 2014/0332800 A1 | 11/2014 | Hanaoka | |
| 2015/0280013 A1 | 10/2015 | Yamazaki et al. | |
| 2015/0280691 A1 | 10/2015 | Koyama | |
| 2015/0372009 A1 | 12/2015 | Yamazaki | |
| 2016/0247934 A1 | 8/2016 | Hanaoka | |
| 2016/0293732 A1* | 10/2016 | Kurata | H01L 29/66666 |
| 2017/0236848 A1 | 8/2017 | Yamazaki | |

FOREIGN PATENT DOCUMENTS

| | | |
|---|---|---|
| DE | 112004000578 | 2/2006 |
| GB | 2417134 | 2/2006 |
| JP | 2006-522486 | 9/2006 |
| JP | 2010-153689 A | 7/2010 |
| JP | 2012-049514 A | 3/2012 |
| JP | 2012-257187 A | 12/2012 |
| JP | 2014-239213 A | 12/2014 |
| JP | 2014-240833 A | 12/2014 |
| JP | 2014-241407 A | 12/2014 |
| JP | 2015-195380 A | 11/2015 |
| JP | 2016-021559 A | 2/2016 |
| KR | 2005-0119679 A | 12/2005 |
| KR | 2016-0006718 A | 1/2016 |
| TW | 200425425 | 11/2004 |
| TW | 201501313 | 1/2015 |
| TW | 201543689 | 11/2015 |
| TW | 201603282 | 1/2016 |
| WO | WO-2004/093181 | 10/2004 |
| WO | WO-2014/181785 | 11/2014 |
| WO | WO-2015/145292 | 10/2015 |
| WO | WO-2015/193769 | 12/2015 |

OTHER PUBLICATIONS

Written Opinion (Application No. PCT/IB2016/052879) dated Sep. 13, 2016.

\* cited by examiner

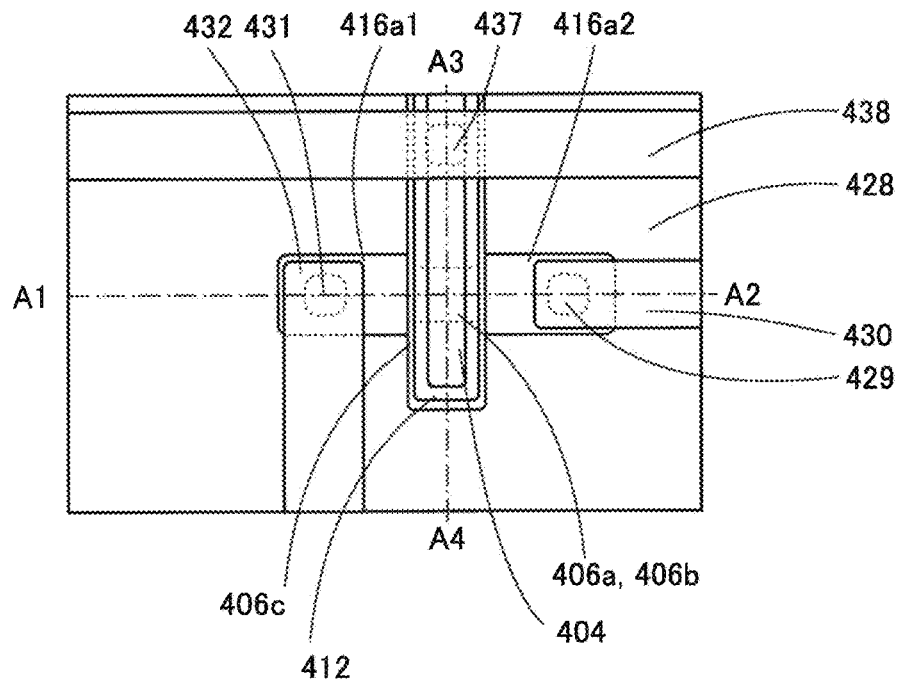
FIG. 1A
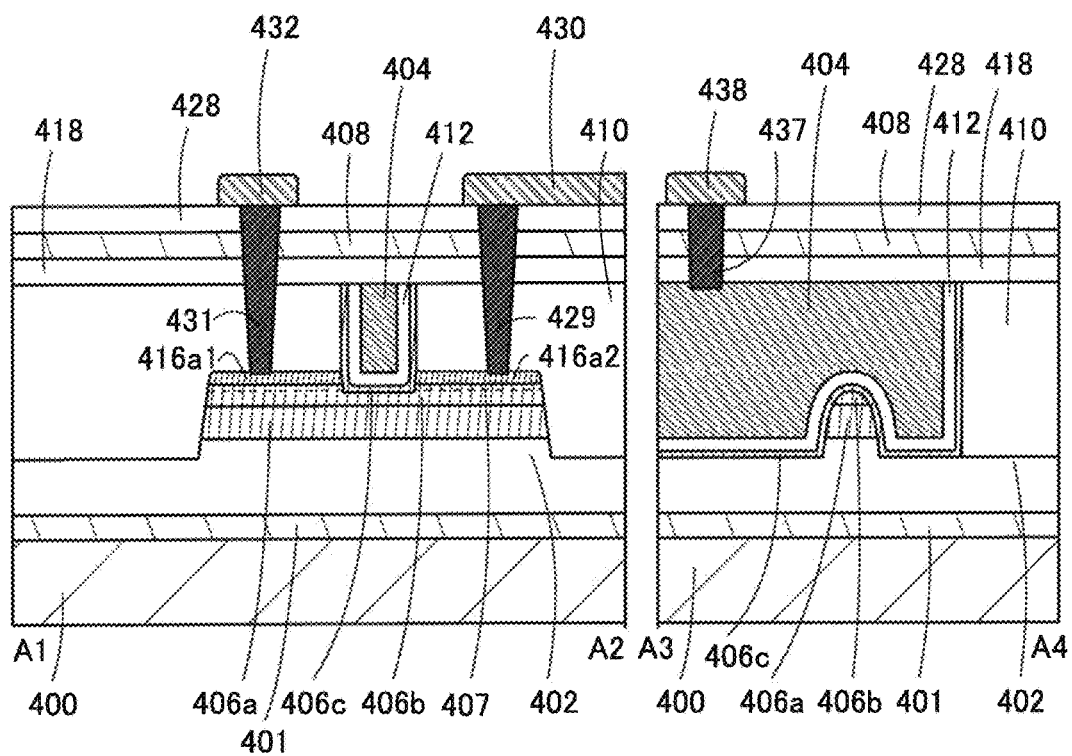
FIG. 1B
FIG. 1C

FIG. 2A
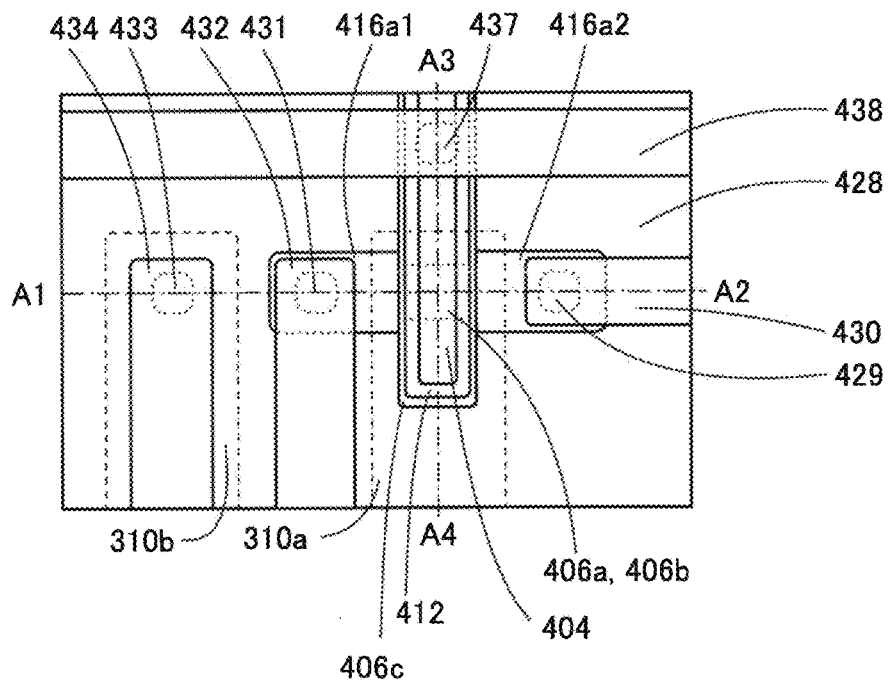
FIG. 2B
FIG. 2C
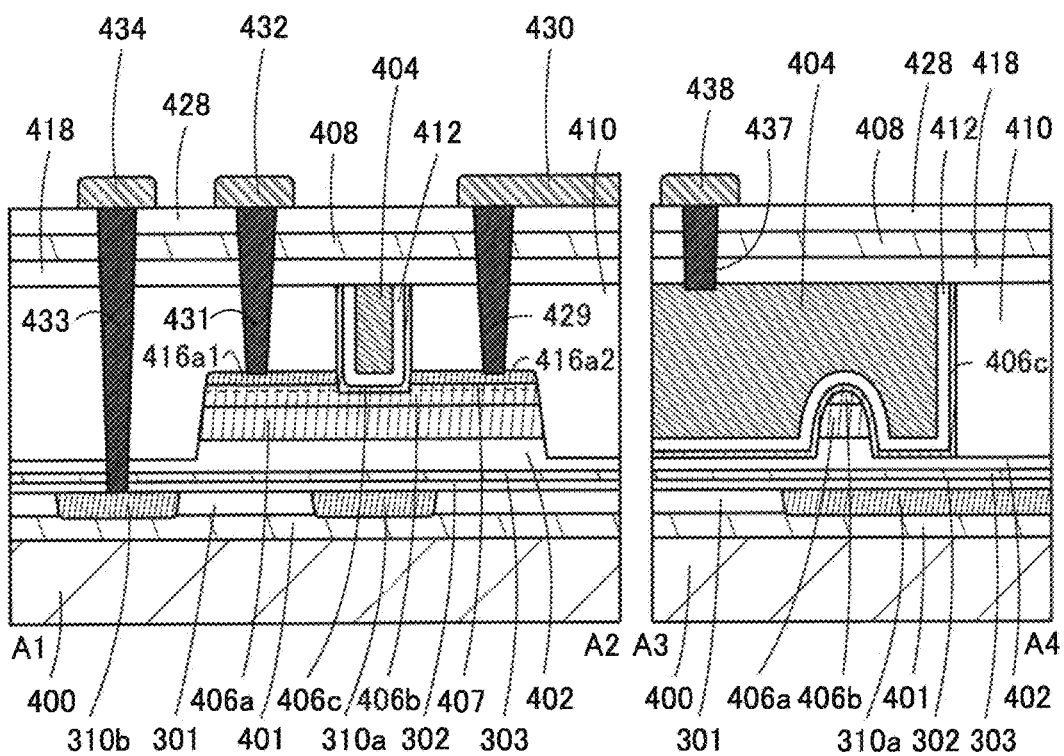

FIG. 10A
FIG. 10B
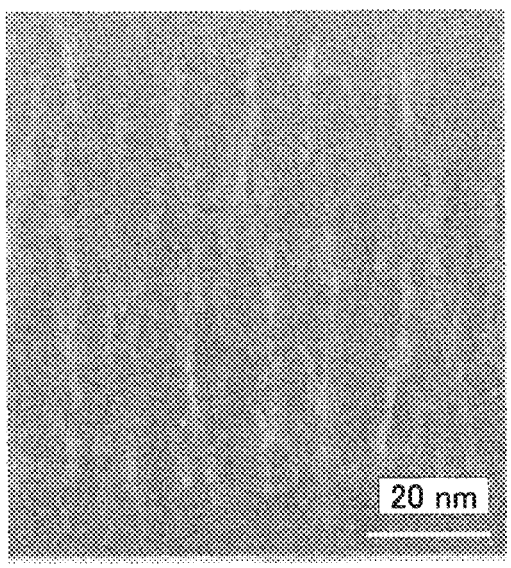
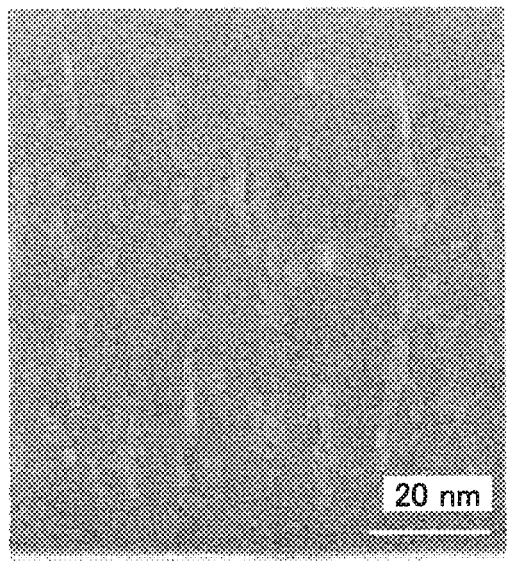

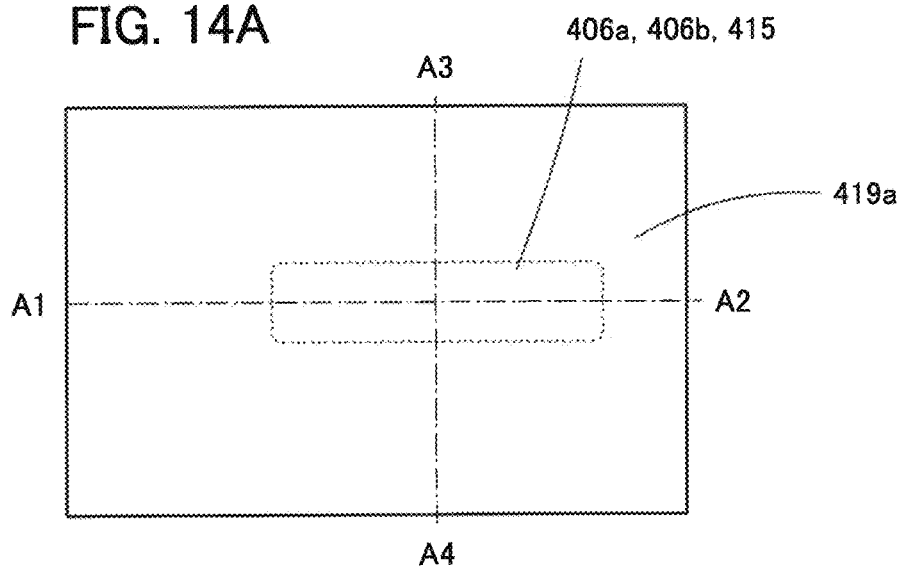
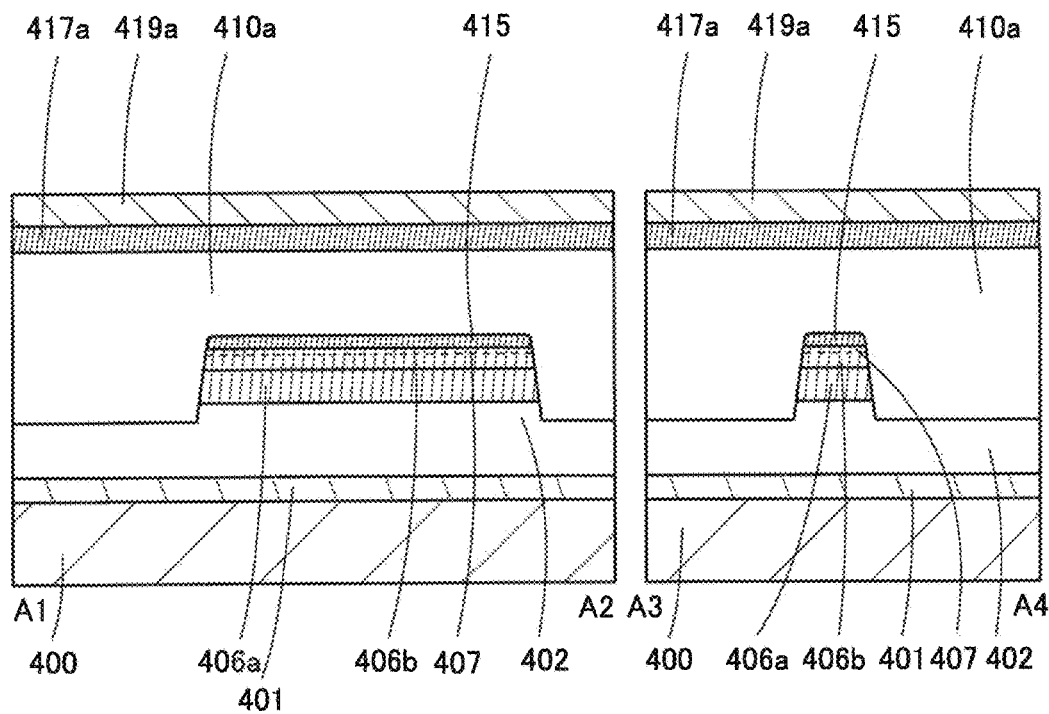

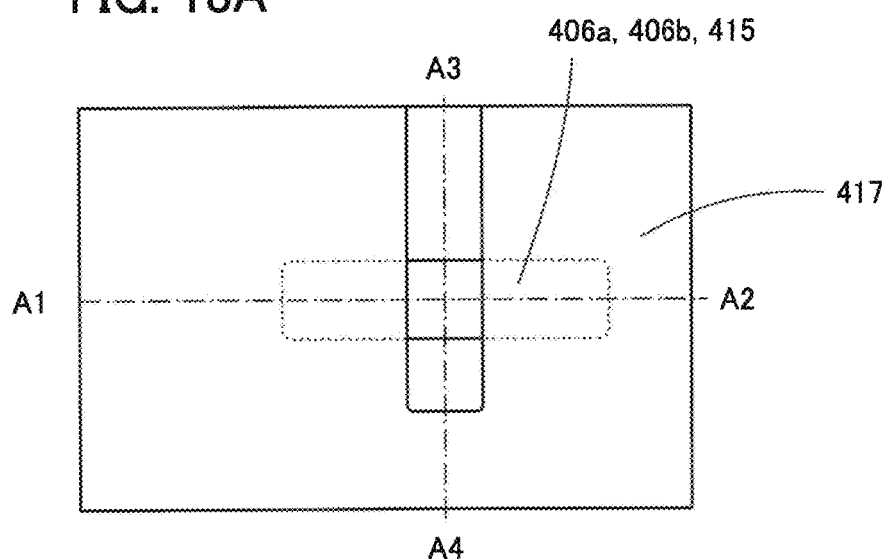
FIG. 18A
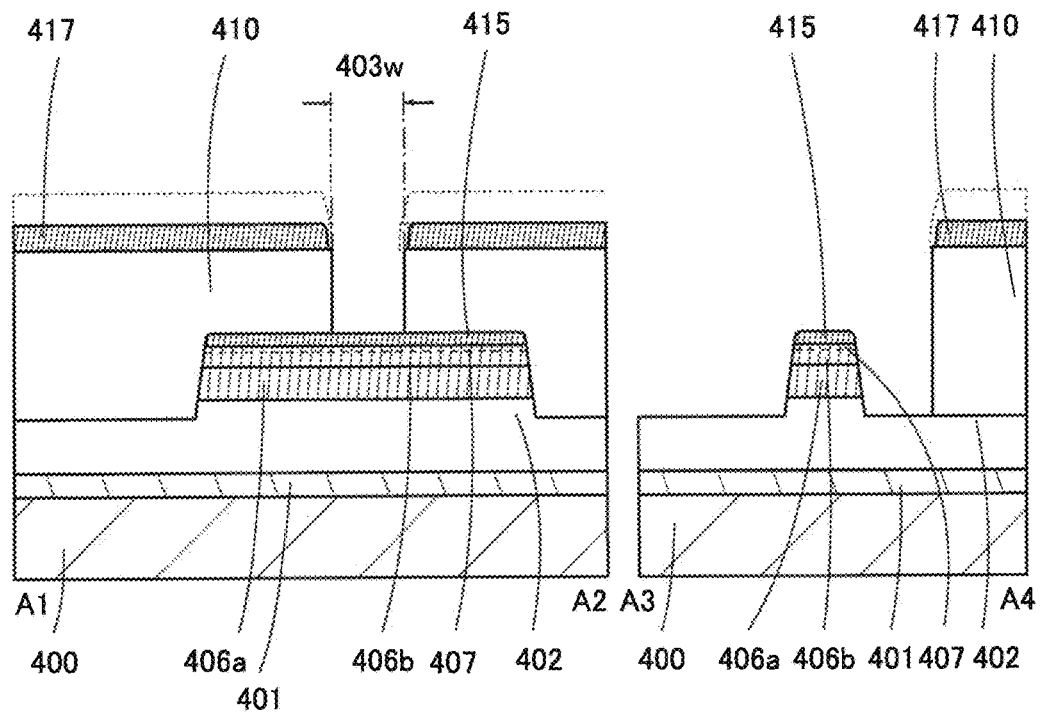
FIG. 18B
FIG. 18C

FIG. 19A
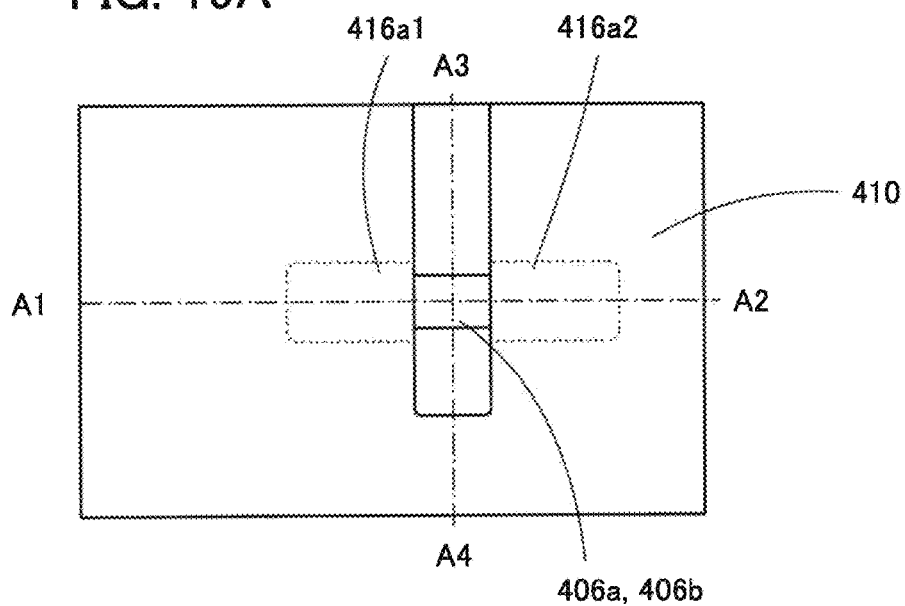
FIG. 19B
FIG. 19C
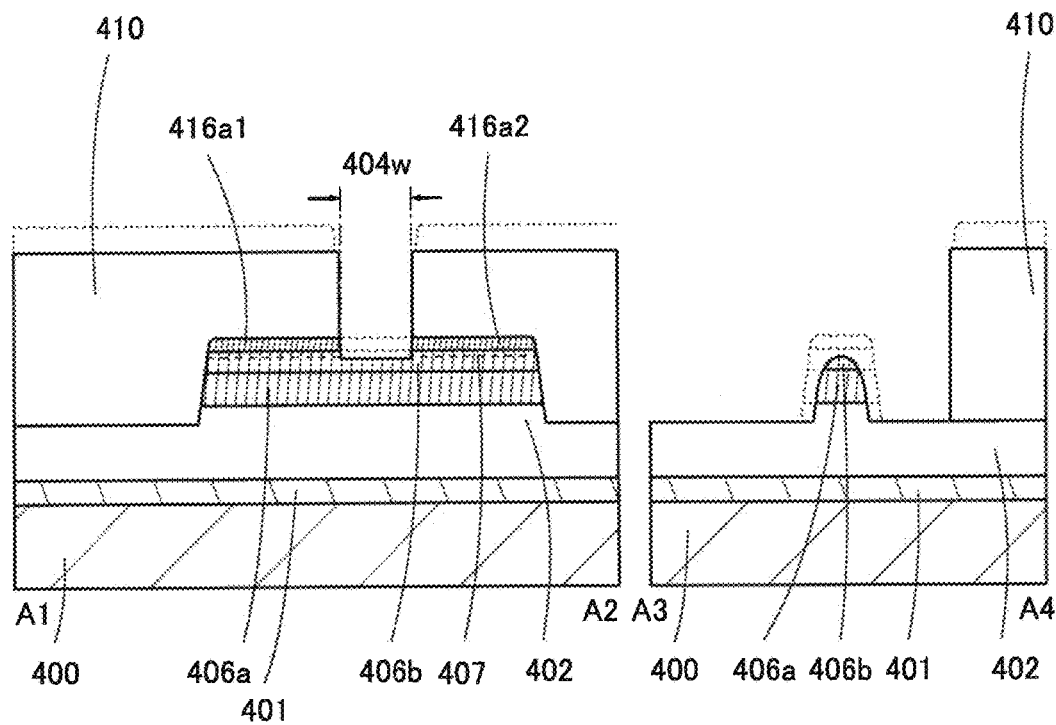

FIG. 20A
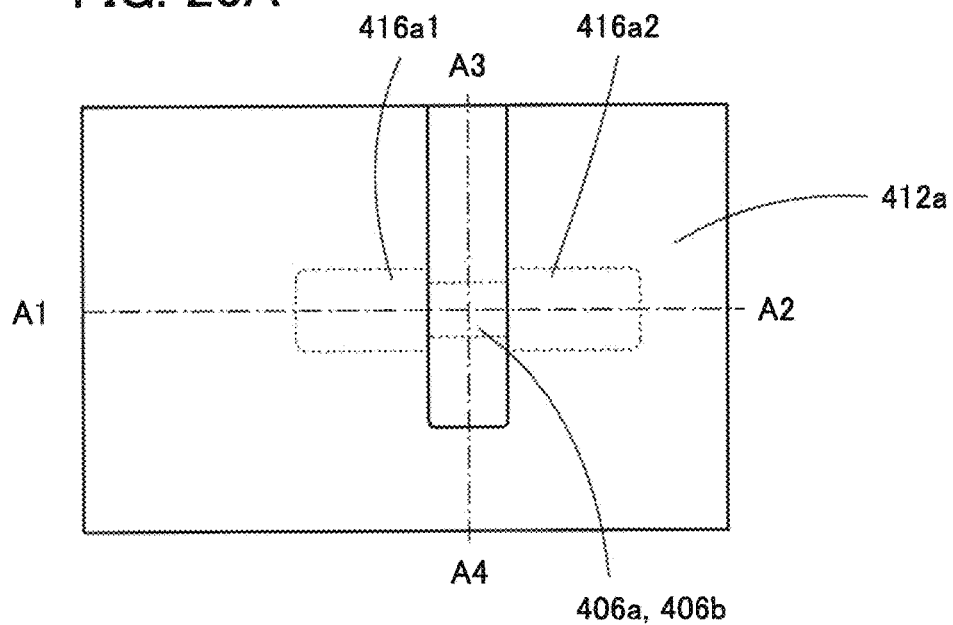
FIG. 20B
FIG. 20C
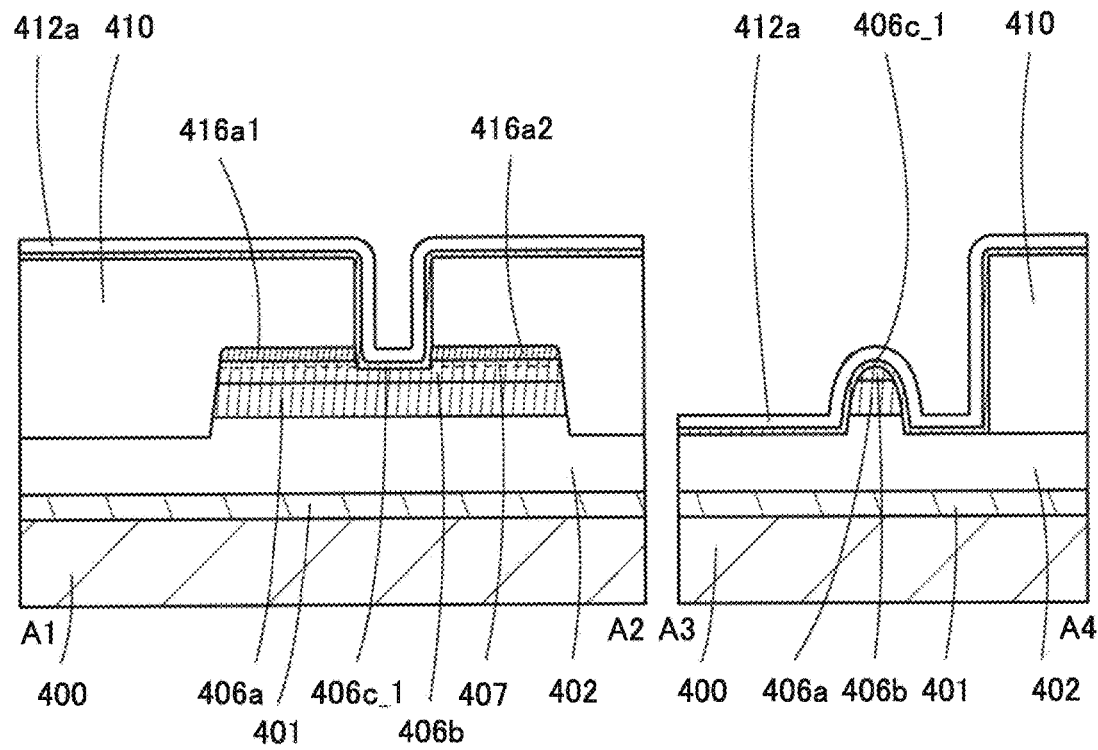

FIG. 21A
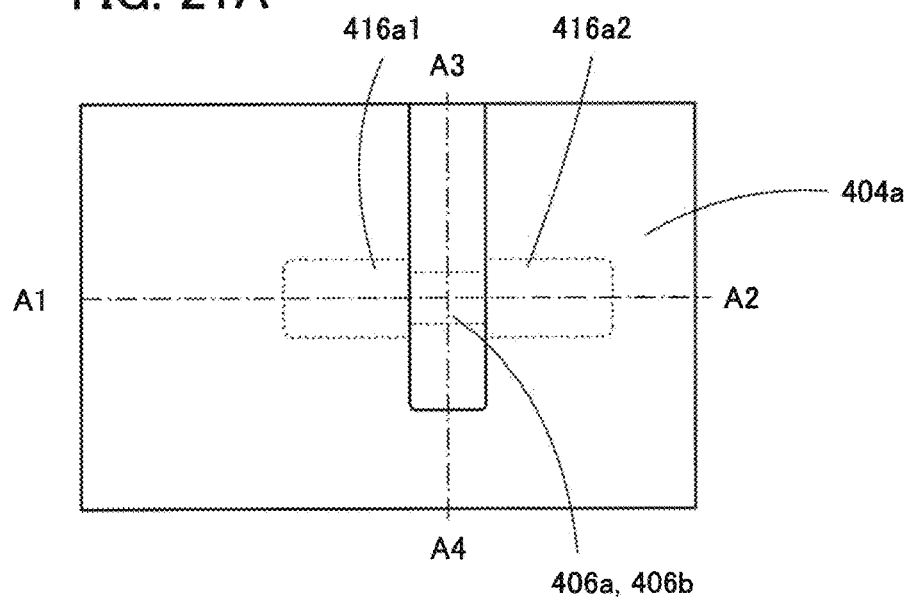
FIG. 21B
FIG. 21C
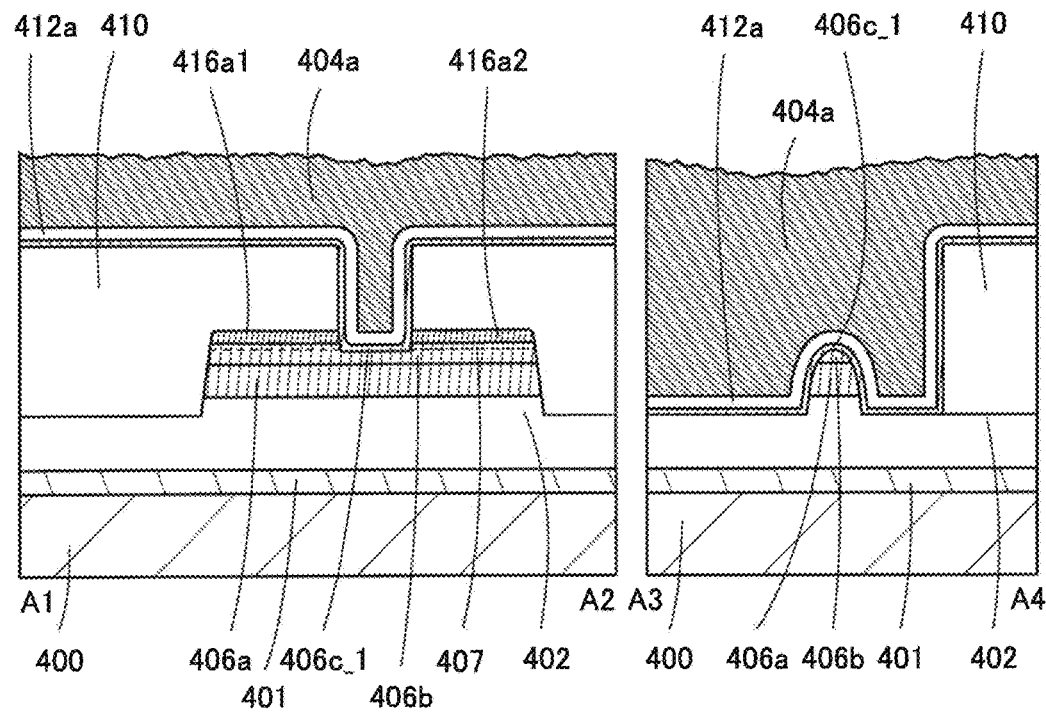

FIG. 22A
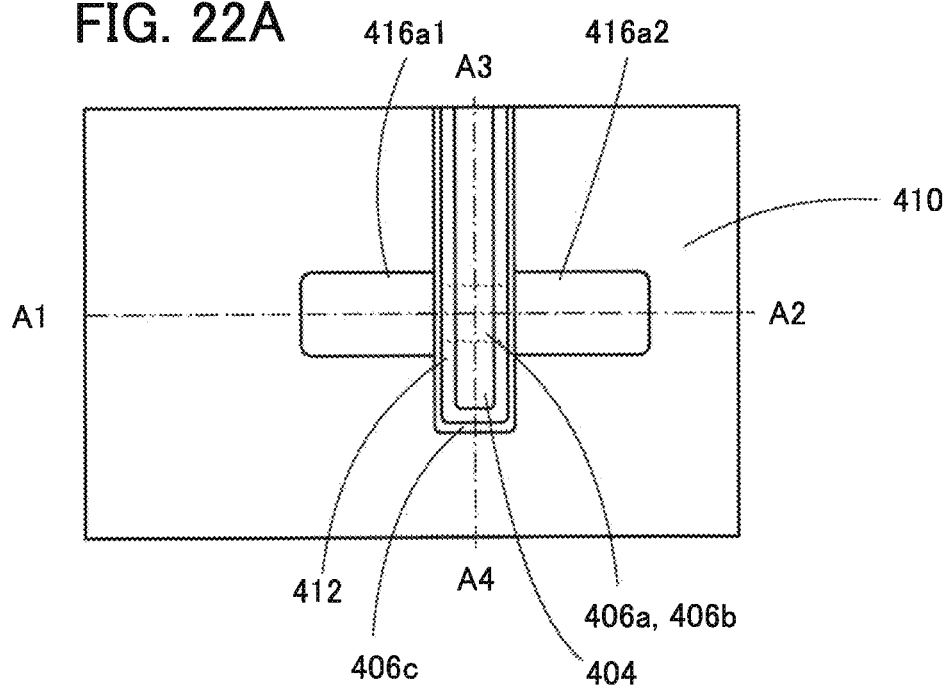
FIG. 22B
FIG. 22C
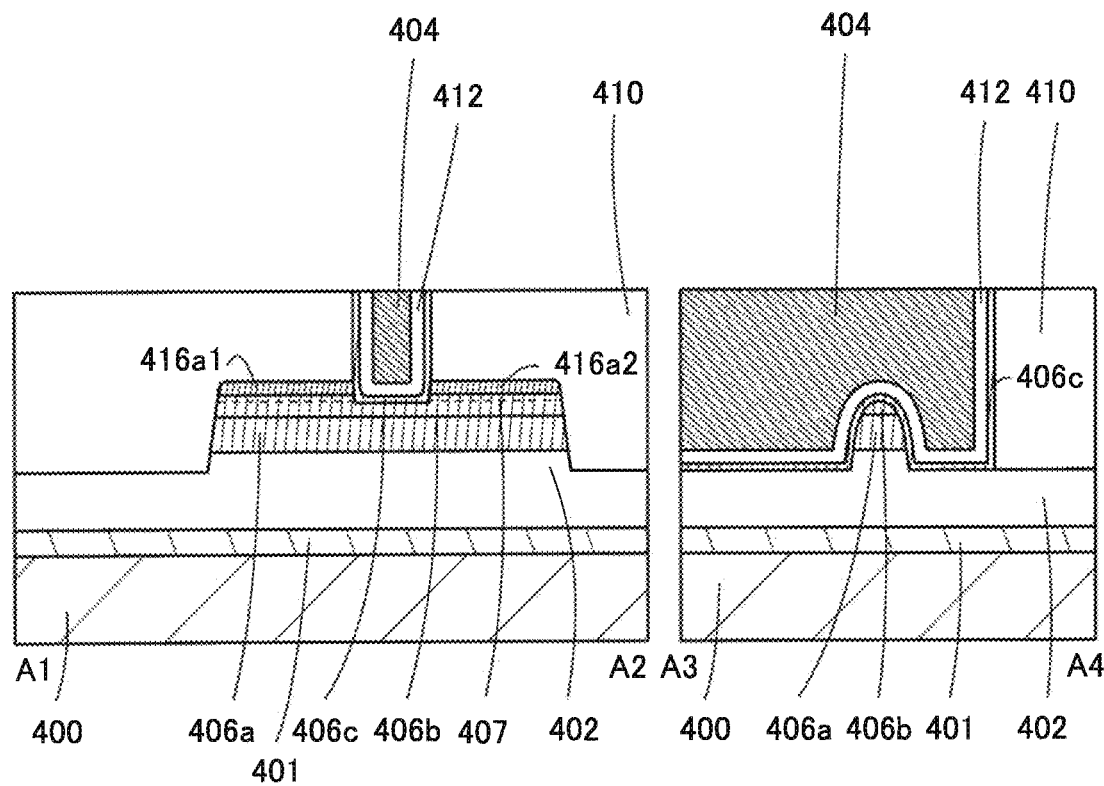

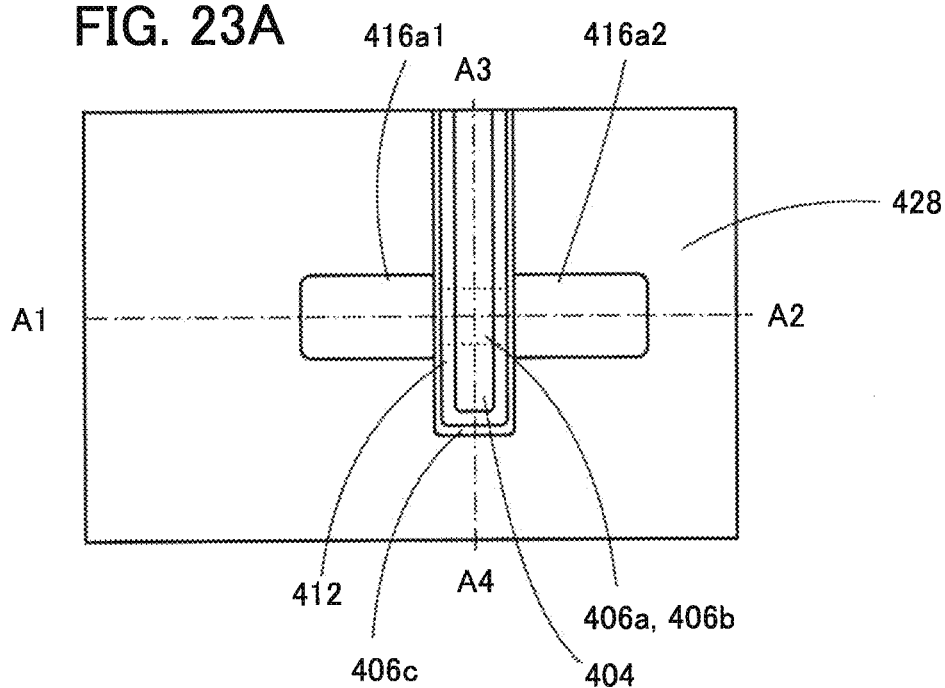
FIG. 23A
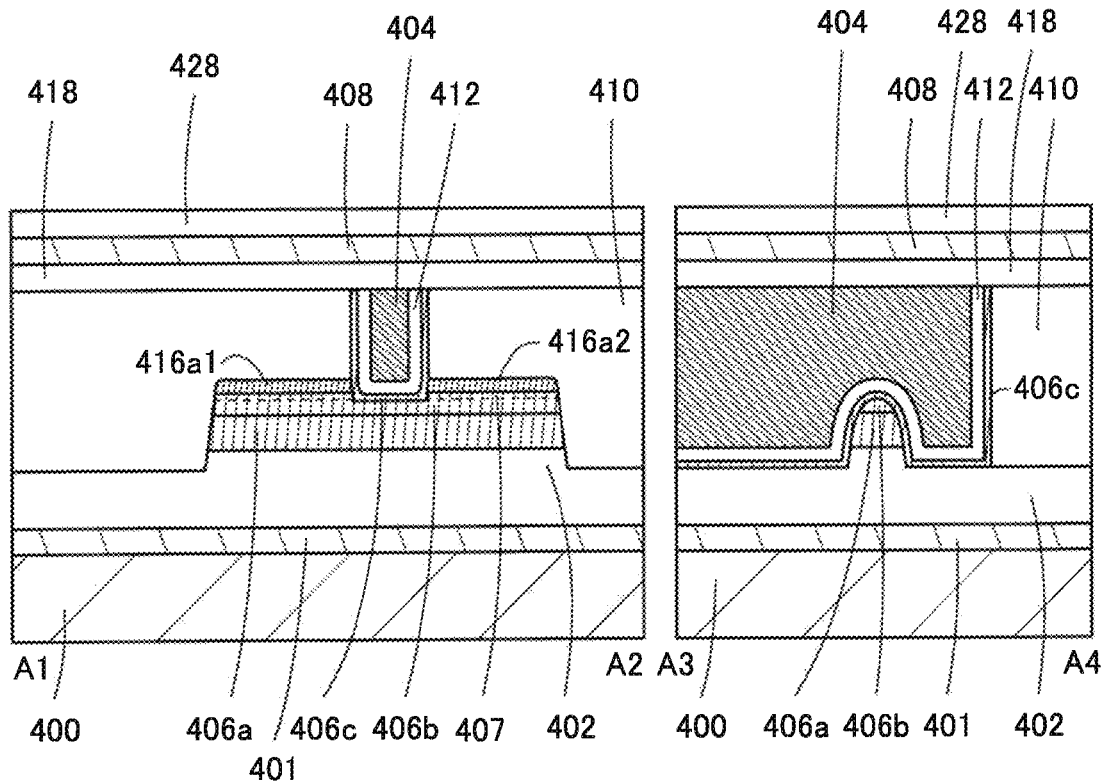
FIG. 23B
FIG. 23C

FIG. 24A
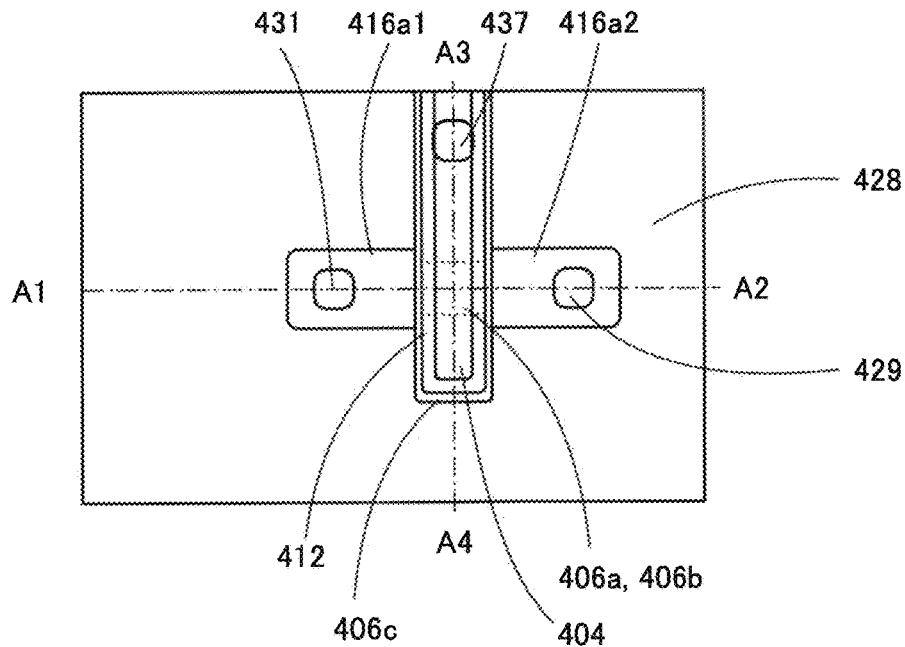
FIG. 24B
FIG. 24C
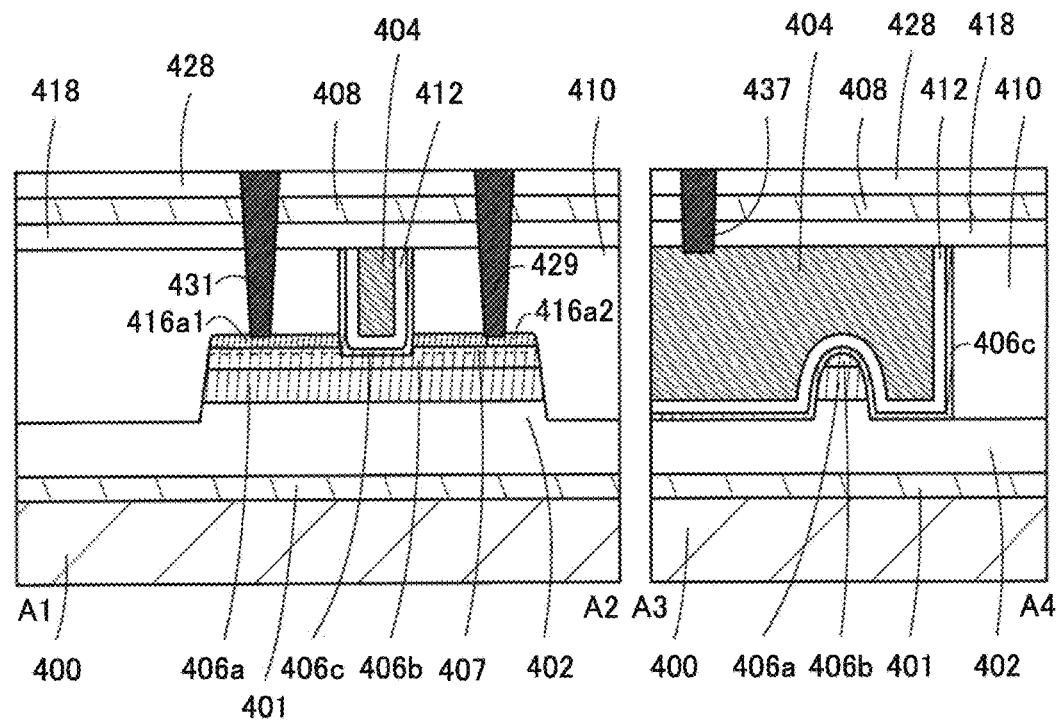

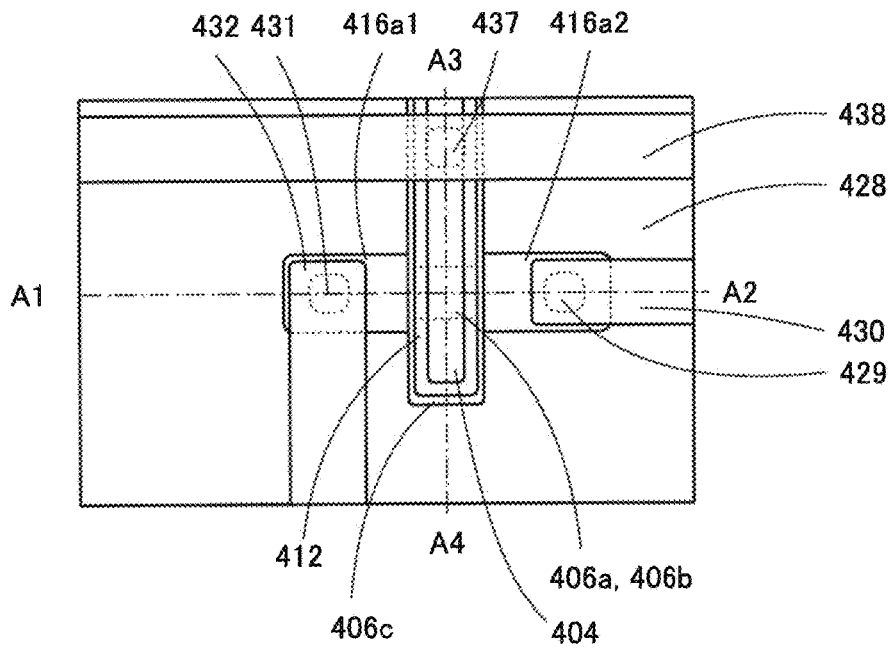
FIG. 26A
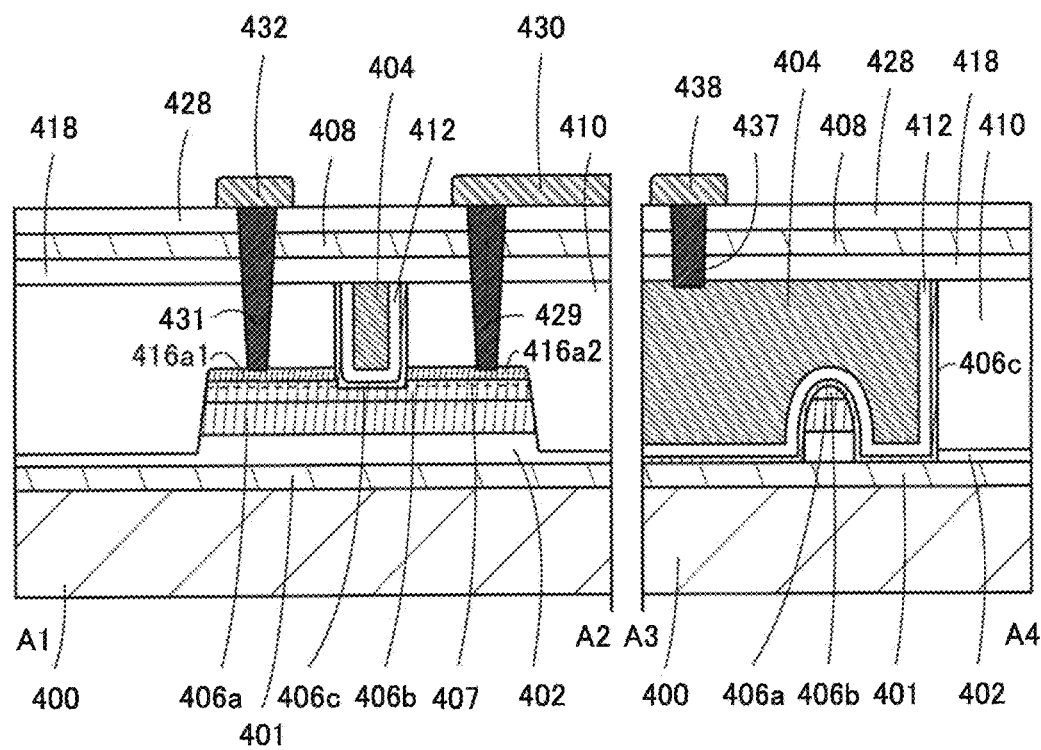
FIG. 26B
FIG. 26C

FIG. 46A
FIG. 46B
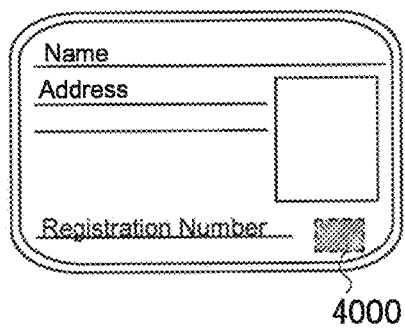
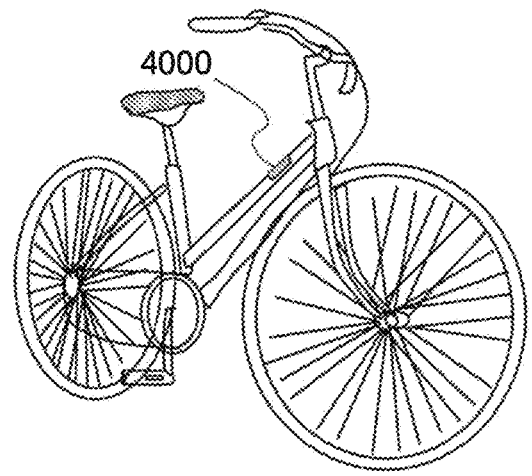
4000
4000
FIG. 46C
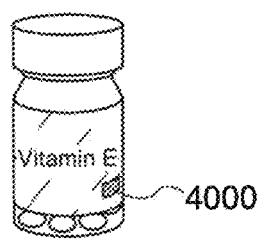
4000
FIG. 46D
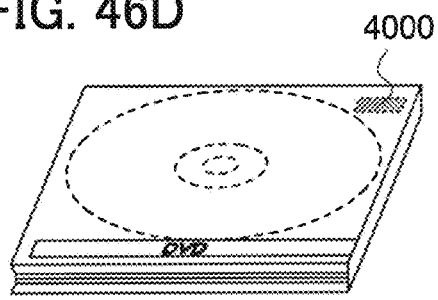
4000
FIG. 46E
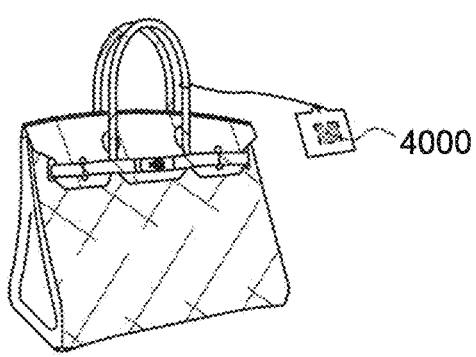
4000
FIG. 46F
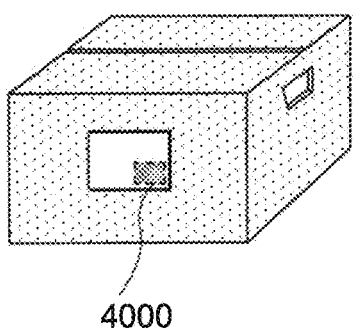
4000

METHOD FOR MANUFACTURING SEMICONDUCTOR DEVICE

CROSS REFERENCE TO RELATED APPLICATIONS

This application is a U.S. National Phase Application under 35 U.S.C. § 371 of International Application PCT/IB2016/052879, filed on May 18, 2016, which claims the benefit of foreign priority applications filed in Japan as Application No. 2015-108219 on May 28, 2015, and Application No. 2015-121182 on Jun. 16, 2015, all of which are incorporated by reference.

TECHNICAL FIELD

One embodiment of the present invention relates to, for example, a transistor, a semiconductor device, and manufacturing methods thereof. Furthermore, the present invention relates to, for example, a display device, a light-emitting device, a lighting device, a power storage device, a memory device, a processor, and an electronic device. Furthermore, the present invention relates to a method for manufacturing a display device, a liquid crystal display device, a light-emitting device, a memory device, and an electronic device. Furthermore, the present invention relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter (composition of matter).

Note that in this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

BACKGROUND ART

In recent years, a transistor including an oxide semiconductor has attracted attention. An oxide semiconductor can be formed by a sputtering method or the like, and thus can be used for a semiconductor of a transistor in a large display device. Furthermore, there is an advantage in a transistor including an oxide semiconductor that capital investment can be reduced because part of production equipment for a transistor including amorphous silicon can be retrofitted and utilized.

It is known that a transistor including an oxide semiconductor has an extremely low leakage current in an off state. For example, a low-power-consumption CPU utilizing a characteristic of low leakage current of the transistor including an oxide semiconductor is disclosed (see Patent Document 1).

Furthermore, a method for manufacturing a transistor including an oxide film semiconductor in which a gate electrode is embedded in an opening portion is disclosed (see Patent Document 2 and Patent Document 3.).

PRIOR ART DOCUMENT

[Patent Document]

[Patent document 1] Japanese Published Patent Application No. 2012-257187
[Patent document 2] Japanese Published Patent Application No. 2014-241407
[Patent document 3] Japanese Published Patent Application No. 2014-240833

SUMMARY OF THE INVENTION

Problems to be Solved by the Invention

An object is to provide a minute transistor. Another object is to provide a transistor with low parasitic capacitance. Another object is to provide a transistor having a high on-state current. Another object is to provide a transistor having high frequency characteristics. Another object is to provide a transistor with favorable electric characteristics. Another object is to provide a transistor having stable electric characteristics. Another object is to provide a transistor having low off-state current. Another object is to provide a novel transistor. Another object is to provide a semiconductor device including the transistor. Another object is to provide a semiconductor device that operates at high speed. Another object is to provide a novel semiconductor device. Another object is to provide a method for manufacturing a novel semiconductor device. Another object is to provide a module including any of the above semiconductor devices. Another object is to provide an electronic device including any of the above semiconductor devices or the module.

Note that the descriptions of these objects do not disturb the existence of other objects. In one embodiment of the present invention, there is no need to achieve all the objects. Other objects will be apparent from and can be derived from the description of the specification, the drawings, the claims, and the like.

Means for Solving the Problems (1)

One embodiment of the present invention is a method for manufacturing a semiconductor device, characterized by including the steps of forming a second insulator over a first insulator, forming a semiconductor over the second insulator, forming a first conductor over the semiconductor, etching part of the first conductor, the semiconductor, and the second insulator to form a multilayer film comprising the first conductor, the semiconductor, and the second insulator, forming a third insulator over the first insulator and the multilayer film, forming a second conductor over the third insulator, forming a fourth insulator over the second conductor, forming a resist mask over the fourth insulator by a lithography method, etching part of the fourth insulator using the resist mask as a mask to form a first insulating layer, etching part of the second conductor using the resist mask and the first insulating layer as a mask to form a first conductive layer, etching part of the fourth insulator and etching part of the second conductor to eliminate the resist mask, etching the third insulator using the first insulating layer and the first conductive layer as a mask to form an opening portion in the third insulator, etching the third insulator to eliminate the first insulating layer, etching the first conductor until the semiconductor is exposed using the first conductive layer as a mask to divide the first conductor into a second conductive layer and a third conductive layer, etching the first conductor to eliminate the first conductive layer, forming a fifth insulator over the third insulator and the semiconductor, forming a sixth insulator over the fifth insulator, forming a third conductor over the sixth insulator, and performing chemical mechanical polishing on the third conductor, the sixth insulator, and the fifth insulator to expose the third insulator. The first conductor is characterized by including a main constituent element contained in the second conductor.

(2)

Alternatively, one embodiment of the present invention is the method for manufacturing the semiconductor device described in (1) in which the third insulator and the fourth insulator are insulators including silicon oxide.

Effect of the Invention

A minute transistor can be provided. Alternatively, a transistor with low parasitic capacitance can be provided. Alternatively, a transistor having a high on-state current can be provided. Alternatively, a transistor having high frequency characteristics can be provided. Alternatively, a transistor with favorable electric characteristics can be provided. Alternatively, a transistor with stable electric characteristics can be provided. Alternatively, a transistor with low off-state current can be provided. Alternatively, a novel transistor can be provided. Alternatively, a semiconductor device including the transistor can be provided. Alternatively, a semiconductor device which can operate at high speed can be provided. Alternatively, a novel semiconductor device can be provided. Alternatively, a method for manufacturing a novel semiconductor device can be provided. Alternatively, a module including any of the above semiconductor devices can be provided. Alternatively, an electronic device including any of the above semiconductor devices or the module can be provided.

Note that the description of these effects does not disturb the existence of other effects. Note that one embodiment of the present invention does not necessarily achieve all the effects listed above. Note that other effects will be apparent from and can be derived from the description of the specification, the drawings, the claims, and the like.

BRIEF DESCRIPTION OF DRAWINGS

FIG. 1A is a top view and FIGS. 1B and 1C are cross-sectional views illustrating a transistor of one embodiment of the present invention.

FIG. 2A is a top view and FIGS. 2B and 2C are cross-sectional views illustrating a transistor of one embodiment of the present invention.

FIGS. 10A and 10B are cross-sectional TEM images of an a-like OS.

FIG. 14A is a top view and FIGS. 14B and 14C are cross-sectional views illustrating a method for manufacturing a transistor of one embodiment of the present invention.

FIG. 18A is a top view and FIGS. 18B and 18C are cross-sectional views illustrating a method for manufacturing a transistor of one embodiment of the present invention.

FIG. 19A is a top view and FIGS. 19B and 19C are cross-sectional views illustrating a method for manufacturing a transistor of one embodiment of the present invention.

FIG. 20A is a top view and FIGS. 20B and 20C are cross-sectional views illustrating a method for manufacturing a transistor of one embodiment of the present invention.

FIG. 21A is a top view and FIGS. 21B and 21C are cross-sectional views illustrating a method for manufacturing a transistor of one embodiment of the present invention.

FIG. 22A is a top view and FIGS. 22B and 22C are cross-sectional views illustrating a method for manufacturing a transistor of one embodiment of the present invention.

FIG. 23A is a top view and FIGS. 23B and 23C are cross-sectional views illustrating a method for manufacturing a transistor of one embodiment of the present invention.

FIG. 24A is a top view and FIGS. 24B and 24C are cross-sectional views illustrating a method for manufacturing a transistor of one embodiment of the present invention.

FIG. 26A is a top view and FIGS. 26B and 26C are cross-sectional views illustrating a method for manufacturing a transistor of one embodiment of the present invention.

FIGS. 46A-46F are application examples of an RF tag of the present invention.

MODE FOR CARRYING OUT THE INVENTION

Figure 3A:
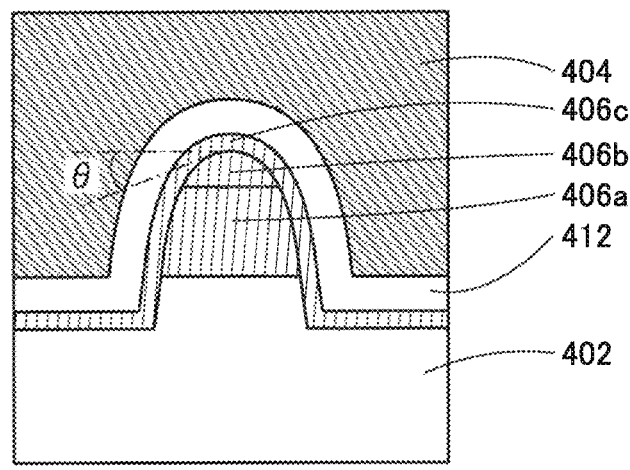
FIGS. 3A-3C are cross-sectional views each illustrating part of a transistor of one embodiment of the present invention.

Hereinafter, embodiment of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to the following description of the embodiments. Note that in describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for clarity.

Note that in this specification, for example, when the shape of an object is described with the use of a term such as "diameter", "grain size", "dimension", "size", or "width", the term can be regarded as the length of one side of a minimal cube where the object fits, or an equivalent circle diameter of a cross section of the object. The term equivalent circle diameter of a cross section of the object refers to the diameter of a perfect circle having the same area as that of the cross section of the object.

Note that a voltage usually refers to a potential difference between a given potential and a reference potential (for example, a ground potential (GND) or a source potential). Thus, a voltage can be referred to as a potential and vice versa.

Note that the ordinal numbers such as first and second are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

Note that an impurity in a semiconductor refers to, for example, elements other than the main components of the semiconductor. For example, an element with a concentration of lower than 0.1 atomic % is an impurity. When an impurity is contained, DOS (Density of State) may be formed in a semiconductor, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (also included in water), lithium, sodium, silicon, boron, phosphorus, carbon, and nitrogen, for example. In the case of an oxide semiconductor, oxygen vacancy may be formed by entry of impurities such as hydrogen. Furthermore, in the case where the semiconductor is a silicon film, examples of an impurity which changes characteristics of the semiconductor include oxygen, Group 1 elements except hydrogen, Group 2 elements, Group 13 elements, and Group 15 elements.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. Note that in one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. Note that in one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

Note that in a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as "a surrounded channel width (SCW: Surrounded Channel Width)" in some cases. Furthermore, in this specification, in the case where the term channel width is simply used, it may denote a surrounded channel width or an apparent channel width. Alternatively, in this specification, in the case where the term channel width is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

Note that in this specification, the description "A has a shape such that an end portion extends beyond an end portion of B" may indicate, for example, the case where at least one of end portions of A is positioned on an outer side of at least one of end portions of B in a top view or a cross-sectional view. Thus, the description "A has a shape such that an end portion extends beyond an end portion of B" can be read as the description "one end portion of A is positioned on an outer side of one end portion of B in a top view," for example.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

<Transistor Structure 1>

The structures of transistors included in semiconductor devices of embodiments of the present invention will be described below.

FIGS. 1(A), (B), and (C) are a top view and cross-sectional views of the semiconductor device of one embodiment of the present invention. FIG. 1(A) is the top view. FIG. 1(B) is a cross-sectional view taken along dashed-dotted line A1-A2 illustrated in FIG. 1(A). FIG. 1(C) is a cross-sectional view taken along dashed-dotted line A3-A4 illustrated in FIG. 1(A). Note that for simplification of the drawing, some components in the top view in FIG. 1(A) are not illustrated.

In FIGS. 1(B) and 1(C), a transistor includes an insulator 401 over a substrate 400; an insulator 402 over the insulator 401; an insulator 406a over the insulator 402; a semiconductor 406b over the insulator 406a; conductors 416a1 and 416a2 each including a region in contact with a top surface of the semiconductor 406b; an insulator 410 in contact with top surfaces of the conductors 416a1 and 416a2; an insulator 406c in contact with the top surface of the semiconductor 406b; an insulator 412 over the insulator 406c; a conductor 404 over the semiconductor 406b with the insulator 412 and the insulator 406c positioned therebetween; an insulator 418 over the insulator 410, the conductor 404, the insulator 412, and the insulator 406c; an insulator 408 over the insulator 418; an insulator 428 over the insulator 408; an opening portion reaching the conductor 404 through the insulator 428, the insulator 408 and the insulator 418; an opening portion reaching the conductor 416a1 through the insulator 428, the insulator 408, the insulator 418, and the insulator 410; an opening portion reaching the conductor 416a2 through the insulator 428, the insulator 408, the insulator 418, and the insulator 410; a conductor 437, a conductor 431, or a conductor 429 that are embedded in the corresponding opening portions; a conductor 438 over the insulator 428, which includes a region in contact with the conductor 437; a conductor 432 over the insulator 428, which includes a region in contact with the conductor 431; and a conductor 430 over the insulator 428, which includes a region in contact with the conductor 429.

Note that the semiconductor 406b includes a region 407 in which the top surface of the semiconductor 406b is in contact with the conductors 416a1 and 416a2.

In the transistor, the conductor 404 functions as a gate electrode. Furthermore, the conductor 404 can have a stacked structure including a conductor that has a function of inhibiting penetration of oxygen. For example, when the conductor that has a function of inhibiting penetration of oxygen is formed as a lower layer, an increase in the electric resistance value due to oxidation of the conductor 404 can be prevented. Note that the insulator 412 functions as a gate insulator.

Furthermore, the conductor 416a1 and the conductor 416a2 function as a source electrode and a drain electrode. Furthermore, the conductor 416a1 and the conductor 416a2 can each have a stacked structure including a conductor that has a function of inhibiting penetration of oxygen. For example, when the conductor that has a function of inhibiting penetration of oxygen is formed as an upper layer, an increase in the electric resistance value due to oxidation of the conductor 416a1 and the conductor 416a2 can be prevented. Note that the electric resistance values of the conductors can be measured by a two-terminal method or the like.

The electric resistance of the semiconductor 406b can be controlled by a potential applied to the conductor 404. That is, conduction or non-conduction between the conductor 416a1 and the conductor 416a2 can be controlled by the potential applied to the conductor 404.

As illustrated in FIGS. 1(B) and 1(C), the top surface of the semiconductor 406b is in contact with the conductor 416a1 and the conductor 416a2. In addition, the insulator 406a and the semiconductor 406b can be electrically surrounded by an electric field of the conductor 404 functioning as the gate electrode. A structure in which a semiconductor is electrically surrounded by an electric field of a gate electrode is referred to as a surrounded channel (s-channel) structure. Therefore, a channel is formed in the entire semiconductor 406b in some cases. In the s-channel structure, a large amount of current can flow between a source and a drain of the transistor, so that a current in an on state (on-state current) can be increased. In addition, since the insulator 406a and the semiconductor 406b are surrounded by the electric field of the conductor 404, a current in an off state (off-state current) can be decreased.

FIG. 3 are enlarged views of part of a cross section of the transistor. FIG. 3(A) is an enlarged view of a central portion of the transistor shown in FIG. 1(C). The cross-sectional shape of the semiconductor 406b has a roundish shape and a tangent line at the vertex portion of the semiconductor 406b is substantially parallel to a bottom surface of the substrate. The angle θ formed between the bottom surface of the substrate and the tangent line at the vertex portion changes toward the side end portion so that the angle θ gradually and continuously becomes larger. Thus, coverage of the insulator 406c and coverage of the insulator 412 which are provided over the semiconductor 406b are improved. In other words, the thickness of the insulator 406c and the thickness of the insulator 412 which cover from the top surface portion to the side end portion of the semiconductor 406b are each substantially uniform. Therefore, the application of the electric field from the conductor 404 having a function as a gate electrode to the semiconductor 406b is substantially uniform; thus, generation of a parasitic channel can be inhibited, and leakage current of the insulator 406c and the insulator 412 can be prevented.

Figure 3B:
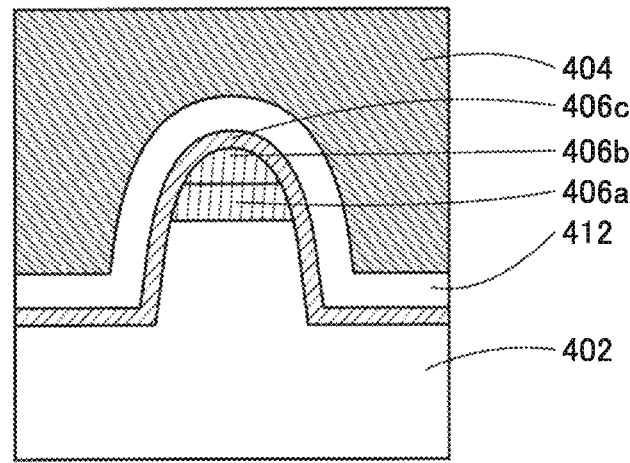

Furthermore, the advantage of an example of a transistor shown in FIG. 3(B) is described. The transistor shown in FIG. 3(B) is an example in which the insulator 406a has a smaller thickness than that of the insulator 406a shown in FIG. 3(A) and when the bottom surface of the substrate is used as the reference, the level of a region where a top surface of the insulator 402 and a bottom surface of the insulator 406a are in contact with each other is higher than the level of the region where the top surface of the insulator 402 and the bottom surface of the insulator 406a are in contact with each other shown in FIG. 3(A). The lowest region of the surface where the conductor 404 and the insulator 412 are in contact with each other is preferably located in a lower position than the bottom surface of the insulator 406a, in which case, the insulator 406a and the semiconductor 406b can be further electrically surrounded by the electric field of the conductor 404 having a function as the gate electrode as compared with the transistor shown in FIG. 3(A). In addition, advantages of the structure in the above FIG. 3(A) are included.

Figure 3C:
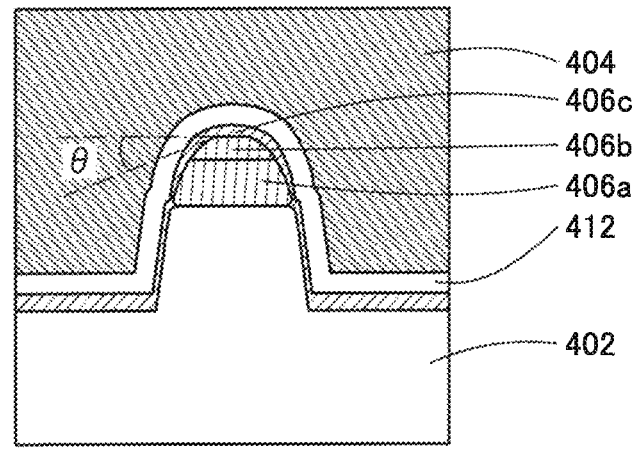

Furthermore, the advantage of an example of a transistor shown in FIG. 3(C) is described. The example of the transistor shown in FIG. 3(C) has a smaller thickness of the semiconductor 406b than the semiconductors 406b shown in FIGS. 3(A) and 3(B). Furthermore, the cross-sectional shape of the semiconductor 406b has a top surface portion of the semiconductor 406b which is substantially parallel to the bottom surface of the substrate and the angle θ formed between the bottom surface of the substrate and the tangent line at the top surface portion of the semiconductor 406b gradually increases toward the side end portion. In other words, the cross-sectional shape of the semiconductor 406b is substantially flat in the top surface portion and has an inclined smooth curve from the top surface portion toward the side end portion. With such a cross-sectional shape, coverages of the insulator 406c which covers the top surface of the semiconductor 406b and the insulator 412 are improved and the thickness of the insulator 406c which is in contact with the top surface portion of the semiconductor 406b, the thickness of the insulator 406c which is in contact with the side end portion of the semiconductor 406b, and the thickness of the insulator 412 are each uniform. Thus, the electric field from the conductor 404 having the function as the gate electrode is applied uniformly to the semiconductor 406b; thus, generation of a parasitic channel can be inhibited, and leakage current of the insulator 406c and the insulator 412 can be prevented. Furthermore, the semiconductor 406b is surrounded by the insulator 406a and the insulator 406c; thus, impurities can be prevented from entering the semiconductor 406b. As a result, the characteristics of the transistor are improved. In addition, advantages of the structure in the above FIG. 3(B) are included.

The transistor can also be referred to as a TGSA s-channel FET (Trench Gate Self Align s-channel FET) because the region functioning as a gate electrode is formed in a self-aligned (self align) manner to fill the opening portion formed in the insulator 410 and the like.

In FIG. 1(B), the length of the region of the bottom surface of the conductor 404 functioning as a gate electrode facing the top surface of the semiconductor 406b with the insulator 412 and the insulator 406c positioned therebetween is defined as a gate line width. The gate line width can be smaller than the width of the opening portion reaching the semiconductor 406b in the insulator 410. That is, the gate line width can be smaller than the minimum feature size. Specifically, the gate line width can be greater than or equal to 5 nm and less than or equal to 60 nm, preferably greater than or equal to 5 nm and less than or equal to 30 nm.

Note that when an electric field from the gate electrode is blocked by other conductors, switching characteristics of the transistor may be degraded. In the transistor, the positional relationship between the conductor 404 and the conductors 416a1 and 416a2 is changed by the thicknesses of the insulators 406c and 412. That is, the relationship between the thicknesses of the conductors 416a1 and 416a2 functioning as the source and drain electrode and the thickness of the insulator 412 functioning as the gate insulating film affects electrical characteristics of the transistor.

When the thickness of the insulator 412 in a region between the conductor 416a1 and the conductor 416a2 is smaller than that of the conductor 416a1 or the conductor 416a2 in FIG. 1(B), an electric field from the gate electrode is applied to the entire channel formation region, making the operation of the transistor favorable. The thickness of the insulator 412 in the region between the conductor 416a1 and the conductor 416a2 is less than or equal to 30 nm, preferably less than or equal to 10 nm.

Furthermore, the transistor can have a structure in which the conductor 416a1 or the conductor 416a2 has a small thickness. An end portion of the conductor 416a1 has a region facing the conductor 404 with the insulator 406c and the insulator 412 positioned therebetween. Furthermore, an end portion of the conductor 416a2 has a region facing the conductor 404 with the insulator 406c and the insulator 412 positioned therebetween; however, the area of these regions can be small. Thus, parasitic capacitance of these regions in the transistor is reduced.

Note that the transistor is surrounded by an insulator having a function of blocking oxygen and impurities such as hydrogen, so that the electronic characteristics of the transistor can be stable. For example, as the insulator 408, an insulator which has a function of blocking oxygen and impurities such as hydrogen may be used.

An insulator with a function of blocking oxygen and impurities such as hydrogen may be formed of a single layer or a stack of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

Furthermore, for example, the insulator 408 may be formed of aluminum oxide, magnesium oxide, silicon nitride oxide, silicon nitride, gallium oxide, germanium oxide, yttrium oxide, zirconium oxide, lanthanum oxide, neodymium oxide, hafnium oxide, or tantalum oxide. Note that the insulator 408 preferably contains aluminum oxide. For example, when the insulator 408 is formed by plasma including oxygen, oxygen can be added to the insulators 418 and 410 functioning as a base layer of the insulator 408. Furthermore, oxygen can also be added to the side surface of the insulator 412. The added oxygen becomes excess oxygen in the insulator 418, the insulator 410, or the insulator 412. When the insulator 408 contains aluminum oxide, entry of impurities such as hydrogen into the semiconductor 406b can be inhibited. For another example, when the insulator 408 contains aluminum oxide, outward diffusion of the excess oxygen added to the insulators 418, 410, and 412 can be reduced.

An insulator 402 may be formed of a single layer or a stack of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. For example, the insulator 402 preferably contains silicon oxide or silicon oxynitride.

Note that the insulator 410, the insulator 418, and the insulator 428 preferably include an insulator with low dielectric constant. For example, the insulator 410, the insulator 418, and the insulator 428 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and low dielectric constant. Examples of the resin include polyester, polyolefin, polyamide (nylon, aramid, or the like), polyimide, polycarbonate, and acrylic.

The insulator 412 may be formed of a single layer or a stack of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 412 preferably includes silicon oxide or silicon oxynitride.

Note that the insulator 412 preferably contains an insulator with a high dielectric constant. For example, the insulator 412 preferably includes gallium oxide, hafnium oxide, oxide including aluminum and hafnium, oxynitride including aluminum and hafnium, oxide including silicon and hafnium, oxynitride including silicon and hafnium, or the like. Furthermore, the insulator 412 preferably has a stacked-layer structure including silicon oxide or silicon oxynitride and an insulator with a high dielectric constant. Because silicon oxide and silicon oxynitride have thermal stability, combination of silicon oxide or silicon oxynitride with an insulator with a high dielectric constant allows the stacked-layer structure to be thermally stable and have a high dielectric constant. For example, when an aluminum oxide, a gallium oxide, or a hafnium oxide is on the insulator 406c side, entry of silicon included in the silicon oxide or the silicon oxynitride into the semiconductor 406b can be suppressed. Furthermore, when silicon oxide or silicon oxynitride is on the insulator 406c side, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

Each of the conductor 416a1 and the conductor 416a2 may be formed of a single layer or a stack of a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

The conductor 404 may be formed of a single layer or a stack of a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

Each of the conductor 429, the conductor 430, the conductor 431, the conductor 432, the conductor 437, and the conductor 438 may be formed of a single layer or a stack of a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

As the semiconductor 406b, an oxide semiconductor is preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

The insulator 406a and the insulator 406c are desirably oxides including one or more elements other than oxygen included in the semiconductor 406b. However, silicon (including strained silicon), germanium, silicon germanium, silicon carbide, gallium arsenide, aluminum gallium arsenide, indium phosphide, gallium nitride, an organic semiconductor, or the like can be used in some cases.

<Transistor Structure 2>

Here, a transistor having a structure different from that in FIG. 1 will be described with reference to FIG. 2. FIGS. 2(A), (B), (C) are a top view and cross-sectional views of the semiconductor device of one embodiment of the present invention. FIG. 2(A) is a top view thereof. FIG. 2(B) is a cross-sectional view taken along dashed-dotted line A1-A2 illustrated in FIG. 2(A). FIG. 2(C) is a cross-sectional view taken along dashed-dotted line A3-A4 illustrated in FIG. 2(A). Note that for simplification of the drawing, some components in the top view in FIG. 2(A) are not illustrated.

In FIGS. 2(B) and (C), the transistor includes: the insulator 401 over the substrate 400; an insulator 301, a conductor 310a, and a conductor 310b over the insulator 401; an insulator 302 over the insulator 301, the conductor 310a, and the conductor 310b; an electron trap layer 303 over the insulator 302; the insulator 402 over the electron trap layer 303; the insulator 406a over the insulator 402; the semiconductor 406b over the insulator 406a; the conductor 416a1 and the conductor 416a2 each having the region in contact with the top surface of the semiconductor 406b; the insulator 410 in contact with the top surface of the conductor 416a1 and top surface of the conductor 416a2; the insulator 406c in contact with the top surface of the semiconductor 406b; the insulator 412 over the insulator 406c; the conductor 404 placed over the semiconductor 406b with the insulator 412 and the insulator 406c positioned therebetween; the insulator 418 over the insulator 410, the conductor 404, the insulator 412, and the insulator 406c; the insulator 408 over the insulator 418; the insulator 428 over the insulator 408; the opening portion reaching the conductor 404 through the insulator 428, the insulator 408, and the insulator 418; the opening portion reaching the conductor 416a1 through the insulator 428, the insulator 408, the insulator 418, and the insulator 410; the opening portion reaching the conductor 416a2 through the insulator 428, the insulator 408, the insulator 418, and the insulator 410; the opening portion reaching the conductor 310b through the insulator 428, the insulator 408, the insulator 418, the insulator 410, the insulator 402, the electron trap layer 303, and the insulator 302; the conductor 437, the conductor 431, the conductor 429, and the conductor 433 that are embedded in the respective opening portions; the conductor 438 that is over the insulator 428 and includes a region in contact with the conductor 437; the conductor 432 that is over the insulator 428 and includes a region in contact with the conductor 431; the conductor 430 that is over the insulator 428 and includes a region in contact with the conductor 429; and the conductor 434 that is over the insulator 428 and includes a region in contact with the conductor 433. Note that the semiconductor 406b includes the region 407 in which the top surface of the semiconductor 406b is in contact with the conductor 416a1 and the conductor 416a2.

The conductor 310a functions as a second gate electrode. The conductor 310a can be the multilayer film including a conductive film that hardly allows oxygen to pass therethrough. The use of the multilayer film including a conductive film that hardly allows oxygen to pass therethrough can prevent a decrease in conductivity due to oxidation of the conductor 310a. The insulator 302, the electron trap layer 303, and the insulator 402 function as a second gate insulating film. The threshold voltage of the transistor can be controlled by a potential applied to the conductor 310a. Furthermore, by the potential applied to the conductor 310a, electrons are injected to the electron trap layer 303 and thus the threshold voltage of the transistor can be controlled. Furthermore, the first gate electrode and the second gate electrode are electrically connected to each other, whereby a high on-state current can be obtained. Note that the functions of the first gate electrode and the second gate electrode may be replaced with each other.

Figure 6:
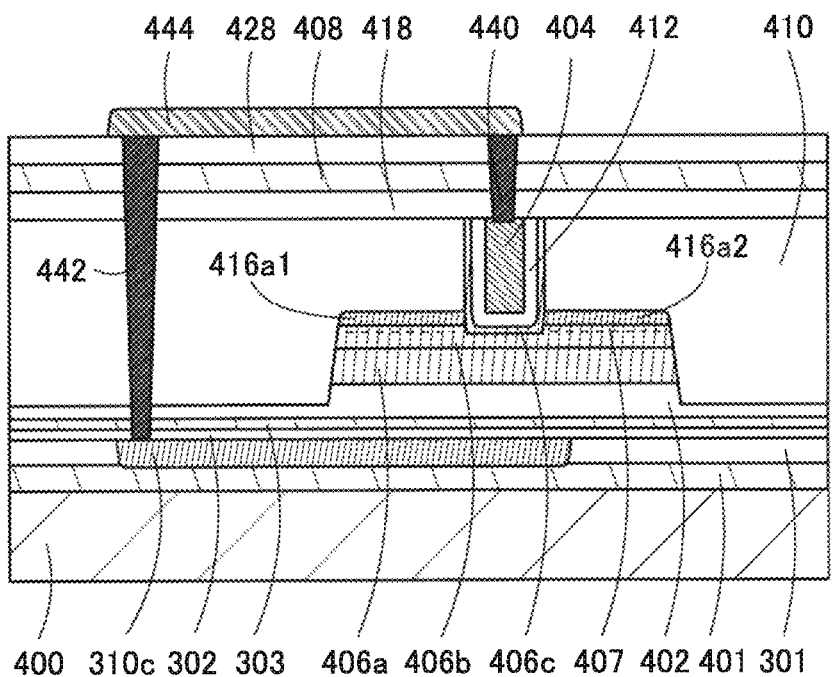
FIG. 6 is a cross-sectional view illustrating a transistor of one embodiment of the present invention.

FIG. 6 illustrates an example in which the first gate electrode and the second gate electrode are electrically connected. In an opening portion reaching the conductor 404 through the insulator 428, the insulator 408, and the insulator 418, a conductor 440 is embedded, and a top surface of the conductor 440 is electrically connected to a conductor 444 formed over the insulator 428. In an opening portion reaching a conductor 310c through the insulator 428, the insulator 408, the insulator 418, the insulator 410, the insulator 402, the electron trap layer 303, and the insulator 302, a conductor 442 is embedded, and a top surface of the conductor 442 and the conductor 444 are electrically connected. That is, the conductor 404 functioning as the first gate electrode is electrically connected to the conductor 310c functioning as the second gate electrode through the conductor 440, the conductor 444, and the conductor 442.

The insulators 301 and 302 may be formed of a single layer or a stack of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 402 preferably contains silicon oxide or silicon oxynitride.

The electron trap layer 303 may function as, for example, an electron-injection layer. The insulator 303 may be formed of a single layer or a stack of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the electron trap layer 303 preferably contains silicon nitride, hafnium oxide, or aluminum oxide.

Each of the conductor 310a, the conductor 310b, the conductor 310c, the conductor 433, the conductor 434, the conductor 440, the conductor 442, and the conductor 444 may be formed of a single layer or a stack of a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

<Transistor Structure 3>

Figure 4A:
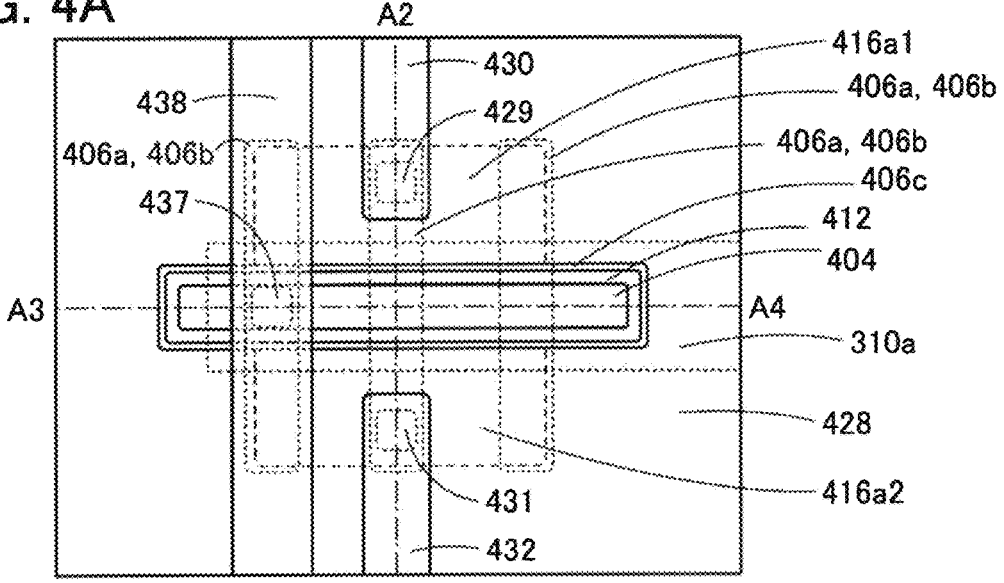
FIG. 4A is a top view and FIGS. 4B and 4C are cross-sectional views illustrating a transistor of one embodiment of the present invention.
Figure 4B:
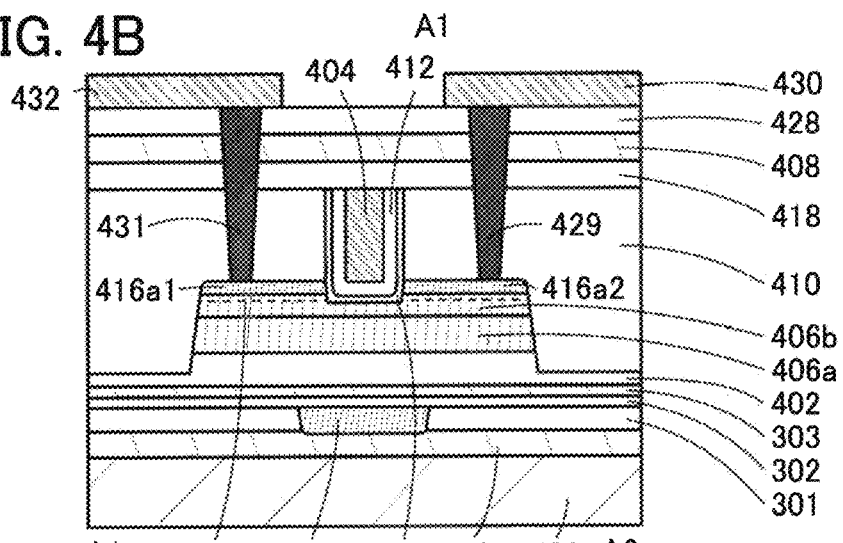
Figure 4C:
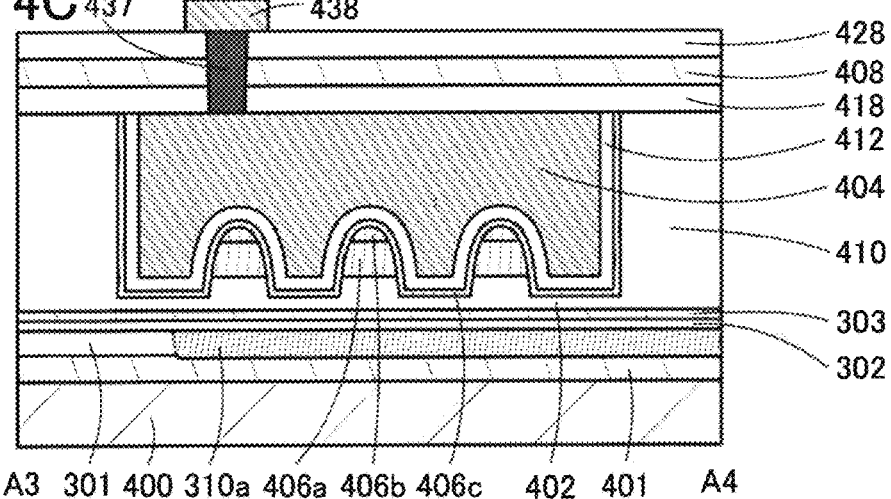

Here, a transistor having a structure different from that in FIG. 2 will be described with reference to FIG. 4. FIGS. 4(A), (B), and (C) are a top view and cross-sectional views of the semiconductor device of one embodiment of the present invention. FIG. 4(A) is a top view thereof. FIG. 4(B) is a cross-sectional view taken along dashed-dotted line A1-A2 illustrated in FIG. 4(A). FIG. 4(C) is a cross-sectional view taken along dashed-dotted line A3-A4 illustrated in FIG. 4(A). Note that for simplification of the drawing, some components in the top view in FIG. 4(A) are not illustrated.

This transistor is different from the transistor in FIGS. 2(A), (B), and (C) in that the transistor has a plurality of channel formation regions for one gate electrode. Although the transistor in FIGS. 4(A), (B), and (C) includes three channel formation regions, the number of the channel formation regions is not limited to this. For other components, refer to the components of the transistor illustrated in FIGS. 2(A), (B), and (C).

<Transistor Structure 4>

Figure 5A:
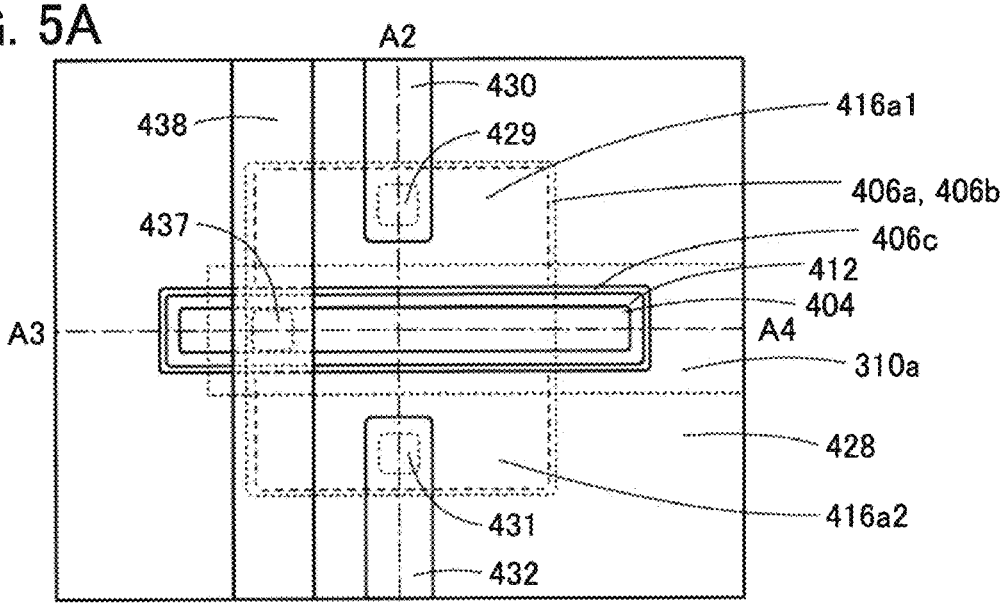
FIG. 5A is a top view and FIGS. 5B and 5C are cross-sectional views illustrating a transistor of one embodiment of the present invention.
Figure 5B:
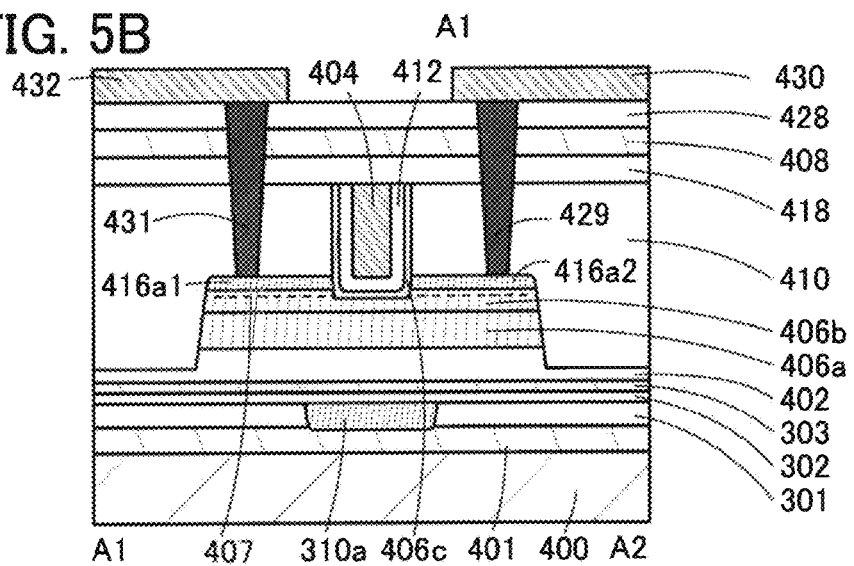
Figure 5C:
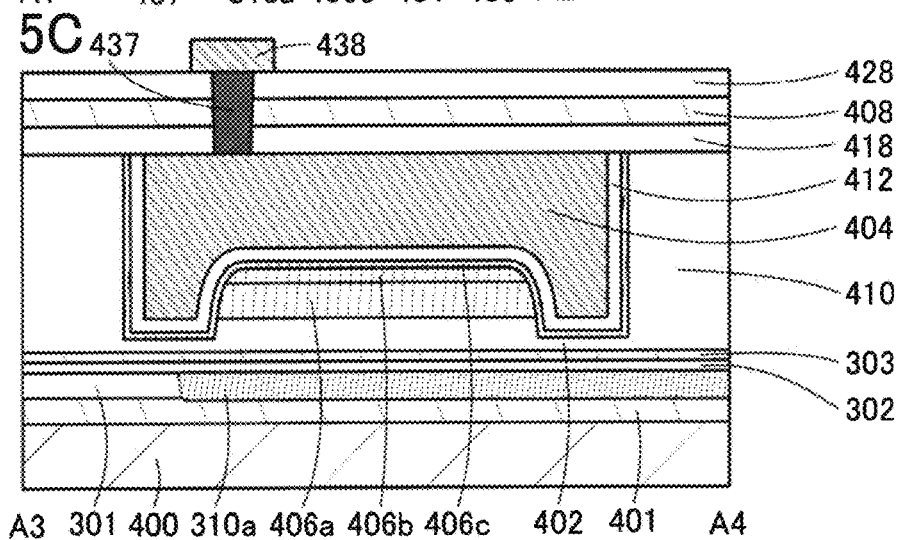

A transistor having a structure different from that in FIG. 2 will be described with reference to FIG. 5. FIGS. 5(A), (B), and (C) are a top view and cross-sectional views of the semiconductor device of one embodiment of the present invention. FIG. 5(A) is the top view. FIG. 5(B) is a cross-sectional view taken along dashed-dotted line A1-A2 illustrated in FIG. 5(A). FIG. 5(C) is a cross-sectional view taken along dashed-dotted line A3-A4 illustrated in FIG. 5(A). Note that for simplification of the drawing, some components in the top view in FIG. 5(A) are not illustrated.

This transistor has a larger channel width than the gate line width in FIG. 2(A). For other components, refer to the components of the transistor illustrated in FIGS. 2(A), (B), and (C).

At least part of this embodiment can be implemented in combination with any of the embodiments described in this specification as appropriate.

Note that in this embodiment, one embodiment of the present invention has been described. Furthermore, other embodiments of the present invention are described in other embodiments. Note that one embodiment of the present invention is not limited to the above examples. That is, since various embodiments of the present invention are disclosed in this embodiment and other embodiments, one embodiment of the present invention is not limited to a specific embodiment. For example, an example in which a channel formation region of a transistor includes an oxide semiconductor, an example in which a transistor includes an oxide semiconductor, and the like are described as one embodiment of the present invention; however, one embodiment of the present invention is not limited to these examples. Depending on circumstances or conditions, various transistors of embodiments of the present invention may include various semiconductors. Depending on circumstances or conditions, transistors of embodiments of the present invention may include, for example, at least one of silicon, germanium, silicon germanium, silicon carbide, gallium arsenide, aluminum gallium arsenide, indium phosphide, gallium nitride, and an organic semiconductor. Alternatively, depending on circumstances or conditions, various transistors of embodiments of the present invention do not necessarily include an oxide semiconductor, for example.

Embodiment 2

<Structure of Oxide Semiconductor>

The structure of an oxide semiconductor is described below.

An oxide semiconductor is classified into a single crystal oxide semiconductor and a non-single-crystal oxide semiconductor. Examples of the non-single-crystal oxide semiconductor include a CAAC-OS (c-axis-aligned crystalline oxide semiconductor), a polycrystalline oxide semiconductor, a nc-OS (nanocrystalline oxide semiconductor), an amorphous-like oxide semiconductor (a-like OS: amorphous-like oxide semiconductor), and an amorphous oxide semiconductor.

From another perspective, an oxide semiconductor is classified into an amorphous oxide semiconductor and a crystalline oxide semiconductor. Examples of the crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

In other words, a stable oxide semiconductor cannot be regarded as a completely amorphous (completely amorphous) oxide semiconductor. Moreover, an oxide semiconductor that is not isotropic (for example, an oxide semiconductor that has a periodic structure in a microscopic region) cannot be regarded as a completely amorphous oxide semiconductor. In contrast, an a-like OS, which is not isotropic, has an unstable structure that contains a void (also referred to as a void.). Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets.).

Figure 7A:
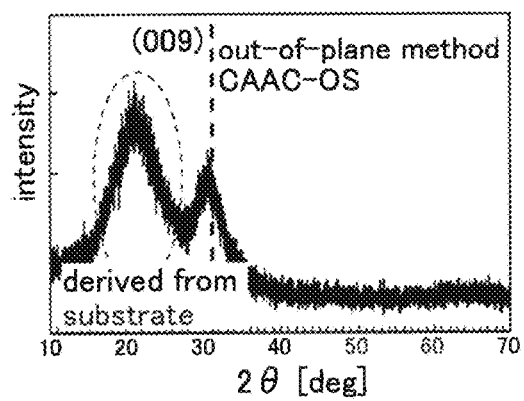
FIGS. 7A-7E are images describing structural analyses of a CAAC-OS and single crystal oxide semiconductor by XRD and illustrating a selected-area electron diffraction patterns of a CAAC-OS.

Analysis of a CAAC-OS by X-ray diffraction (XRD: X-Ray Diffraction) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 7(A). This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferable that the CAAC-OS do not show the peak.

Figure 7B:
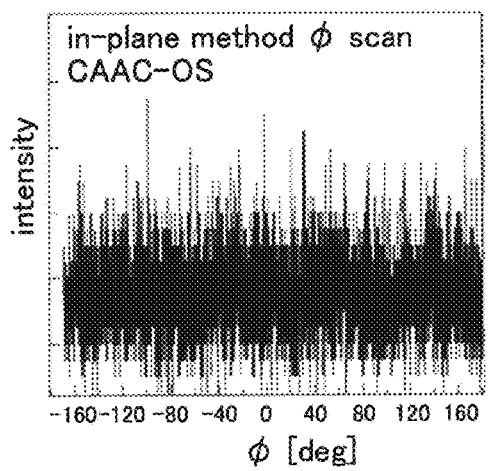
Figure 7C:
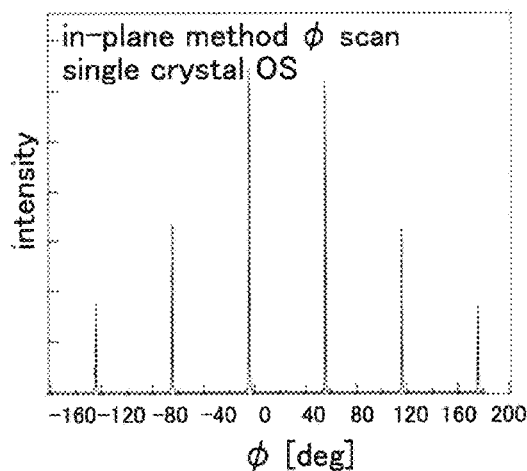

On the other hand, in structural analysis of the CAAC-OS by an in-plane method in which an X-ray is incident on the CAAC-OS in a direction parallel to the formation surface, a peak appears at a 2θ of around 56°. This peak is derived from the (110) plane of the InGaZnO$_4$ crystal. When analysis (φ scan) is performed with 2θ fixed at around 56° and with the sample rotated using a normal vector to the sample surface as an axis (φ axis), as shown in FIG. 7(B), a peak is not clearly observed. In contrast, in the case where single crystal InGaZnO$_4$ is subjected to φ scan with 2θ fixed at around 56°, as shown in FIG. 7(C), six peaks which are derived from crystal planes equivalent to the (110) plane are observed. Accordingly, the structural analysis using XRD shows that the directions of a-axes and b-axes are irregularly orientated in the CAAC-OS.

Figure 7D:
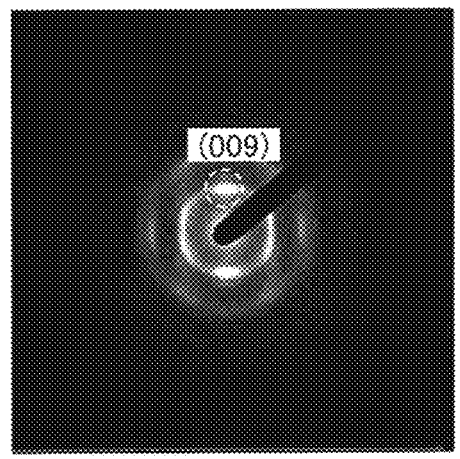
Figure 7E:
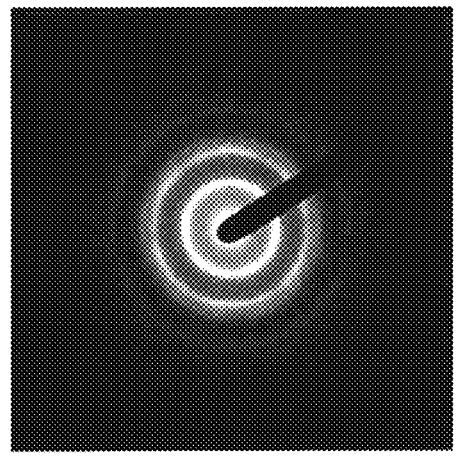

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 7(D) can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 7(E) shows a diffraction pattern obtained in such a manner that an electron beam with a probe diameter of 300 nm is incident on the same sample in a direction perpendicular to the sample surface. As shown in FIG. 7(E), a ring-like diffraction pattern is observed. Thus, the electron diffraction using an electron beam with a probe diameter of 300 nm also indicates that the a-axes and b-axes of the pellets included in the CAAC-OS do not have regular orientation. Note that the first ring in FIG. 7(E) is considered to be derived from the (010) plane, the (100) plane, and the like of the InGaZnO$_4$ crystal. Furthermore, the second ring in FIG. 7(E) is considered to be derived from the (110) plane and the like.

Furthermore, in a combined analysis image (also referred to as a high-resolution TEM image) of a bright-field image and a diffraction pattern of a CAAC-OS, which is obtained using a transmission electron microscope (TEM: Transmission Electron Microscope), a plurality of pellets can be observed. However, even in the high-resolution TEM image, a boundary between pellets, that is, a grain boundary (also referred to as a grain boundary) is not clearly observed in some cases. Thus, in the CAAC-OS, a reduction in electron mobility due to the grain boundary is less likely to occur.

Figure 8A:
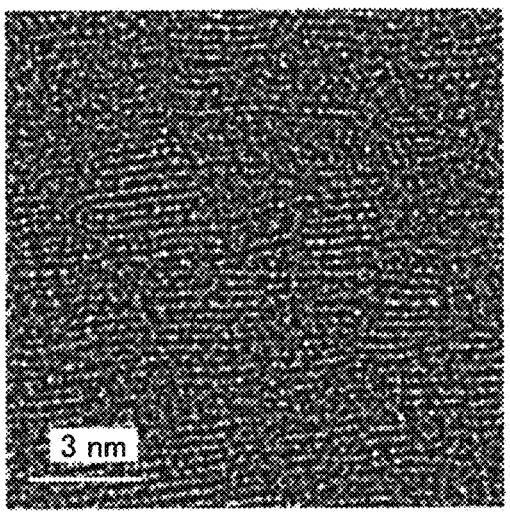
FIGS. 8A-8E are a cross-sectional TEM image and plan-view TEM images of a CAAC-OS and images obtained through analysis thereof.

FIG. 8(A) shows a high-resolution TEM image of a cross section of the CAAC-OS that is observed from a direction substantially parallel to the sample surface. The high-resolution TEM image is obtained with a spherical aberration corrector (Spherical Aberration Corrector) function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 8(A) shows pellets in which metal atoms are arranged in a layered manner. It is found that the size of a pellet is greater than or equal to 1 nm or greater than or equal to 3 nm. Therefore, the pellet can also be referred to as a nanocrystal (nc: nanocrystal). Furthermore, the CAAC-OS can also be referred to as an oxide semiconductor including CANC (C-Axis Aligned nanocrystals). A pellet reflects unevenness of a formation surface or a top surface of the CAAC-OS, and is parallel to the formation surface or the top surface of the CAAC-OS.

Figure 8B:
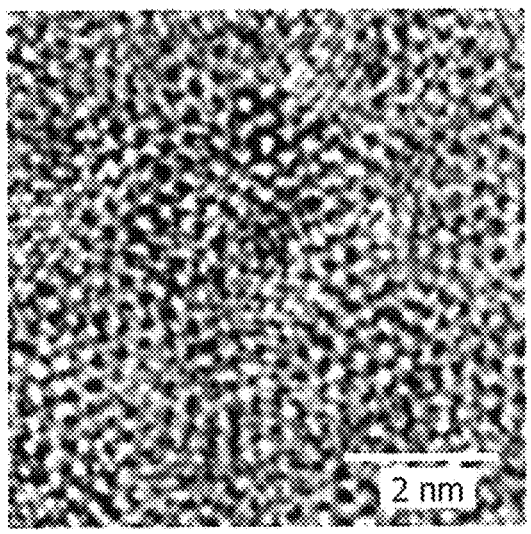
Figure 8C:
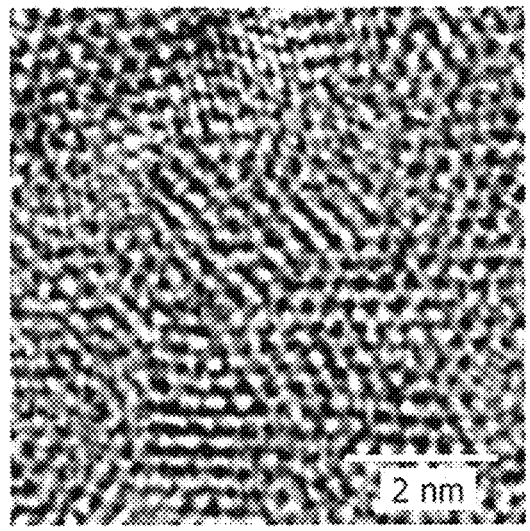
Figure 8D:
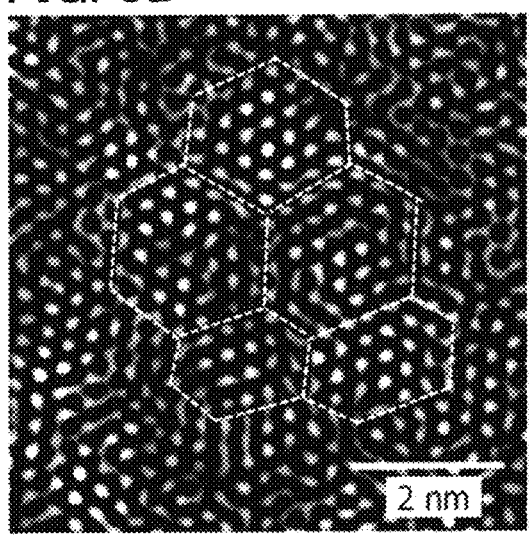
Figure 8E:
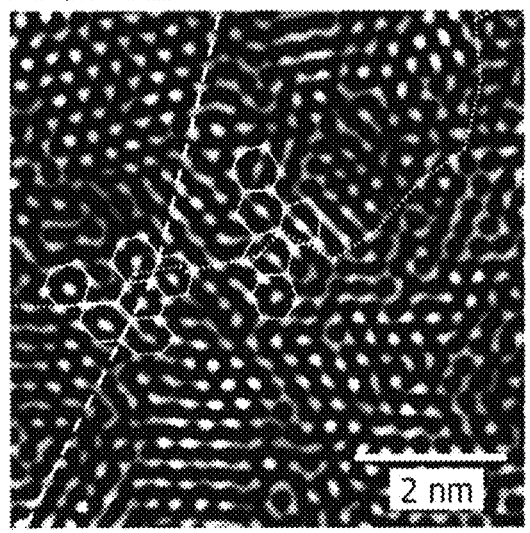

FIGS. 8(B) and 8(C) show Cs-corrected high-resolution TEM images of a plane of the CAAC-OS observed from a direction substantially perpendicular to the sample surface. FIGS. 8(D) and 8(E) are images obtained through image processing of FIGS. 8(B) and 8(C). The method of image processing is as follows. The image in FIG. 8(B) is subjected to fast Fourier transform (FFT: Fast Fourier Transform), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT: Inverse Fast Fourier Transform) to obtain a processed image. The image obtained in this manner is called an FFT filtering image. The FFT filtering image is a Cs-corrected high-resolution TEM image from which a periodic component is extracted, and shows a lattice arrangement.

In FIG. 8(D), a portion where a lattice arrangement is broken is shown by a dashed lines. A region surrounded by a dashed line is one pellet. The portion shown by the dashed line is a junction of pellets. The dashed line draws a hexagon, which means that the pellet has a hexagonal shape. Note that the shape of the pellet is not always a regular hexagon but is a non-regular hexagon in many cases.

In FIG. 8(E), a dotted line denotes a portion where the direction of a lattice arrangement changes between a region with a well lattice arrangement and another region with a well lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as CAA crystal (c-axis-aligned a-b-plane-anchored crystal).

The CAAC-OS is an oxide semiconductor with high crystallinity. Entry of impurities, formation of defects, or the like might decrease the crystallinity of an oxide semiconductor. This means that the CAAC-OS has small amounts of impurities and defects (oxygen vacancies and the like).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, impurities contained in the oxide semiconductor might serve as carrier traps or carrier generation sources. For example, oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density. Specifically, an oxide semiconductor with a carrier density of lower than $8\times10^{11}/cm^3$, preferably lower than $1\times10^{11}/cm^3$, further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, for example, a peak indicating orientation does not appear. That is, a crystal of an nc-OS does not have orientation.

Figure 9A:
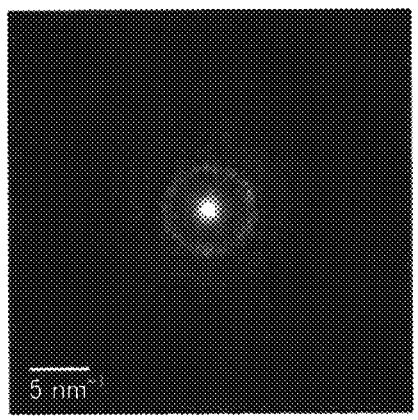
FIGS. 9A-9C are images illustrating electron diffraction patterns of an nc-OS and FIG. 9D is a cross-sectional TEM image of an nc-OS.
Figure 9B:
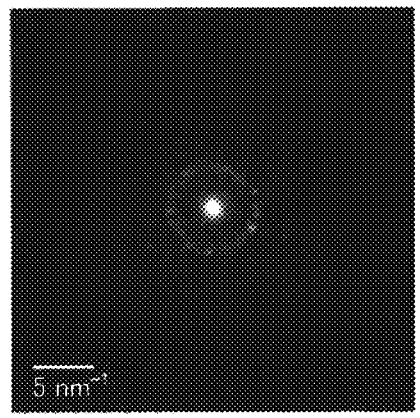

Furthermore, for example, when an electron beam with a probe diameter of 50 nm is incident on a 34-nm-thick region of a thinned nc-OS including an $InGaZnO_4$ crystal in a direction parallel to the formation surface, a ring-shaped diffraction pattern (nanobeam electron diffraction pattern) shown in FIG. 9(A) is observed. Furthermore, FIG. 9(B) shows a diffraction pattern obtained when an electron beam with a probe diameter of 1 nm is incident on the same sample. As shown in FIG. 9(B), a plurality of spots are observed in a ring-like region. In other words, ordering in an nc-OS is not observed with an electron beam with a probe diameter of 50 nm but is observed with an electron beam with a probe diameter of 1 nm.

Figure 9C:
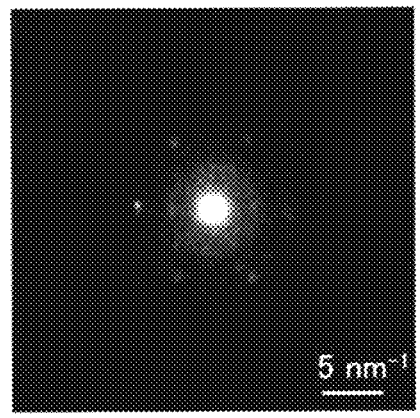

Furthermore, an electron diffraction pattern in which spots are arranged in an approximately regular hexagonal shape is observed in some cases as shown in FIG. 9(C) when an electron beam having a probe diameter of 1 nm is incident on a region with a thickness of less than 10 nm. This means that an nc-OS has a well-ordered region, that is, a crystal, in the range of less than 10 nm in thickness. Note that an electron diffraction pattern having regularity is not observed in some regions because crystals are aligned in various directions.

Figure 9D:
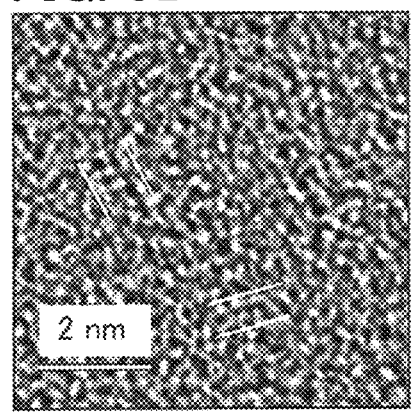

FIG. 9(D) shows a Cs-corrected high-resolution TEM image of a cross section of an nc-OS observed from the direction substantially parallel to the formation surface. In a high-resolution TEM image, an nc-OS has a region in which a crystal part is observed, such as a part indicated by additional lines, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor (micro crystalline oxide semiconductor). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS might be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including RANC (Random Aligned nanocrystals) or an oxide semiconductor including NANC (Non-Aligned nanocrystals).

The nc-OS is an oxide semiconductor that has high regularity than an amorphous oxide semiconductor. Thus, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS.

<A-Like OS>

An a-like OS is an oxide semiconductor having a structure between the nc-OS and the amorphous oxide semiconductor.

FIG. 10 are high-resolution cross-sectional TEM images of an a-like OS. Here, FIG. 10(A) is the high-resolution cross-sectional TEM image of the a-like OS at the start of electron irradiation. FIG. 10(B) is the high-resolution cross-sectional TEM image of a-like OS after electron ($e^-$) irradiation at $4.3\times10^8$ $e^-/nm^2$. FIGS. 10(A) and 10(B) show that stripe-like bright regions extending vertically are observed in the a-like OS from the start of electron irradiation. Furthermore, it can be also found that the shape of the bright region changes after electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of the $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as a d value.). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Note that each of lattice fringes corresponds to the a-b plane of the $InGaZnO_4$ crystal.

Figure 11:
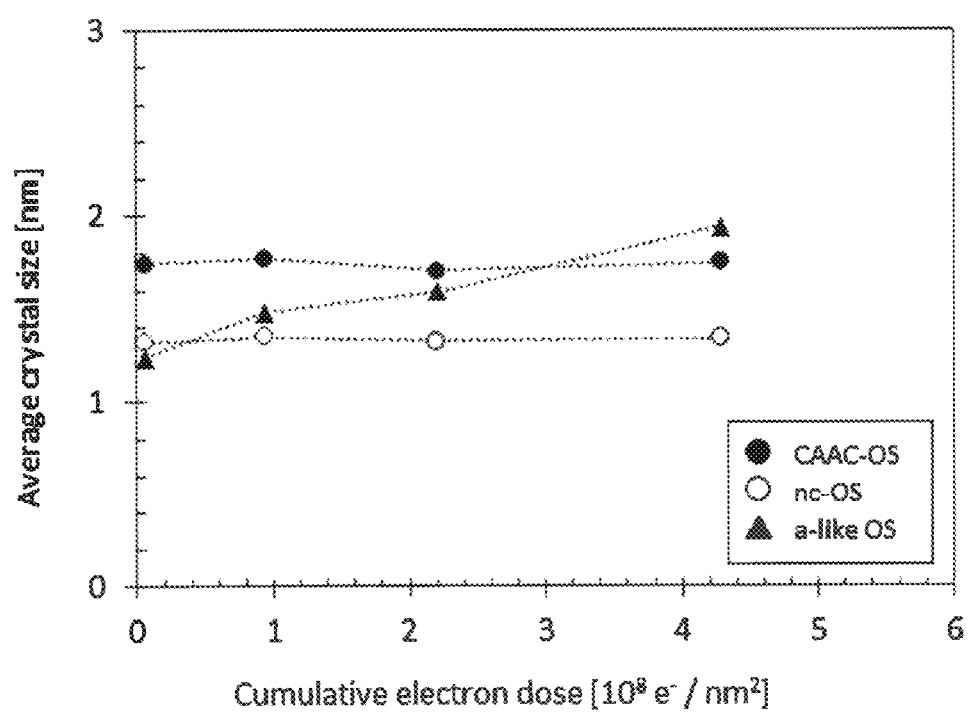
FIG. 11 is an image illustrating change in crystal parts of an In—Ga—Zn oxide induced by electron irradiation.
Figure 12A:
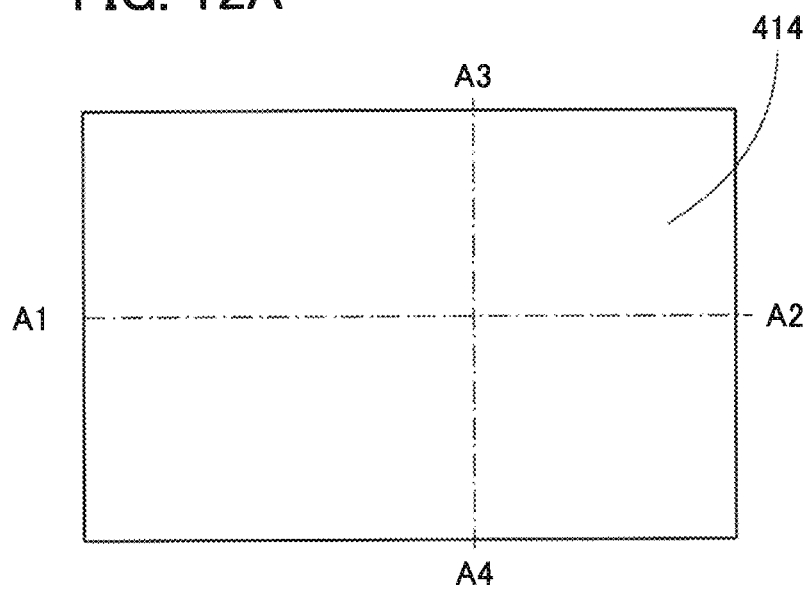
FIG. 12A is a top view and FIGS. 12B and 12C are cross-sectional views illustrating a method for manufacturing a transistor of one embodiment of the present invention.
Figure 12B:
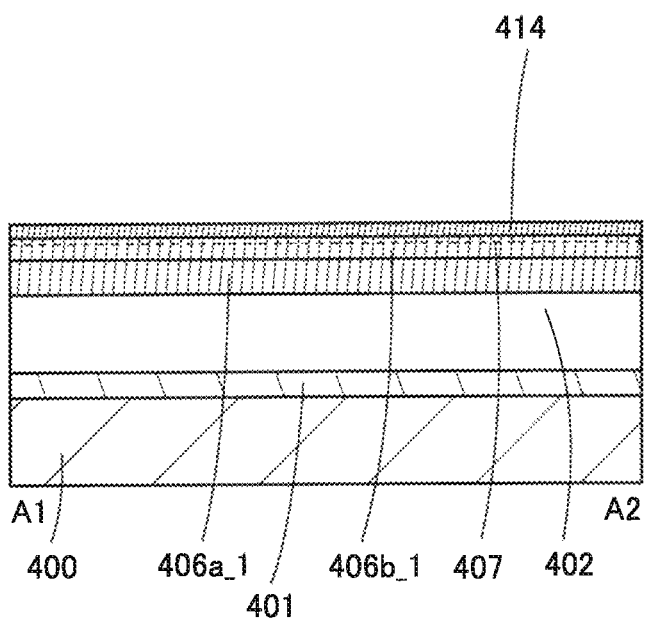
Figure 12C:
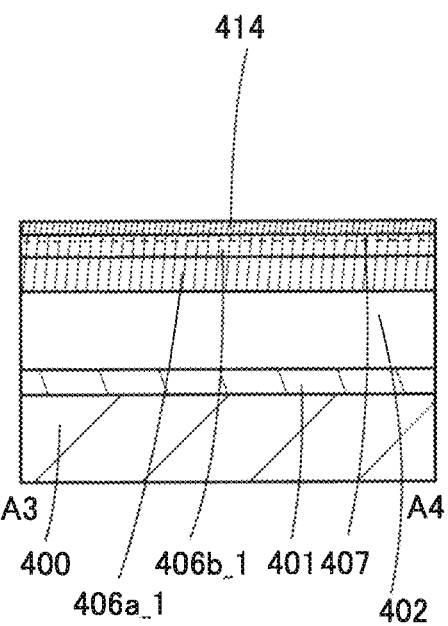
Figure 13A:
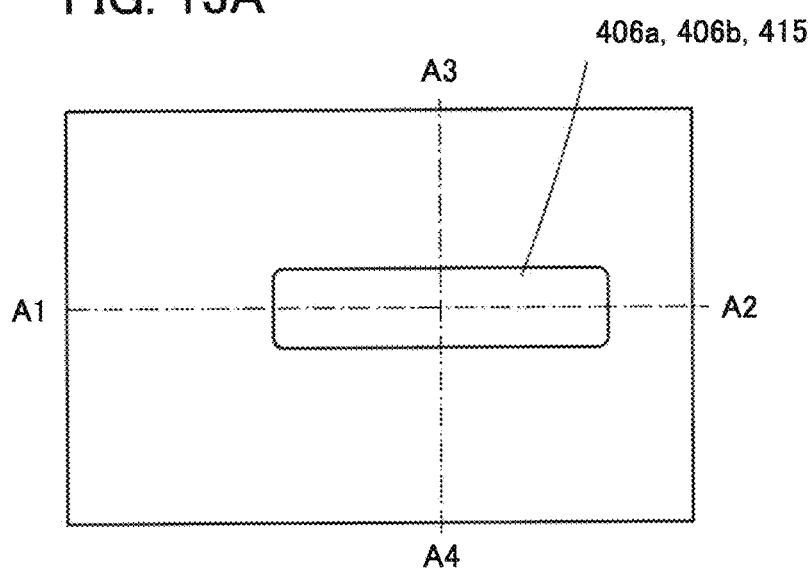
FIG. 13A is a top view and FIGS. 13B and 13C are cross-sectional views illustrating a method for manufacturing a transistor of one embodiment of the present invention.
Figure 13B:
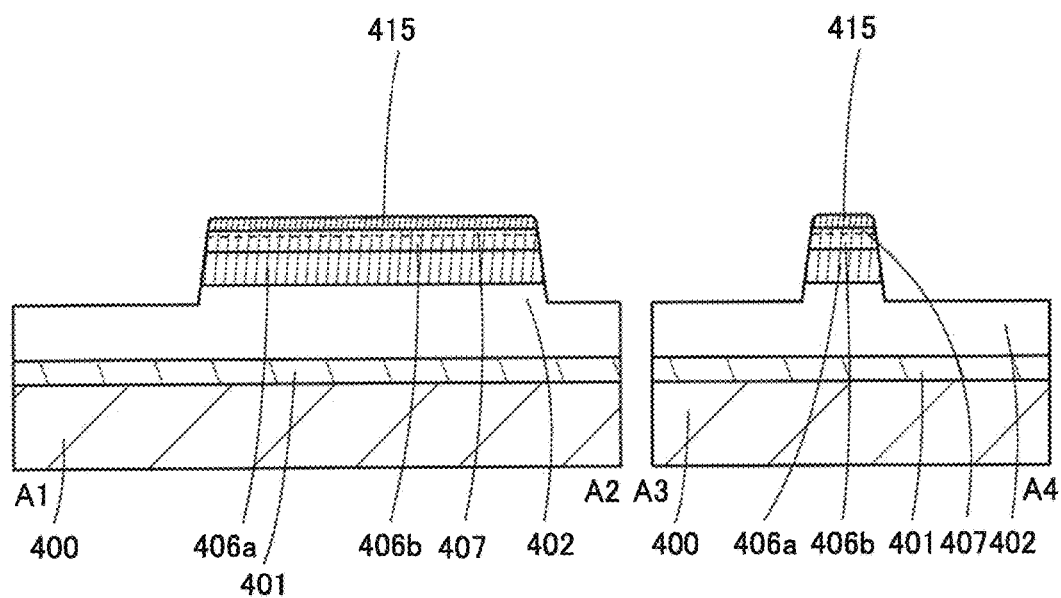
Figure 13C:
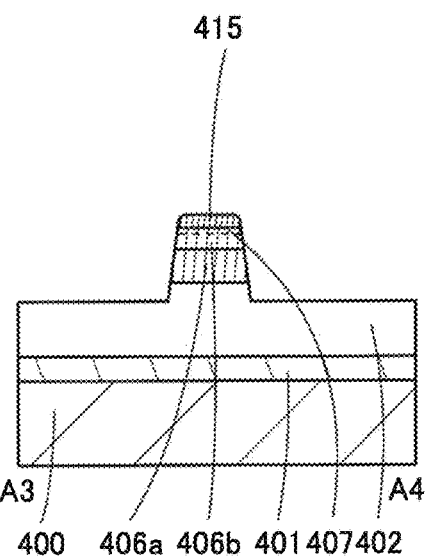
Figure 15A:
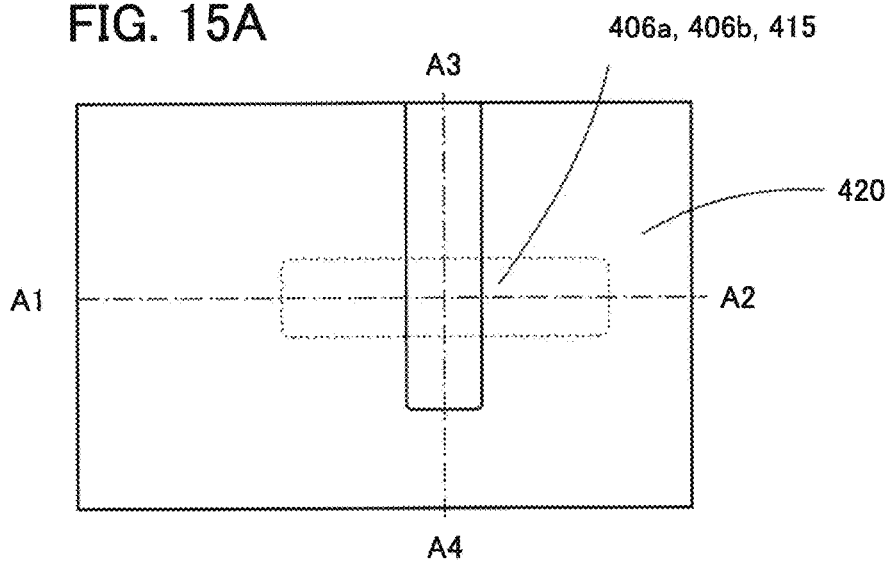
FIG. 15A is a top view and FIGS. 15B and 15C are cross-sectional views illustrating a method for manufacturing a transistor of one embodiment of the present invention.
Figure 15B:
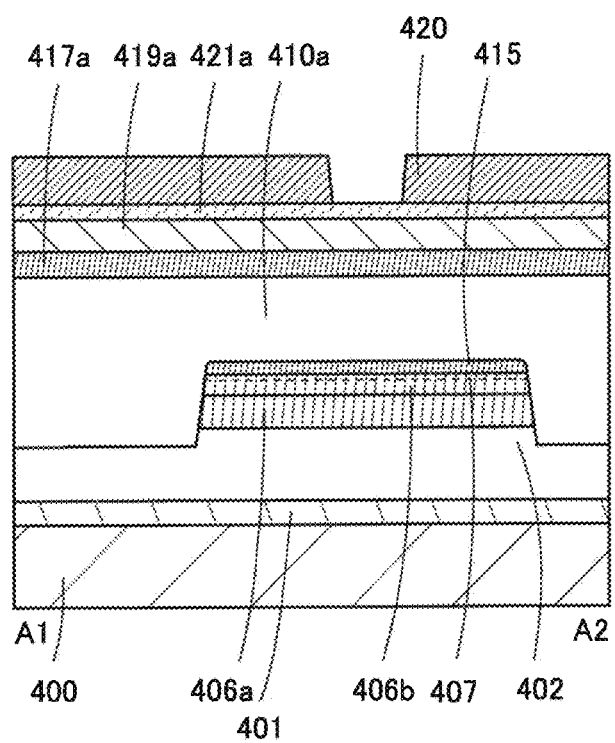
Figure 15C:
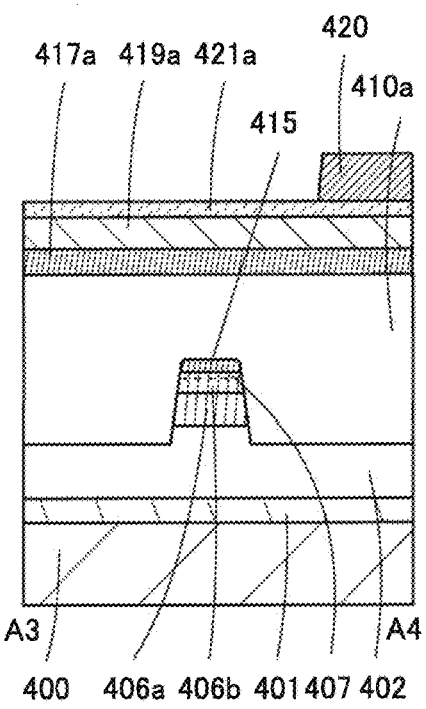
Figure 16A:
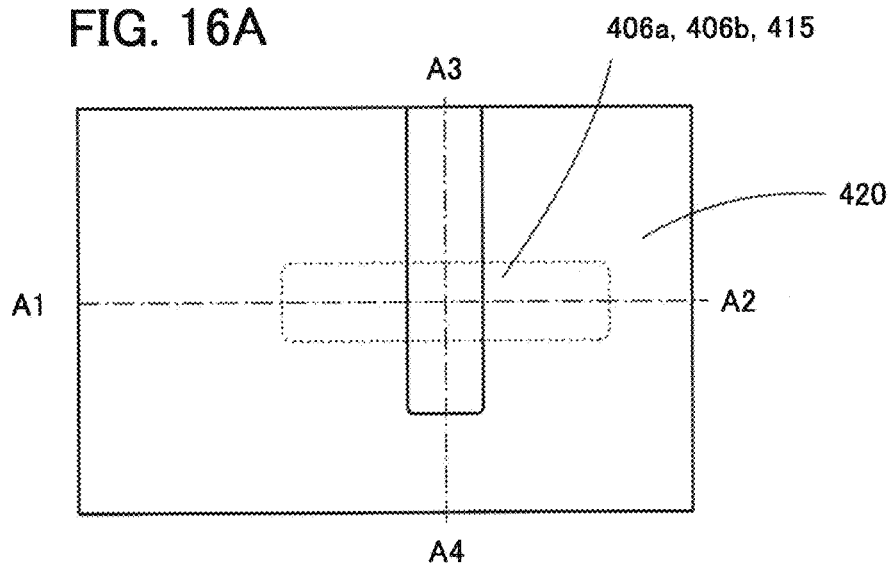
FIG. 16A is a top view and FIGS. 16B and 16C are cross-sectional views illustrating a method for manufacturing a transistor of one embodiment of the present invention.
Figure 16B:
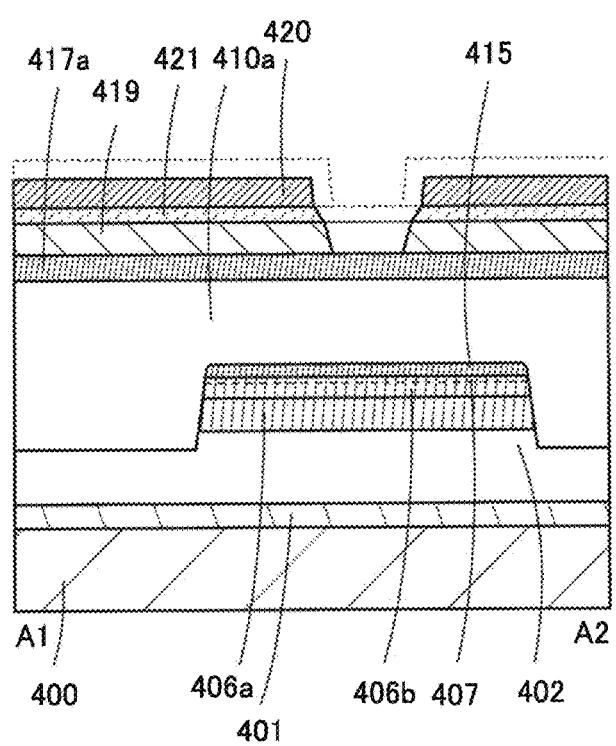
Figure 16C:
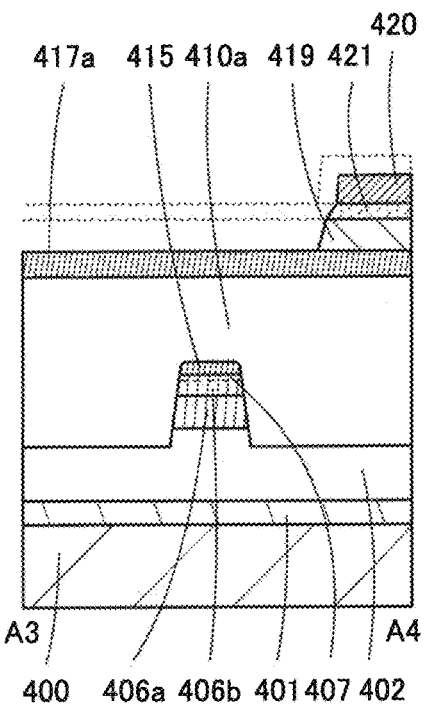
Figure 17A:
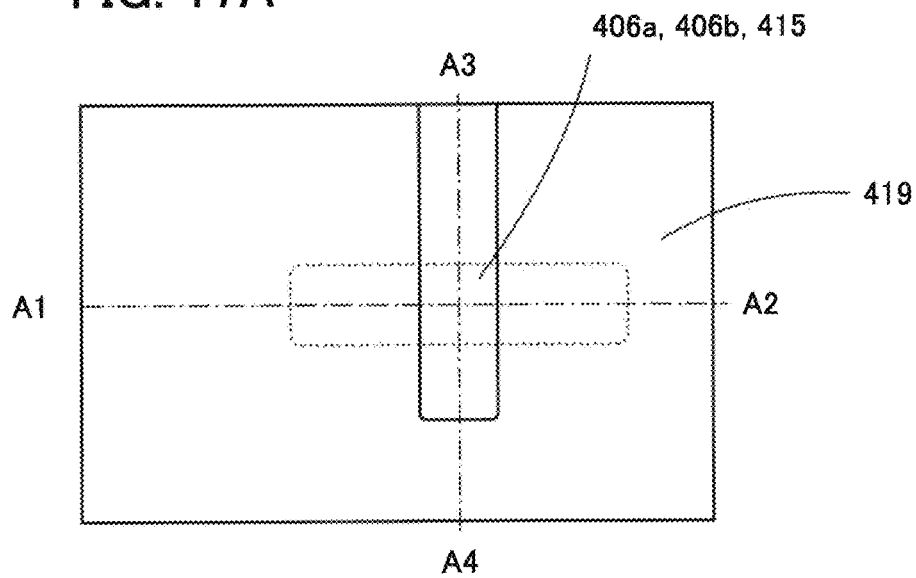
FIG. 17A is a top view and FIGS. 17B and 17C are cross-sectional views illustrating a method for manufacturing a transistor of one embodiment of the present invention.
Figure 17B:
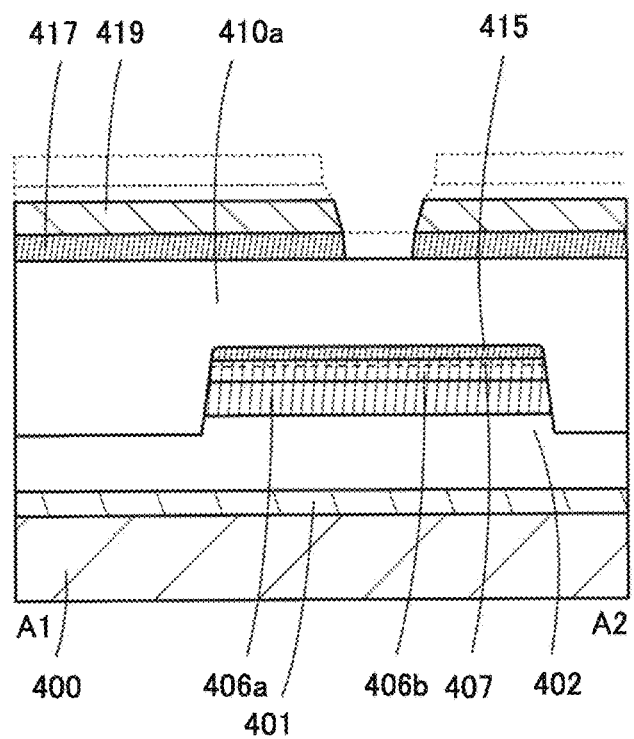
Figure 17C:
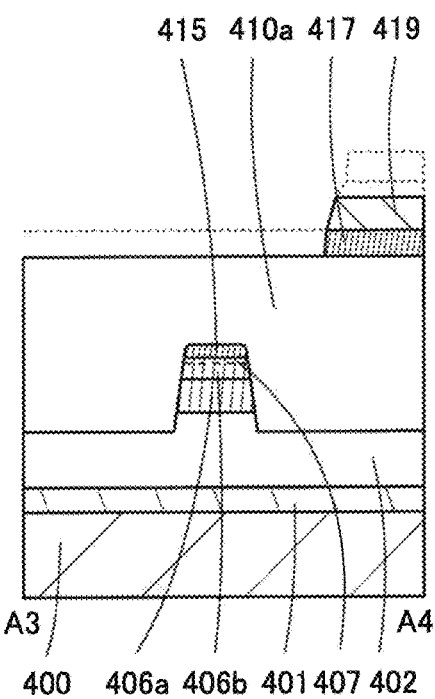
Figure 25A:
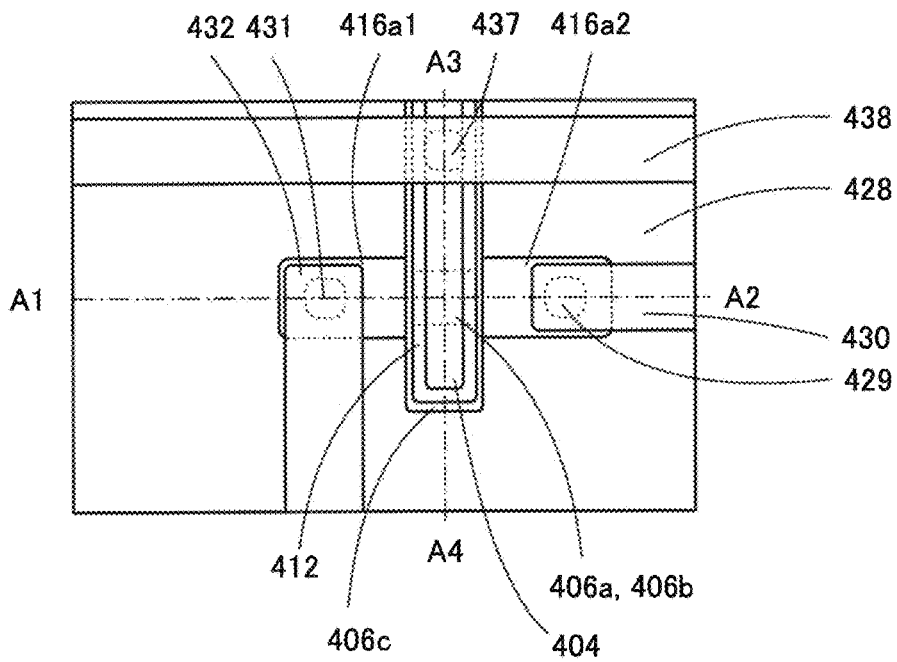
FIG. 25A is a top view and FIGS. 25B and 25C are cross-sectional views illustrating a method for manufacturing a transistor of one embodiment of the present invention.
Figure 25B:
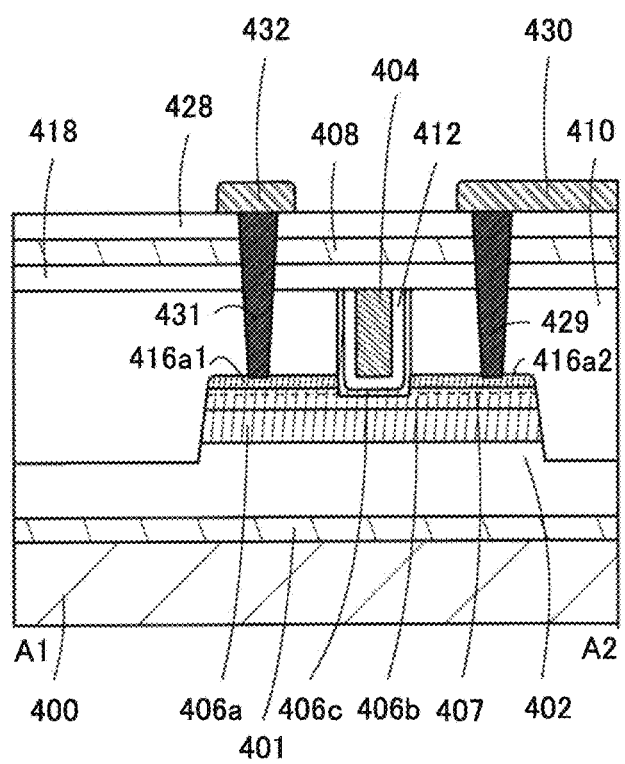
Figure 25C:
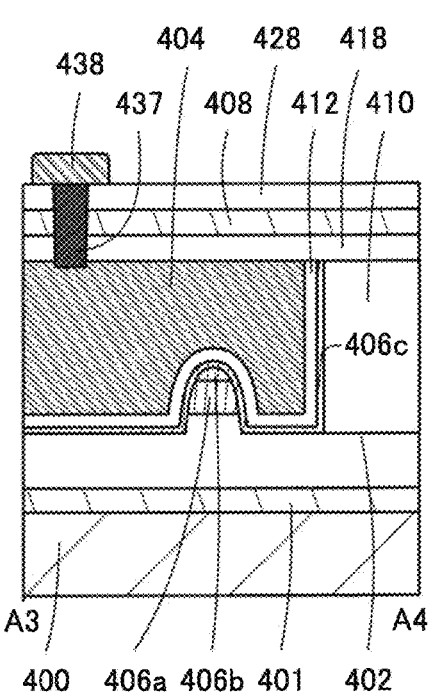

FIG. 11 shows a change in the average size of crystal parts (at 22 to 30 points) in each sample. Note that the crystal part size corresponds to the length of the above-described lattice fringe. FIG. 11 indicates that the crystal part size in the a-like OS increases with an increase in the cumulative electron dose in obtaining TEM images, for example. As shown in FIG. 11, a crystal part of approximately 1.2 nm (also referred to as an initial nucleus) at the start of TEM observation grows to a size of approximately 1.9 nm at a cumulative electron ($e^-$) dose of $4.2\times10^8$ $e^-/nm^2$. In contrast, the crystal part sizes in the nc-OS and the CAAC-OS show little change from the start of electron irradiation to a cumulative electron dose of $4.2\times10^8$ $e^-/nm^2$. As shown in FIG. 11, the crystal part sizes in the nc-OS and the CAAC-OS are approximately 1.3 nm and approximately 1.8 nm, respectively, regardless of the cumulative electron dose. Note that for electron beam irradiation and TEM observation, a Hitachi H-9000NAR transmission electron microscope was used. The conditions of electron beam irradiation were as follows: accelerating voltage was 300 kV; current density was $6.7\times10^5 e^-/(nm^2 \cdot s)$; and the diameter of an irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has lower density than the nc-OS and the CAAC-OS because it contains a void. Specifically, the density of the a-like OS is higher than or equal to 78.6% and lower than 92.3% of the density of the single crystal having the same composition. The density of each of the nc-OS and the CAAC-OS is higher than or equal to 92.3% and lower than 100% of the density of the single crystal having the same composition. It is difficult to deposit an oxide semiconductor whose density is lower than 78% of the density of the single crystal oxide semiconductor.

For example, in the case of an oxide semiconductor with an [atomic ratio] of In:Ga:Zn=1:1:1, the density of single-crystal InGaZnO$_4$ with a rhombohedral crystal structure is 6.357 g/cm$^3$. Thus, for example, in the case of the oxide semiconductor with an [atomic ratio] of In:Ga:Zn=1:1:1, the density of an a-like OS is higher than or equal to 5.0 g/cm$^3$ and lower than 5.9 g/cm$^3$. In addition, for example, in the case of the oxide semiconductor with an [atomic ratio] of In:Ga:Zn=1:1:1, the density of an nc-OS or a CAAC-OS is higher than or equal to 5.9 g/cm$^3$ and lower than 6.3 g/cm$^3$.

Note that in the case where single crystals with the same composition do not exist, by combining single crystals with different compositions at a given proportion, it is possible to estimate density that corresponds to the density of a single crystal with a desired composition. The density of the single crystal with a desired composition may be estimated using weighted average with respect to the combination ratio of the single crystals with different compositions. Note that it is preferable to combine as few kinds of single crystals as possible for density estimation.

As described above, oxide semiconductors have various structures and various properties. Note that an oxide semiconductor may be a stacked film including two or more of an amorphous oxide semiconductor, an a-like OS, an nc-OS, and a CAAC-OS, for example.

An oxide which can be used as the insulator 406a, the semiconductor 406b, the insulator 406c, or the like is described.

The semiconductor 406b is an oxide semiconductor containing indium, for example. The semiconductor 406b can have high carrier mobility (electron mobility) by containing indium, for example. Furthermore, the semiconductor 406b preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M. The element M is an element having high bonding energy with oxygen, for example. For example, the element M is an element whose bonding energy with oxygen is higher than that of indium. Furthermore, the element M is an element that can increase the energy gap of the oxide semiconductor, for example. Furthermore, the semiconductor 406b preferably contains zinc. When the oxide semiconductor contains zinc, the oxide semiconductor is easily crystallized, in some cases.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, for example, a zinc tin oxide, a gallium tin oxide, or a gallium oxide.

For the semiconductor 406b, an oxide with a wide energy gap may be used, for example. For example, the energy gap of the semiconductor 406b is greater than or equal to 2.5 eV and less than or equal to 4.2 eV, preferably greater than or equal to 2.8 eV and less than or equal to 3.8 eV, and further preferably greater than or equal to 3 eV and less than or equal to 3.5 eV.

For example, the insulator 406a and the insulator 406c are oxides including one or more elements other than oxygen included in the semiconductor 406b. Since the insulator 406a and the insulator 406c each include one or more elements other than oxygen included in the semiconductor 406b, an interface state is less likely to be formed at the interface between the insulator 406a and the semiconductor 406b and the interface between the semiconductor 406b and the insulator 406c.

The case where the insulator 406a, the semiconductor 406b, and the insulator 406c contain indium is described. Note that in the case of using an In-M-Zn oxide as the insulator 406a, when a summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Furthermore, in the case of using an In-M-Zn oxide as the semiconductor 406b, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. Furthermore, in the case of using an In-M-Zn oxide as the insulator 406c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the insulator 406c may be an oxide that is a type the same as that of the insulator 406a.

As the semiconductor 406b, an oxide having an electron affinity higher than those of the insulators 406a and 406c is used. For example, as the semiconductor 406b, an oxide having an electron affinity higher than those of the insulators 406a and 406c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy gap between the vacuum level and the bottom of the conduction band.

Note that an indium gallium oxide has a small electron affinity and a high oxygen-blocking property. Therefore, the insulator 406c preferably includes an indium gallium oxide. The gallium atomic ratio [Ga/(In+Ga)] is, for example, higher than or equal to 70%, preferably higher than or equal to 80%, further preferably higher than or equal to 90%.

Note that the insulator 406a and/or the insulator 406c may be gallium oxide. For example, when gallium oxide is used as the insulator 406c, leakage current between the conductor 404 and the conductor 416a1 or the conductor 416a2 can be reduced. In other words, the off-state current of the transistor can be reduced.

At this time, when a gate voltage is applied, a channel is formed in the semiconductor 406b having the highest electron affinity in the insulator 406a, the semiconductor 406b, and the insulator 406c.

Here, in some cases, there is a mixed region of the insulator 406a and the semiconductor 406b between the insulator 406a and the semiconductor 406b. Furthermore, in some cases, there is a mixed region of the semiconductor 406b and the insulator 406c between the semiconductor 406b and the insulator 406c. The mixed region has a low density of interface states. For that reason, the stack of the insulator 406a, the semiconductor 406b, and the insulator 406c has a band structure where energy at each interface and in the vicinity of the interface is changed continuously (also referred to as continuous junction.).

At this time, electrons move mainly in the semiconductor 406b, not in the insulator 406a and the insulator 406c. Thus, when the interface state density at the interface between the insulator 406a and the semiconductor 406b and the interface state density at the interface between the semiconductor 406b and the insulator 406c are decreased, electron movement in the semiconductor 406b is less likely to be inhibited and the on-state current of the transistor can be increased.

Note that in the case where the transistor has an s-channel structure, a channel is formed in the whole of the semiconductor 406b. Therefore, as the semiconductor 406b has a larger thickness, a channel region becomes larger. In other words, the thicker the semiconductor 406b is, the larger the on-state current of the transistor is. For example, the semiconductor 406b has a region with a thickness greater than or equal to 10 nm, preferably greater than or equal to 20 nm, more preferably greater than or equal to 40 nm, further preferably greater than or equal to 60 nm, still further preferably greater than or equal to 100 nm. Note that in some cases, when the channel formation region is reduced in size, electrical characteristics of the transistor with a smaller thickness of the semiconductor 406b may be improved. Therefore, the semiconductor 406b may have a thickness less than 10 nm.

Moreover, the thickness of the insulator 406c is preferably as small as possible to increase the on-state current of the transistor. The thickness of the insulator 406c is less than 10 nm, preferably less than or equal to 5 nm, more preferably less than or equal to 3 nm, for example. Meanwhile, the insulator 406c has a function of blocking entry of elements other than oxygen (such as hydrogen and silicon) included in the adjacent insulator into the semiconductor 406b where a channel is formed. For this reason, it is preferable that the insulator 406c have a certain thickness. For example, the thickness of the insulator 406c is greater than or equal to 0.3 nm, preferably greater than or equal to 1 nm, further preferably greater than or equal to 2 nm. The insulator 406c preferably has an oxygen blocking property to suppress outward diffusion of oxygen released from the insulator 402 and the like.

Furthermore, to improve reliability, preferably, the thickness of the insulator 406a is large and the thickness of the insulator 406c is small. The insulator 406a has a region with a thickness, for example, greater than or equal to 10 nm, preferably greater than or equal to 20 nm, further preferably greater than or equal to 40 nm, still further preferably greater than or equal to 60 nm. When the thickness of the insulator 406a is made large, a distance from an interface between the adjacent insulator and the insulator 406a to the semiconductor 406b in which a channel is formed can be large. Since the productivity of the semiconductor device including the transistor might be decreased, the insulator 406a has a region with a thickness, for example, less than or equal to 200 nm, preferably less than or equal to 120 nm, further preferably less than or equal to 80 nm.

For example, silicon in the oxide semiconductor might serve as a carrier trap or a carrier generation source. Therefore, the silicon concentration of the semiconductor 406b is preferably as low as possible. For example, a region in which the concentration of silicon which is measured by secondary ion mass spectrometry (SIMS: Secondary Ion Mass Spectrometry) is lower than $1\times10^{19}$ atoms/cm$^3$, preferably lower than $5\times10^{18}$ atoms/cm$^3$, or further preferably lower than $2\times10^{18}$ atoms/cm$^3$ is provided between the semiconductor 406b and the insulator 406a. A region with a silicon concentration lower than $1\times10^{19}$ atoms/cm$^3$, preferably lower than $5\times10^{18}$ atoms/cm$^3$, further preferably lower than $2\times10^{18}$ atoms/cm$^3$ which is measured by SIMS is provided between the semiconductor 406b and the insulator 406c.

Furthermore, it is preferable to reduce the concentration of hydrogen in the insulator 406a and the insulator 406c in order to reduce the concentration of hydrogen in the semiconductor 406b. The insulator 406a and the insulator 406c each have a region in which the concentration of hydrogen measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Furthermore, it is preferable to reduce the concentration of nitrogen in the insulator 406a and the insulator 406c in order to reduce the concentration of nitrogen in the semiconductor 406b. The insulator 406a and the insulator 406c each have a region in which the concentration of nitrogen measured by SIMS is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Note that when copper enters the oxide semiconductor, an electron trap might be generated. The electron trap might shift the threshold voltage of the transistor in the positive direction. Therefore, the concentration of copper on the surface of or in the semiconductor 406b is preferably as low as possible. For example, the semiconductor 406b preferably has a region in which the copper concentration is lower than or equal to $1\times10^{19}$ atoms/cm$^3$, lower than or equal to $5\times10^{18}$ atoms/cm$^3$, or lower than or equal to $1\times10^{18}$ atoms/cm$^3$.

The above three-layer structure is an example. For example, a two-layer structure without the insulator 406a or the insulator 406c may be employed. Alternatively, a four-layer structure in which any one of the insulators or the semiconductors described as examples of the insulator 406a, the semiconductor 406b, and the insulator 406c is provided below or over the insulator 406a or below or over the insulator 406c may be employed. Alternatively, an n-layer structure (n is an integer of 5 or more) may be employed in which any one of the insulators or the semiconductors described as examples of the insulator 406a, the semiconductor 406b, and the insulator 406c is provided at two or more of the following positions: over the insulator 406a, below the insulator 406a, over the insulator 406c, and below the insulator 406c.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. Furthermore, as the semiconductor substrate, a single-material semiconductor substrate of silicon, germanium, or the like or a compound semiconductor substrate containing silicon carbide, silicon germanium, gallium arsenide, indium phosphide, zinc oxide, or gallium oxide, or the like is used, for example. A semiconductor substrate in which an insulator region is provided in the above semiconductor substrate, for example, an SOI (Silicon On Insulator) substrate or the like is used. As the conductor substrate, a graphite substrate, a metal substrate, an alloy substrate, a conductive resin substrate, or the like is used. Furthermore, a substrate including a metal nitride, a substrate including a metal oxide, or the like is used. Furthermore, an insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing the transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. Note that as the substrate 400, a sheet, a film, or a foil containing a fiber may be used. Furthermore, the substrate 400 may have elasticity. Furthermore, the substrate 400 may have a property of returning to its original shape when bending or pulling is stopped. Alternatively, the substrate 400 may have a property of not returning to its original shape. The substrate 400 has a region with a thickness of, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 400 has a small thickness, the weight of the semiconductor device including the transistor can be reduced. Furthermore, when the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (nylon, aramid, or the like), polyimide, polycarbonate, and acrylic. In particular, aramid is preferably used for the flexible substrate 400 because of its low coefficient of linear expansion.

At least part of this embodiment can be implemented in combination with any of the embodiments described in this specification as appropriate.

Embodiment 3

<Method for Manufacturing Transistor>

A method for manufacturing the transistor of the present invention in FIG. 1 will be described below with reference to FIG. 12 to FIG. 26.

First, the substrate 400 is prepared.

Next, the insulator 401 is formed. The insulator 401 can be formed by a thermal oxidation method, a sputtering method, a chemical vapor deposition (CVD: Chemical Vapor Deposition) method, a molecular beam epitaxy (MBE: Molecular Beam Epitaxy) method, a pulsed laser deposition (PLD: Pulsed Laser Deposition) method, an atomic layer deposition (ALD: Atomic Layer Deposition) method, or the like.

Note that CVD methods can be classified into a plasma CVD (PECVD: Plasma Enhanced CVD) method using plasma, a thermal CVD (TCVD: Thermal CVD) method using heat, a photo CVD (Photo CVD) method using light, and the like. Moreover, the CVD method can be further classified into a metal CVD (MCVD: Metal CVD) method and a metal organic CVD (MOCVD: Metal Organic CVD) method according to a source gas to be used.

By using the Plasma CVD method, a high-quality film can be formed at a relatively low temperature. Furthermore, a thermal CVD method does not use plasma and thus causes less plasma damage to an object to be processed. For example, a wiring, an electrode, an element (transistor, capacitor, or the like), or the like included in a semiconductor device might be charged up by receiving electric charges from plasma. In that case, accumulated electric charges might break the wiring, electrode, element, or the like included in the semiconductor device. In contrast, such plasma damage is not caused in the case of using a thermal CVD method, and thus the yield of a semiconductor device can be increased. In addition, since plasma damage does not occur in the deposition by a thermal CVD method, a film with few defects can be obtained.

Furthermore, an ALD method also causes less plasma damage to an object to be processed. Furthermore, an ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object to be processed. Thus, a CVD method and an ALD method enable favorable step coverage almost regardless of the shape of an object. In particular, an ALD method enables excellent step coverage and excellent thickness uniformity and can be favorably used for covering a surface of an opening portion with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by the CVD method or the ALD method, a film with a desired composition can be formed by adjusting the flow ratio of a source gas. Moreover, for example, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

Next, the insulator 402 is formed over the insulator 401. The insulator 402 can be formed by a sputtering method, a CVD method, an MBE method, a PLD method, an ALD method, or the like. Next, treatment to add oxygen to the insulator to be the insulator 402 may be performed. For the treatment to add oxygen, for example, an ion implantation method, a plasma treatment method, or the like can be used. Note that oxygen added to the insulator 402 is excess oxygen.

Next, an insulator to be the insulator 406a_1 is deposited over the insulator 402. The insulator 406a_1 can be formed by a sputtering method, a CVD method, an MBE method, a PLD method, an ALD method, or the like.

Next, treatment to add oxygen to the insulator 406a_1 may be performed. For the treatment to add oxygen, for example, an ion implantation method, a plasma treatment method, or the like can be used. Note that oxygen added to the insulator 406a_1 is excess oxygen. Oxygen is preferably added to a layer corresponding to the insulator 406a_1. Next, the semiconductor 406b_1 is formed over the insulator 406a_1.

Next, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for desorbed oxygen. By the first heat treatment, crystallinity of the semiconductor can be increased and impurities such as hydrogen and moisture can be removed, for example. Alternatively, in the first heat treatment, plasma treatment using oxygen may be performed under a reduced pressure. The plasma treatment containing oxygen is preferably performed using an apparatus including a power source for generating high-density plasma using microwaves, for example. Alternatively, a plasma power source for applying an RF (Radio Frequency) to a substrate side may be provided. The use of high-density plasma enables high-density oxygen radicals to be produced, and application of the RF voltage to the substrate side allows oxygen radicals generated by the high-density plasma to be efficiently introduced into the semiconductor 406b_1. Alternatively, after plasma treatment using an inert gas with the apparatus, plasma treatment using oxygen in order to compensate for released oxygen may be performed.

Next, a conductor 414 is formed over the semiconductor 406b_1. The conductor 414 can be formed by a sputtering method, a CVD method, an MBE method, a PLD method, an ALD method, or the like. Here, a top surface of the semiconductor 406b_1 is damaged when the conductor 414 is formed, whereby the region 407 is formed (see FIGS. 12(A), (B), and (C)).

Next, the insulator 406a_1, the semiconductor 406b_1, and the conductor 414 are processed by a lithography method or the like to form a multilayer film including the insulator 406a, the semiconductor 406b, and the conductor 415. The region 407 includes a region in which the resistance of the semiconductor 406b is reduced; thus, contact resistance between the conductor 415 and the semiconductor 406b is reduced. Note that when the multilayer film is formed, the insulator 402 is also subjected etching to have a thinned region in some cases. That is, the insulator 402 may have a protruding portion in a region in contact with the multilayer film (see FIGS. 13(A), (B), and (C)).

Note that in a lithography method, first, a resist is exposed to light through a mask. Next, a region exposed to light is removed or left using a developing solution, so that a resist mask is formed. Then, etching through the resist mask is conducted. As a result, the conductor, the semiconductor, the insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid for example, water) to perform light exposure. Furthermore, an electron beam or an ion beam may be used instead of the above-mentioned light. Note that a mask is not necessary in the case of using an electron beam or an ion beam. Note that dry etching treatment such as ashing or wet etching treatment can be used for removal of the resist mask. Alternatively, wet etching treatment is performed after dry etching treatment. Still alternatively, dry etching treatment is performed after wet etching treatment.

As a dry etching apparatus, a capacitively coupled plasma (CCP: Capacitively Coupled Plasma) etching apparatus including parallel plate type electrodes can be used. The capacitively coupled plasma etching apparatus including the parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP: Inductive Coupled Plasma) etching apparatus can be used, for example.

Next, an insulator 410a is formed. The insulator 410a can be deposited by a sputtering method, a CVD method, an MBE method, a PLD method, an ALD method, or the like. Alternatively, a spin coating method, a dipping method, a droplet discharging method (an ink-jet method or the like), a printing method (screen printing, offset printing, or the like), a doctor knife method, a roll coater method, a curtain coater method, or the like can be used.

The insulator 410a may be formed to have a flat top surface. For example, the top surface of the insulator 410a may have flatness immediately after the film formation. Alternatively, for example, the insulator 410a may have flatness by removing the insulator and the like from the top surface after the film formation so that the top surface becomes parallel to a reference surface such as a rear surface of the substrate. Such treatment is referred to as planarization treatment. As the planarization treatment, for example, chemical mechanical polishing (CMP: Chemical Mechanical Polishing) treatment, dry etching treatment, or the like can be performed. However, the top surface of the insulator 410a is not necessarily flat.

A method for processing the insulator 410a and the conductor 415 according to the present invention will be described below in detail.

First, a conductor 417a is formed over the insulator 410a. The conductor 417a can be formed by a sputtering method, a CVD method, an MBE method, a PLD method, an ALD method, or the like. Next, an insulator 419a is formed over the conductor 417a. The insulator 419a can be formed by a sputtering method, a CVD method, an MBE method, a PLD method, an ALD method, or the like (see FIGS. 14(A), (B), and (C)).

Next, an organic coating film 421a is formed over the insulator 419a. Next, a resist mask 420 is formed over the organic coating film 421a by a lithography method or the like. The organic coating film 421a is formed between the insulator 419a and the resist mask 420, so that adhesion between the insulator 419a and the resist mask 420 with the organic coating film interposed therebetween may be improved. Note that formation of the organic coating film can be omitted (see FIGS. 15(A), (B), (C)).

Next, the organic coating film 421a is subjected to first processing by a dry etching method or the like using the resist mask 420 as a mask, whereby an organic coating film 421a is formed. Examples of gases to be used for the processing of the organic coating film include a $C_4F_6$ gas, a $C_2F_8$ gas, a $CF_4$ gas, a $SF_6$ gas, and a $CHF_3$ gas.

Next, second processing is performed on the insulator 419a by dry etching method until a top surface of the conductor 417a is exposed, whereby the insulator 419 is formed. As a gas for the second processing, for example, any of a $C_4F_6$ gas, a $C_2F_8$ gas, a $C_4F_8$ gas, a $CF_4$ gas, a $SF_6$ gas, a $CHF_3$ gas, and the like can be used alone or in combination. Alternatively, an oxygen gas, a helium gas, an argon gas, a hydrogen gas, or the like can be added to any of the above gases as appropriate. As a dry etching apparatus used for the first processing and the second processing, any of the above-described dry etching apparatuses can be used; however, a dry etching apparatus in which high-frequency power sources with different frequencies are connected to the parallel-plate electrodes is preferably used (see FIGS. 16(A), (B), and (C)).

Next, third processing is performed on the conductor 417a by a dry etching method until the conductor 417a reaches the top surface of the insulator 410a, whereby a conductor 417 is formed. As a gas for the dry etching in the third processing, for example, any of a $C_4F_6$ gas, a $C_2F_8$ gas, a $C_4F_8$ gas, a $CF_4$ gas, a $SF_6$ gas, a $CHF_3$ gas, a $Cl_2$ gas, a $BCl_3$ gas, a $SiCl_4$ gas, and the like can be used alone or in combination. Alternatively, an oxygen gas, a helium gas, an argon gas, a hydrogen gas, or the like can be added to any of the above gases as appropriate. At this time, the resist mask 420 is eliminated by the etching. As a dry etching apparatus, the dry etching apparatus used for the first processing and the second processing can be used. Through the above steps, a hard mask including the conductor 417 and the insulator 419 is formed (see FIGS. 17(A), (B), and (C)).

Note that the hard mask may be one layer formed only using the conductor 417. In that case, the third processing is performed after the formation of the resist mask 420 over the conductor 417 by a lithography method or the like. By the third processing, the resist mask 420 is eliminated by the etching. Alternatively, without the hard mask, only the resist mask 420 or a two-layer mask including the organic coating film and the resist mask 420 may be used.

Next, using a hard mask including the conductor 417 and the insulator 419 as the mask, fourth processing is performed on the insulator 410a by a dry etching method so that an opening portion is formed to reach top surfaces of the conductor 415 and the insulator 402. As a dry etching gas used in the fourth processing, a gas similar to that used in the second processing can be used. Furthermore, as a dry etching apparatus, a dry etching apparatus similar to that used in the first processing, the second processing, and the third processing can be used.

In the fourth processing, the insulator 419 is the outermost surface of the hard mask including the conductor 417 and the insulator 419; thus, the insulator 410a and the insulator 419 are etched at the same time. In the case where the insulator 410a and the insulator 419 are insulators including the same element, reaction with etching species in plasma and a reaction product are uniform regardless of place. Accordingly, variation in etching rate between different locations can be reduced, and thus processing variation can be minimized. That is, high-precision processing can be performed.

In the fourth processing, by making the ratio of the etching rate of the insulator 410a to the etching rate of the conductor 417 high, the etching of the conductor 417 as the hard mask is minimized and the change in the shape can be prevented. Thus, processing precision of the insulator 410a can be increased. As the ratio of the etching rates of the insulator 410a to the conductor 417, the etching rate of the conductor 417 is set to 1, and the etching rate of the insulator 410a is set to 5 or more, preferably 10 or more.

The cross-section shape of the insulator 410 processed by the above method is perpendicular to the substrate 400; thus, variation in a length of an opening portion of the insulator 410 (an opening size 403w) is unlikely to be affected by the variation in the thickness of the insulator 410.

Furthermore, it is desirable that the insulator 419 have the same thickness as the insulator 410 or be thinner than the insulator 410. The insulator 419 that is the outermost surface of the hard mask is etched and eliminated in the fourth processing, so that the conductor 417 becomes the outermost surface of the hard mask in fifth processing (see FIGS. 18(A), (B), (C)).

Next, using the conductor 417 as a mask, the conductor 415 is subjected to fifth processing using dry etching or the like so as to be separated into the conductor 416a1 and the conductor 416a2. As a gas for the dry etching in the fifth processing, a gas used in the third processing is used. Furthermore, as a dry etching apparatus, an apparatus similar to that used in the first processing, the second processing, the third processing, and the fourth processing can be used.

In the fifth processing, the conductor 417 is the outermost surface of the hard mask; thus, the conductor 417 and the conductor 415 are etched at the same time, and the conductor 417 is eliminated. In the case where the conductor 417 and the conductor 415 are conductors including the same element, reaction with etching species in plasma and a reaction product each are uniform regardless of place. Accordingly, variation in etching rate between different locations can be reduced, and thus processing variation can be minimized. That is, high-precision processing can be performed. Variation in lengths Variation between the conductor 416a1 and the conductor 416a2 (a distance 404w) can be small, which is favorable. FIG. 19(B) shows an example where the cross-sectional shapes of the conductor 416a1 and the conductor 416a2 are perpendicular to the substrate 400; however, the cross-sectional shapes of the conductor 416a1 and the conductor 416a2 may each have a tapered shape.

Furthermore, it is desirable that the conductor 417 have the same thickness as the conductor 415 or be thinner than the conductor 415. The conductor 417 serving as the hard mask during the fifth processing is etched and can be eliminated.

Alternatively, the conductor 417 is not necessarily eliminated during the fifth processing. In this case, the thickness of the conductor 417 is made larger than the thickness of the conductor 415. By increasing the thickness of the conductor 417, the deformation of the conductor 417 serving as a hard mask during the fifth processing can be prevented, and thus, the deformation such as an increase in the width of an upper portion of the opening portion in the insulator 410 can be prevented in some cases.

The conductor 416a1, the conductor 416a2 function as a source electrode and a drain electrode of the transistor; thus, the distance 404w can be referred to as a channel length of the transistor. Thus, by reducing variation in the distance 404w, variation in operation of the transistor can be reduced, which is preferable.

Next, plasma treatment using an oxygen gas may be performed. When the first processing, the second processing, the third processing, the fourth processing, and the fifth processing are performed, an impurity such as residual components of the etching gas is attached to an exposed region of the semiconductor 406b in some cases. For example, when a chlorine-based gas is used as an etching gas, chlorine and the like are attached in some cases. Furthermore, when a hydrocarbon-based gas is used as an etching gas, carbon, hydrogen, and the like are attached in some cases. When the substrate is exposed to air after the fifth processing, the exposed region of the semiconductor 406b and the like corrode in some cases. Thus, plasma treatment using an oxygen gas is preferably performed successively after the fifth processing and corrosion of the exposed region of the semiconductor 406b and the like can be prevented. Furthermore, the organic substance on the side surface of the insulator 410 can be removed by the plasma treatment using an oxygen gas. The plasma treatment using an oxygen gas can be performed using a dry etching apparatus similar to that used in the first processing, the second processing, the third processing, the fourth processing, and the fifth processing.

Note that the impurity may be reduced by cleaning treatment using diluted hydrofluoric acid or the like or cleaning treatment using ozone or the like, for example. Note that a plurality of types of cleaning treatments may be used in combination. In such a manner, the exposed region of the semiconductor 406b, that is, a channel formation region has high resistance.

Meanwhile, in the region 407 where the conductor 416a1 and the conductor 416a2 and the top surface of the semiconductor 406b overlap with each other, a value of contact resistance between the conductor 416a1 and the conductor 416a2 and the semiconductor 406b is preferably decreased; thus, favorable transistor characteristics can be obtained.

The same dry etching apparatus is used in the first processing, the second processing, the third processing, the fourth processing, and the fifth processing, and the plasma treatment using an oxygen gas; thus, the first to fifth processing and the plasma treatment can be successively performed without exposure to air. Therefore, contamination due to attachment of an atmospheric component, corrosion of the insulator, the semiconductor, and the conductor due to reaction between the remaining etching gas and the atmospheric component, and the like can be prevented. By successively performing the first processing, the second processing, the third processing, the fourth processing, and the fifth processing, and the plasma treatment using an oxygen gas, improvement in productivity can be expected.

The insulator 410, the conductor 416a1, and the conductor 416a2 are processed by the manufacturing method described above, so that variation in the channel length can be reduced and processing precision can be increased (see FIGS. 19(A), (B), and (C)).

Next, an insulator 406c_1 is formed. The insulator 406c_1 can be formed by a sputtering method, a CVD method, an MBE method, a PLD method, an ALD method, or the like.

The insulator 406c_1 is efficiently formed along a bottom surface of the opening portion formed in the insulator 410, the conductor 416a1, and the conductor 416a2. Therefore, the insulator 406c_1 is formed with a sputtering apparatus including a collimator in some cases. By including the collimator, the incident direction of the sputtered particle can be approximately perpendicular to the substrate and thus the insulator 406c_1 can be efficiently formed along the bottom surface of the opening portion. Alternatively, a long throw sputtering method can also be used. In the long throw sputtering method, the range distance of the sputtered particle is set large, whereby the incident direction of the sputtered particle can be approximately perpendicular to the substrate. Alternatively, the insulator 406c_1 may be formed by combining the collimator and the long throw sputtering method.

Next, an insulator 412a is formed over the insulator 406c_1. The insulator 412a can be formed by a sputtering method, a CVD method, an MBE method, a PLD method, an ALD method, or the like. The insulator 412a is formed to have a uniform thickness along side surfaces and a bottom surface of the opening portion formed in the insulator 410, the conductor 416a1, and the conductor 416a2. Therefore, an ALD method is preferably used.

Although not illustrated here, an oxide film of the element included in the conductor 416a1 and the conductor 416a2 is formed on the side surface and the top surface of the conductor 416a1 and the conductor 416a2 when the insulator 406c1 is formed and the insulator 412a is formed in some cases (see FIGS. 20(A), (B), and (C)).

Next, the conductor 404a is formed. The conductor 404a can be formed by a sputtering method, a CVD method, an MBE method, a PLD method, an ALD method, or the like. The conductor 404a is formed so as to fill the opening portion formed in the insulator 410 and the like. Therefore, a CVD method (in particular, an MCVD method) is preferably used. The conductor 404a is preferably a multilayer film of the conductor formed by an ALD method or the like and the conductor formed by an MCVD method in some cases to increase adhesion between the insulator 412a and the conductor 404a which is formed by an MCVD method. For example, a multilayer film of titanium nitride formed by an ALD method and tungsten formed by an MCVD method is used (see FIGS. 21(A), (B), and (C)).

Then, the conductor 404a, the insulator 412a, the insulator 406c_1, and the conductor 417 are polished and planarized by CMP or the like from the top surface of the conductor 404a to the top surface of the insulator 410. Accordingly, the conductor 404, the insulator 412, and the insulator 406c are formed. The conductor 404 functioning as the gate electrode can be formed in a self-aligned manner without using a lithography method. The conductor 404 functioning as the gate electrode can be formed without considering alignment accuracy of the conductor 404 functioning as the gate electrode and the conductor 416a1 and the conductor 416a2 functioning as the source electrode and the drain electrode; as a result, the area of the semiconductor device can be reduced. Furthermore, because the lithography process is not necessary, an improvement in productivity due to simplification of the process is expected (see FIGS. 22(A), (B), and (C)).

Then, the insulator 418 is formed over the insulator 410, the insulator 412, the conductor 404, and the insulator 406c. The insulator 418 can be formed by a sputtering method, a CVD method, an MBE method, a PLD method, an ALD method, or the like. Then, the insulator 408 is formed over the insulator 418. The insulator 408 can be formed by a sputtering method, a CVD method, an MBE method, a PLD method, an ALD method, or the like. An aluminum oxide is preferably formed as the insulator 408 using plasma containing oxygen, so that oxygen in the plasma can be added to the top surface of the insulator 418 as excess oxygen.

Second heat treatment may be performed at any time after the formation of the insulator to be the insulator 408. By the second heat treatment, the excess oxygen contained in the insulator 418 is moved to the semiconductor 406b through the insulator 410, the insulator 402, and the insulator 406a. Furthermore, the excess oxygen contained in the insulator 418 is moved to the semiconductor 406b through the insulator 412 and the insulator 406c. Since excess oxygen is moved to the semiconductor 406b by passing two paths as described above, defects (oxygen vacancies) in the semiconductor 406b can be reduced.

Note that the second heat treatment may be performed at a temperature such that excess oxygen (oxygen) in the insulator 418 is diffused to the semiconductor 406b. For example, the description of the first heat treatment may be referred to for the second heat treatment. Furthermore, the second heat treatment is preferably performed at a temperature lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of excess oxygen (oxygen) from the insulator 402 can be inhibited. Note that in the case where heating at the time of formation of the layers doubles as the second heat treatment, the second heat treatment is not necessarily performed.

Next, the insulator 428 is formed over the insulator 408. The insulator 428 can be formed by a sputtering method, a CVD method, an MBE method, a PLD method, an ALD method, or the like (see FIGS. 23(A), (B), (C)).

Next, an opening portion reaching the conductor 416a1 and the conductor 416a2 through the insulator 428, the insulator 408, the insulator 418, and the insulator 410, and an opening portion reaching the conductor 404 through the insulator 428, the insulator 408, and the insulator 418 are formed. Then, the conductor 431, the conductor 429, and the conductor 437 are embedded in their respective opening portions (see FIGS. 24(A), (B), and (C)).

Next, a conductor is formed over the insulator 428, the conductor 431, the conductor 429, and the conductor 437, and partly etched by a lithography method, whereby the conductor 432, the conductor 430, and the conductor 438 are formed. Through the above steps, the transistor in FIG. 1 can be formed (see FIGS. 25(A), (B), and (C)).

Note that as described above, when the insulator 410a is processed, the fourth processing is performed by dry etching method until the insulator 410a reaches the insulator 402, whereby the insulator 410 is formed. At that time, the insulator 402 is etched in some cases until the insulator 401 is reached; however, an example of the transistor in that case has a structure shown in FIGS. 26(A), (B), and (C). At least part of this embodiment can be implemented in combination with any of the other embodiments described in this specification as appropriate.

Embodiment 4

<Memory Device 1>

An example of a semiconductor device (memory device) which includes the transistor of one embodiment of the present invention, which can retain stored data even when electric power is not supplied, and which has an unlimited number of write cycles is shown in FIG. 27.

Figure 27A:
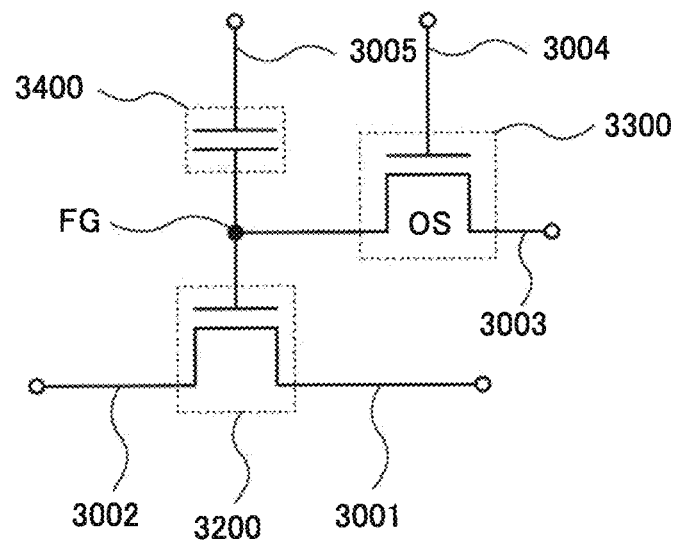
FIGS. 27A and 27B are circuit diagrams each illustrating a memory device of one embodiment of the present invention.

The semiconductor device illustrated in FIG. 27(A) includes a transistor 3200 using a first semiconductor, a transistor 3300 using a second semiconductor, and a capacitor 3400. Note that any of the above-described transistors can be used as the transistor 3300.

The transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 27(A), a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to one electrode of the capacitor 3400. A fifth wiring 3005 is electrically connected to the other electrode of the capacitor 3400.

The semiconductor device in FIG. 27(A) has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one terminal of the capacitor 3400 are electrically connected to each other. That is, a predetermined electric charge is supplied to the gate of the transistor 3200 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is V₀ (>$V_{th\_H}$), the transistor 3200 is brought into "on state." In the case where the low-level electric charge is supplied to the node FG in writing, even when the potential of the fifth wiring 3005 is V₀ (<$V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read at the time of reading. For example, The fifth wiring 3005 of memory cells from which data is not read may be supplied with a potential at which the transistor 3200 is "turned off" regardless of the electric charge supplied to the node FG, that is, a potential lower than $V_{th\_H}$, whereby only data of a desired memory cell can be read. Alternatively, the fifth wiring 3005 of the memory cells from which data is not read may be supplied with a potential at which the transistor 3200 is brought into "on state" regardless of the electric charge supplied to the node FG, that is, a potential higher than $V_{th\_L}$, whereby only data of a desired memory cell can be read.

<Structure 1 of Semiconductor Device>

Figure 28:
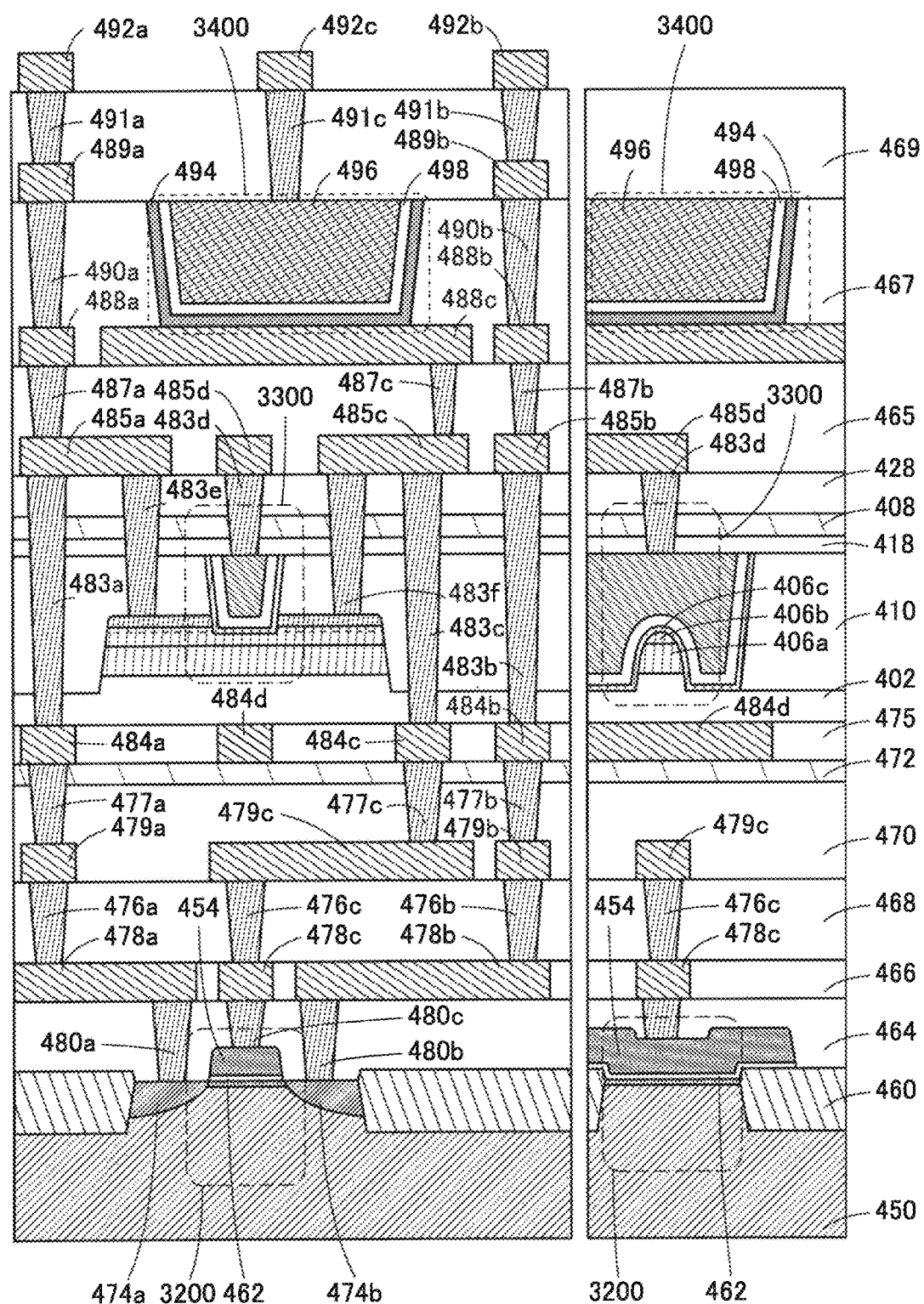
FIG. 28 is a cross-sectional view illustrating a semiconductor device of one embodiment of the present invention.

FIG. 28 is a cross-sectional view of the semiconductor device in FIG. 27(A). The semiconductor device shown in FIG. 28 includes the transistor 3200, the transistor 3300, and the capacitor 3400. Furthermore, the transistor 3300 and the capacitor 3400 are provided in the upper portion of the transistor 3200. Note that although an example where the transistor illustrated in FIG. 1 is used as the transistor 3300 is shown, a semiconductor device of one embodiment of the present invention is not limited thereto. Thus, the description of the above transistor is referred to.

Furthermore, the transistor 3200 illustrated in FIG. 28 is a transistor using a semiconductor substrate 450. The transistor 3200 includes a region 474a in the semiconductor substrate 450, a region 474b in the semiconductor substrate 450, an insulator 462, and a conductor 454.

In the transistor 3200, the region 474a and the region 474b have a function as a source region and a drain region. Furthermore, the insulator 462 has a function as a gate insulator. Furthermore, the conductor 454 has a function as a gate electrode. Therefore, resistance of a channel formation region can be controlled by a potential applied to the conductor 454. In other words, conduction or non-conduction between the region 474a and the region 474b can be controlled by the potential applied to the conductor 454.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 3200 is formed. Alternatively, the semiconductor substrate 450 may be an i-type semiconductor substrate.

The top surface of the semiconductor substrate 450 preferably has a (110) plane. Thus, on-state characteristics of the transistor 3200 can be improved.

The region 474a and the region 474b are regions including impurities imparting the p-type conductivity. Accordingly, the transistor 3200 has a structure of a p-channel transistor.

Although the transistor 3200 is illustrated as a p-channel transistor, the transistor 3200 may be an n-channel transistor.

Note that the transistor 3200 is separated from an adjacent transistor by a region 460 and the like. The region 460 is an insulating region.

The semiconductor device illustrated in FIG. 28 includes an insulator 464, an insulator 466, an insulator 468, an insulator 470, an insulator 472, an insulator 475, the insulator 402, the insulator 410, the insulator 418, the insulator 408, an insulator 428, an insulator 465, an insulator 467, an insulator 469, an insulator 498, a conductor 480a, a conductor 480b, a conductor 480c, a conductor 478a, a conductor 478b, a conductor 478c, a conductor 476a, a conductor 476b, a conductor 476c, a conductor 479a, a conductor 479b, a conductor 479c, a conductor 477a, a conductor 477b, a conductor 477c, a conductor 484a, a conductor 484b, a conductor 484c, a conductor 484d, a conductor 483a, a conductor 483b, a conductor 483c, a conductor 483d, a conductor 483e, a conductor 483f, a conductor 485a, a conductor 485b, a conductor 485c, a conductor 485d, a conductor 487a, a conductor 487b, a conductor 487c, a conductor 488a, a conductor 488b, a conductor 488c, a conductor 490a, a conductor 490b, a conductor 489a, a conductor 489b, a conductor 491a, a conductor 491b, a conductor 491c, a conductor 492a, a conductor 492b, a conductor 492c, a conductor 494, a conductor 496, the insulator 406a, the semiconductor 406b, and the insulator 406c.

The insulator 464 is provided over the transistor 3200. Furthermore, the insulator 466 is placed over the insulator 464. Furthermore, the insulator 468 is placed over the insulator 466. Furthermore, the insulator 470 is over the insulator 468. Furthermore, the insulator 472 is over the insulator 470. Furthermore, the insulator 475 is over the insulator 472. Furthermore, the transistor 3300 is over the insulator 475. Furthermore, the insulator 418 is over the transistor 3300. Furthermore, the insulator 408 is over the insulator 418. Furthermore, the insulator 428 is over the insulator 408. Furthermore, the insulator 465 is over the insulator 428. Furthermore, the capacitor 3400 is over the insulator 465. Furthermore, the insulator 469 is over the capacitor 3400.

The insulator 464 includes an opening portion reaching the region 474a, an opening portion reaching the region 474b, and an opening portion reaching the conductor 454. Furthermore, in the respective opening portions, the conductor 480a, the conductor 480b, and the conductor 480c are embedded.

In addition, the insulator 466 includes an opening portion reaching the conductor 480a, an opening portion reaching the conductor 480b, and an opening portion reaching the conductor 480c. Furthermore, in the respective opening portions, the conductor 478a, the conductor 478b, and the conductor 478c are embedded.

In addition, the insulator 468 includes an opening portion reaching the conductor 478a, an opening portion reaching the conductor 478b, and an opening portion reaching the conductor 478c. Furthermore, in the respective opening portions, the conductor 476a, the conductor 476b, and the conductor 476c are embedded.

Furthermore, the conductor 479a in contact with the conductor 476a, the conductor 479b in contact with the conductor 476b, and the conductor 479c in contact with the conductor 476c are over the insulator 468. Furthermore, the insulator 472 includes an opening portion reaching the conductor 479a through the insulator 470, an opening portion reaching the conductor 479b through the insulator 470, and an opening portion reaching the conductor 479c through the insulator 470. Furthermore, in the respective opening portions, the conductor 477a, the conductor 477b, and the conductor 477c are embedded.

Furthermore, the insulator 475 includes an opening portion overlapping with the channel formation region of the transistor 3300, an opening portion reaching the conductor 477a, an opening portion reaching the conductor 477b, and an opening portion reaching the conductor 477c. Furthermore, in the respective opening portions, the conductor 484a, the conductor 484b, the conductor 484c, and the conductor 484d are embedded.

Furthermore, the conductor 484d may have a function as a bottom gate electrode of the transistor 3300. Alternatively, for example, electric characteristics such as the threshold voltage of the transistor 3300 may be controlled by application of a constant potential to the conductor 484d. Further alternatively, for example, the conductor 484d and the top gate electrode of the transistor 3300 may be electrically connected to each other. Thus, the on-state current of the transistor 3300 can be increased. A punch-through phenomenon can be suppressed; thus, stable electric characteristics in the saturation region of the transistor 3300 can be obtained.

In addition, the insulator 402 includes an opening portion reaching the conductor 484a, an opening portion reaching the conductor 484b, and an opening portion reaching the conductor 484b.

Furthermore, the insulator 428 includes three opening portions reaching the conductor 484a, the conductor 484b, and the conductor 484c through the insulator 408, the insulator 418, the insulator 410, and the insulator 402, two opening portions reaching a conductor of one of the source electrode and the drain electrode of the transistor 3300 through the insulator 408, the insulator 418, and the insulator 410, and an opening portion reaching a conductor of the gate electrode of the transistor 3300 through the insulator 408 and the insulator 418. In the respective opening portions, the conductor 483a, the conductor 483b, the conductor 483c, the conductor 483e, the conductor 483f, and the conductor 483d are embedded.

Furthermore, the conductor 485a in contact with the conductors 483a and 483e, the conductor 485b in contact with the conductor 483b, the conductor 485c in contact with the conductor 483c and the conductor 483f, and the conductor 485d in contact with the conductor 483d are over the insulator 428. Furthermore, the insulator 465 has an opening portion reaching the conductor 485a, an opening portion reaching the conductor 485b, and an opening portion reaching the conductor 485c. Furthermore, in the respective opening portions, the conductor 487a, the conductor 487b, and the conductor 487c are embedded.

Furthermore, the conductor 488a in contact with the conductor 487a, the conductor 488b in contact with the conductor 487b, and the conductor 488c in contact with the conductor 487c are over the insulator 465. In addition, the insulator 467 includes an opening portion reaching the conductor 488a and an opening portion reaching the conductor 488b. Furthermore, in the opening portions, the conductor 490a and the conductor 490b are embedded. Furthermore, the conductor 488c is in contact with the conductor 494 which is one of the electrodes of the capacitor 3400.

Furthermore, the conductor 489a in contact with the conductor 490a and the conductor 489b in contact with the conductor 490b are over the insulator 467. Furthermore, the insulator 469 includes an opening portion reaching the conductor 489a, an opening portion reaching the conductor 489b, an opening portion reaching the conductor 496 which is the other of electrodes of the capacitor 3400. Furthermore, in the opening portions, the conductor 491a, the conductor 491b, and the conductor 491c are embedded.

Furthermore, the conductor 492a in contact with the conductor 491a, the conductor 492b in contact with the conductor 491b, and the conductor 492c in contact with the conductor 491c are over the insulator 469.

The insulator 464, the insulator 466, the insulator 468, the insulator 470, the insulator 472, the insulator 475, the insulator 402, the insulator 410, the insulator 408, the insulator 428, the insulator 465, the insulator 467, the insulator 469, and the insulator 498 may each be formed of a single layer or a stack of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 401 may be formed of, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator that has a function of blocking oxygen and impurities such as hydrogen is preferably included in at least one of the insulator 464, the insulator 466, the insulator 468, the insulator 470, the insulator 472, the insulator 475, the insulator 402, the insulator 410, the insulator 408, the insulator 428, the insulator 465, the insulator 467, the insulator 469, and the insulator 498. When an insulator that has a function of blocking oxygen and impurities such as hydrogen is placed near the transistor 3300, the electric characteristics of the transistor 3300 can be stable.

An insulator with a function of blocking oxygen and impurities such as hydrogen may be formed of a single layer or a stack of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

Each of the conductor 480a, the conductor 480b, the conductor 480c, the conductor 478a, the conductor 478b, the conductor 478c, the conductor 476a, the conductor 476b, the conductor 476c, the conductor 479a, the conductor 479b, the conductor 479c, the conductor 477a, the conductor 477b, the conductor 477c, the conductor 484a, the conductor 484b, the conductor 484c, the conductor 484d, the conductor 483a, the conductor 483b, the conductor 483c, the conductor 483d, the conductor 483e, the conductor 483f, the conductor 485a, the conductor 485b, the conductor 485c, the conductor 485d, the conductor 487a, the conductor 487b, the conductor 487c, the conductor 488a, the conductor 488b, the conductor 488c, the conductor 490a, the conductor 490b, the conductor 489a, the conductor 489b, the conductor 491a, the conductor 491b, the conductor 491c, the conductor 492a, the conductor 492b, the conductor 492c, the conductor 494, and the conductor 496 may be formed of a single layer or a stack of a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

An oxide semiconductor is preferably used as the semiconductor 406b. However, silicon (including strained silicon), germanium, silicon germanium, silicon carbide, gallium arsenide, aluminum gallium arsenide, indium phosphide, gallium nitride, an organic semiconductor, or the like can be used in some cases.

As the insulator 406a and the insulator 406c, oxides containing one or more elements other than oxygen included in the semiconductor 406b are preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

The source or drain of the transistor 3200 is electrically connected to the conductor that is one of the source electrode and the drain electrode of the transistor 3300 through the conductor 480a, the conductor 478a, the conductor 476a, the conductor 479a, the conductor 477a, the conductor 484a, the conductor 483a, the conductor 485a, and the conductor 483e. Furthermore, the conductor 454 that is the gate electrode of the transistor 3200 is electrically connected to the conductor that is the other of the source electrode and the drain electrode of the transistor 3300 through the conductor 480c, the conductor 478c, the conductor 476c, the conductor 479c, the conductor 477c, the conductor 484c, the conductor 483c, the conductor 485c, and the conductor 483f.

The capacitor 3400 includes the conductor 494 which is one electrode of the capacitor 3400, the insulator 498, and the conductor 496 which is the other electrode of the capacitor 3400. The capacitor 3400 is electrically connected to one electrode of the source electrode and the drain electrode of the transistor 3300 through the conductor 483f, the conductor 485c, the conductor 487c, and the conductor 488c. Note that the capacitor 3400 is preferably formed above or below the transistor 3300, in which case the semiconductor device can be reduced in size.

For the structures of other components, the description of FIG. 1 and the like can be referred to as appropriate.

Figure 29:
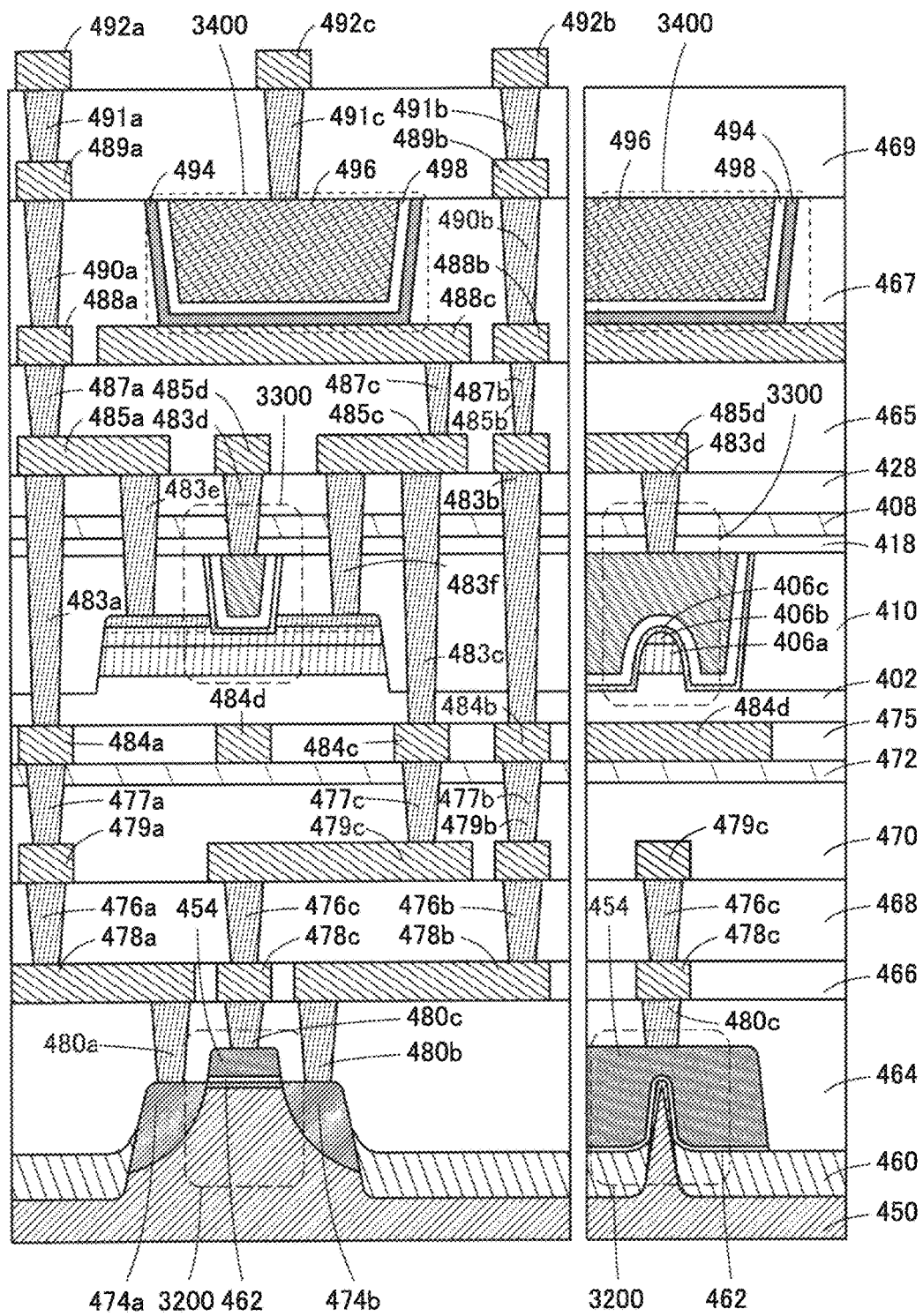
FIG. 29 is a cross-sectional view illustrating a semiconductor device of one embodiment of the present invention.

Note that a semiconductor device in FIG. 29 is the same as the semiconductor device in FIG. 28 except the structure of the transistor 3200. Therefore, the description of the semiconductor device in FIG. 28 is referred to for the semiconductor device in FIG. 29. Specifically, in the semiconductor device in FIG. 29, the transistor 3200 is a Fin-type transistor in some cases. The effective channel width is increased in the Fin-type transistor 3200, whereby the on-state characteristics of the transistor 3200 can be improved. In addition, since contribution of the electric field of the gate electrode can be increased, the off-state characteristics of the transistor 3200 can be improved. Note that the transistor 3200 may be a p-channel transistor or an n-channel transistor.

Although an example of a semiconductor device in which the transistor 3300 is over the transistor 3200 and the capacitor 3400 is over the transistor 3300 is illustrated in this embodiment, one or more transistors including a semiconductor similar to the transistor 3300 may be provided over the transistor 3200. With such a structure, the degree of integration of the semiconductor device can be further increased.

<Memory Device 2>

Figure 27B:
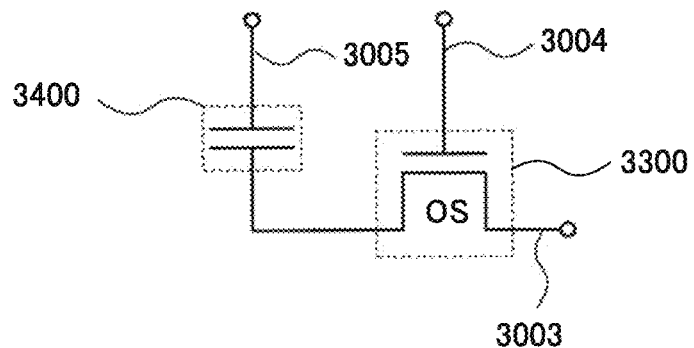

The semiconductor device in FIG. 27(B) is different from the semiconductor device in FIG. 27(A) in that the transistor 3200 is not provided. Also in this case, data can be written and retained in a manner similar to that of the semiconductor device in FIG. 27(A).

Reading of data in the semiconductor device in FIG. 27(B) is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one of the electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1 (=(C_B \times V_{B0} + C \times V_1)/(C_B + C))$ is higher than the potential of the third wiring 3003 in the case of retaining the potential $V_0 (=(C_B \times V_{B0} + C \times V_0)/(C_B + C))$.

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, refresh operation becomes unnecessary or the frequency of the refresh operation can be extremely low; thus, a semiconductor device with low power consumption can be achieved. Moreover, stored data can be retained for a long time even when power is not supplied (note that a potential is preferably fixed).

Furthermore, in the semiconductor device, high voltage is not needed for writing data and deterioration of elements is less likely to occur. Unlike in a conventional nonvolatile memory, for example, injecting and extracting electrons into and from a floating gate are not performed; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be easily achieved. At least part of this embodiment can be implemented in combination with any of the embodiments described in this specification as appropriate.

Embodiment 5

<Structure 2 of Semiconductor Device>

In this embodiment, an example of a circuit including the transistor of one embodiment of the present invention is described with reference to drawings.

<Cross-Sectional Structure>

Figure 30:
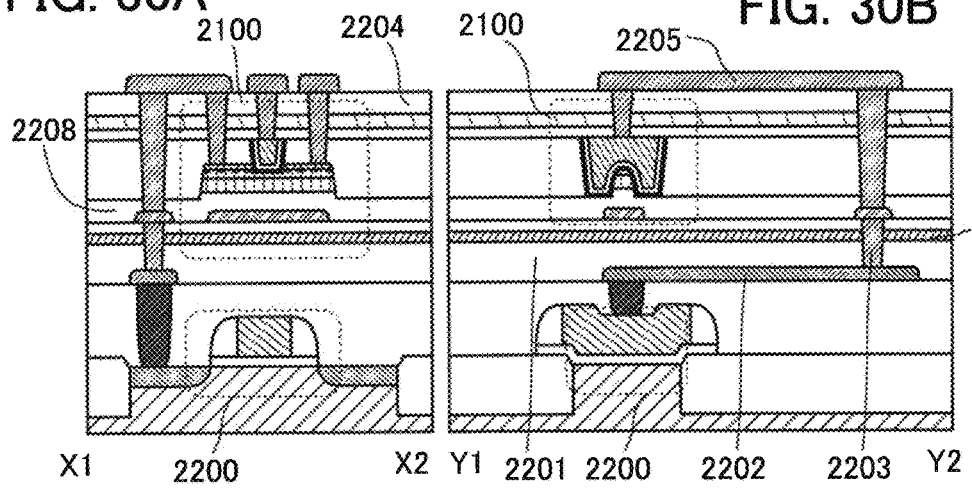
FIGS. 30A-30F are circuit diagrams and cross-sectional views illustrating a semiconductor device of one embodiment of the present invention.

FIGS. 30(A) and (B) are cross-sectional views of a semiconductor device of one embodiment of the present invention. In FIG. 30(A), X1-X2 direction represents a channel length direction, and in FIG. 30(B), Y1-Y2 direction represents a channel width direction. The semiconductor device illustrated in FIGS. 30(A) and (B) includes a transistor 2200 containing a first semiconductor material in a lower portion and a transistor 2100 containing a second semiconductor material in an upper portion. In FIGS. 30(A) and (B), an example is illustrated in which the transistor illustrated in FIG. 4 is used as the transistor 2100 containing the second semiconductor material.

The first semiconductor material and the second semiconductor material are preferably materials having different band gaps. For example, the first semiconductor material can be a semiconductor material (such as silicon (including strained silicon), germanium, silicon germanium, silicon carbide, gallium arsenide, aluminum gallium arsenide, indium phosphide, gallium nitride, and an organic semiconductor) other than an oxide semiconductor, and the second semiconductor material can be an oxide semiconductor. A transistor using a material other than an oxide semiconductor, such as single crystal silicon, can operate at high speed easily. In contrast, a transistor using an oxide semiconductor and described in the above embodiment as an example has excellent subthreshold characteristics and a minute structure. Furthermore, the transistor can operate at a high speed because of its high switching speed and has low leakage current because of its low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIGS. 30(A) and (B) illustrate a structure in which the transistor 2100 is provided over the transistor 2200 with an insulator 2201, an insulator 2207, and an insulator 2208 provided therebetween. Furthermore, a plurality of wirings 2202 are provided between the transistor 2200 and the transistor 2100. Furthermore, wirings and electrodes provided in an upper layer and a lower layer are electrically connected to each other through a plurality of plugs 2203 embedded in the insulators. Furthermore, an insulator 2204 covering the transistor 2100 and a wiring 2205 over the insulator 2204 are provided.

In this manner, the stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulator provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulator provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided in the upper portion of the transistor 2200 using a silicon-based semiconductor material, it is particularly effective that the insulator 2207 having a function of preventing diffusion of hydrogen is provided between the transistors 2100 and 2200. The insulator 2207 makes hydrogen remain in the lower portion, thereby improving the reliability of the transistor 2200. In addition, since the insulator 2207 suppresses diffusion of hydrogen from the lower portion to the upper portion, the reliability of the transistor 2100 also can be improved.

The insulator 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film having a function of preventing diffusion of hydrogen is preferably formed over the transistor 2100 to cover the transistor 2100 including an oxide semiconductor film. For the blocking film, a material that is similar to that of the insulator 2207 can be used, and in particular, an aluminum oxide is preferably used. Using the aluminum oxide film, excess oxygen can be added to the insulator of the lower portion in the deposition, and the excess oxygen moves to the oxide semiconductor layer of the transistor 2100 by heat treatment, which has an effect of repairing a defect in the oxide semiconductor layer. The aluminum oxide film has a high shielding (blocking) effect of preventing penetration of both oxygen and impurities such as hydrogen and moisture. Thus, by using the aluminum oxide film as the blocking film covering the transistor 2100, release of oxygen from the oxide semiconductor film included in the transistor 2100 and entry of water and hydrogen into the oxide semiconductor film can be prevented. Note that as the block film, the insulator 2204 which is stacked may be used, or the block film may be provided under the insulator 2204.

Note that the transistor 2200 can be a transistor of various types without being limited to a planar type transistor. For example, the transistor 2200 can be a FIN(fin)-type transistor, a TRI-GATE(tri-gate)-type transistor, or the like. An example of a cross-sectional view in this case is shown in FIGS. 30(E) and (F). An insulator 2212 is provided over a semiconductor substrate 2211. The semiconductor substrate 2211 includes a projecting portion with a thin tip (also referred to a fin). Note that an insulator may be provided over the projecting portion. The insulator functions as a mask for preventing the semiconductor substrate 2211 from being etched when the projecting portion is formed. Note that the projecting portion does not necessarily have the thin tip; a projecting portion with a cuboid-like projecting portion and a projecting portion with a thick tip are permitted, for example. A gate insulator 2214 is provided over the projecting portion of the semiconductor substrate 2211, and a gate electrode 2213 is provided over the gate insulator 2214. Source and drain regions 2215 are formed in the semiconductor substrate 2211. Note that here is shown an example in which the semiconductor substrate 2211 includes the projecting portion; however, a semiconductor device of one embodiment of the present invention is not limited thereto. For example, a semiconductor region having a projecting portion may be formed by processing an SOI substrate.

At least part of this embodiment can be implemented in combination with any of the embodiments described in this specification as appropriate.

Embodiment 6

[Cmos Circuit]

A circuit diagram in FIG. 30(C) shows a configuration of a so-called CMOS circuit in which a p-channel transistor 2200 and an n-channel transistor 2100 are connected to each other in series and in which gates of them are connected to each other.

[Analog Switch]

A circuit diagram in FIG. 30(D) shows a configuration in which sources of the transistor 2100 and the transistor 2200 are connected to each other and drains of the transistor 2100 and the transistor 2200 are connected to each other. With such a configuration, the transistors can function as a so-called analog switch. At least part of this embodiment can be implemented in combination with any of the embodiments described in this specification as appropriate.

Embodiment 7

<CPU>

A CPU including a semiconductor device such as any of the above-described transistors or the above-described memory device is described below.

Figure 31:
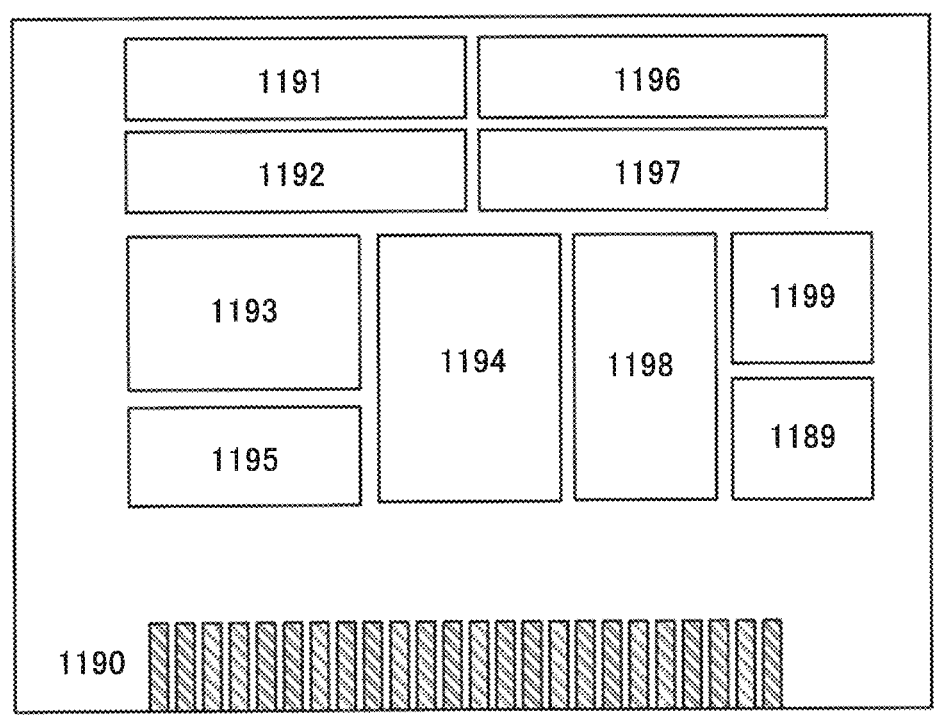
FIG. 31 is a block diagram illustrating a CPU of one embodiment of the present invention.

FIG. 31 is a block diagram illustrating a configuration example of a CPU including any of the above-described transistors as a component.

The CPU illustrated in FIG. 31 includes, over a substrate 1190, an ALU 1191 (ALU: Arithmetic logic unit, arithmetic circuit), an ALU controller 1192, an instruction decoder 1193, an interrupt controller 1194, a timing controller 1195, a register 1196, a register controller 1197, a bus interface 1198, a rewritable ROM 1199, and an ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 31 is just an example of a simplified structure, and an actual CPU may have a variety of structures depending on the application. For example, the CPU may have the following configuration: a structure including the CPU illustrated in FIG. 31 or an arithmetic circuit is considered as one core; a plurality of the cores are included; and the cores operate in parallel. Furthermore, the number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. Furthermore, while the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

In the CPU illustrated in FIG. 31, a memory cell is provided in the register 1196. For the memory cell of the register 1196, any of the above-described transistors, the above-described memory device, or the like can be used.

In the CPU illustrated in FIG. 31, the register controller 1197 selects operation of retaining data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of the power supply voltage to the memory cell in the register 1196 can be stopped.

Figure 32:
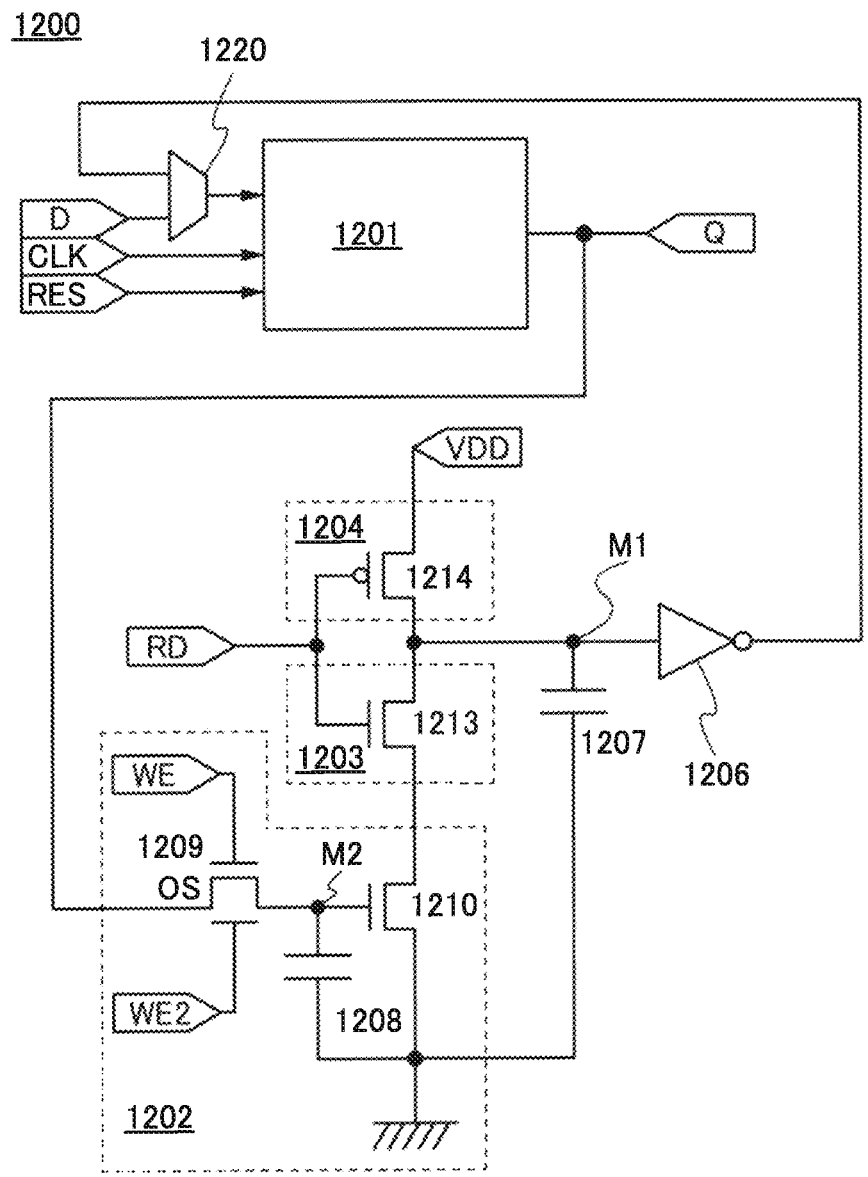
FIG. 32 is a circuit diagram of a memory element of one embodiment of the present invention.

FIG. 32 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (for example, an n-channel transistor) and the switch 1204 is a transistor 1214 having a conductivity type opposite to the one conductivity type (for example, a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (that is, the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (that is, the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring which can supply a low power supply potential (for example, a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (GND or the like) or a high power supply potential (VDD or the like). The other of the pair of electrodes of the capacitor 1207 is electrically connected to the wiring which can supply a low power supply potential (for example, a GND line). The other of the pair of electrodes of the capacitor 1208 can be supplied with a constant potential. For example, the other of the pair of electrodes of the capacitor 1207 can be supplied with a low power supply potential (GND or the like) or a high power supply potential (VDD or the like). The other of the pair of electrodes of the capacitor 1208 is electrically connected to the wiring which can supply a low power supply potential (for example, a GND line).

Note that the capacitor 1207 and the capacitor 1208 can be omitted when the parasitic capacitance of the transistor, the wiring, or the like is actively utilized.

A control signal WE is input to a first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 32 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

Note that in the example of FIG. 32, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

Furthermore, in FIG. 32, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer including a semiconductor other than an oxide semiconductor or the substrate 1190 can be used for the rest of the transistors.

As the circuit 1201 in FIG. 32, for example, a flip-flop circuit can be used. Furthermore, as the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

Furthermore, the off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Furthermore, since the memory element performs precharge operation with the switch 1203 and the switch 1204, the time required for the circuit 1201 to retain original data again after the supply of the power supply voltage is restarted can be shortened.

Furthermore, in the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although an example of using the memory element 1200 in a CPU is described, the memory element 1200 can also be used in an LSI such as a DSP (Digital Signal Processor), a custom LSI, or a PLD (Programmable Logic Device), and an RF-Tag (Radio Frequency Tag).

At least part of this embodiment can be implemented in combination with any of the other embodiments in this specification as appropriate.

Embodiment 8

<Imaging Device>

Figure 33A:
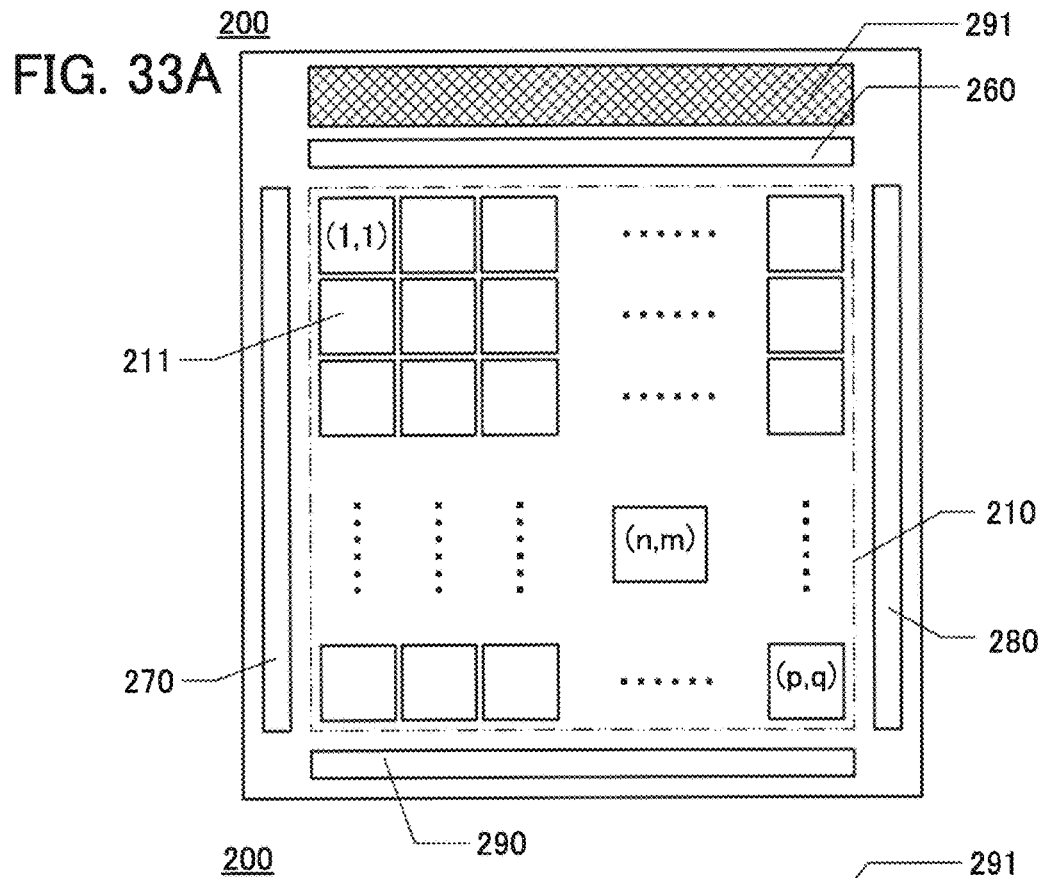
FIGS. 33A and 33B are plan views of an imaging device.

FIG. 33(A) is a top view illustrating an example of an imaging device 200 of one embodiment of the present invention. The imaging device 200 includes pixel portions 210, 260, 270, 280, and 290 for driving the pixel portion 210. The pixel portion 210 includes a plurality of pixels 211 arranged in a matrix with p rows and q columns (p and q are each a natural number greater than or equal to 2). The peripheral circuit 260, the peripheral circuit 270, the peripheral circuit 280, and the peripheral circuit 290 are each connected to a plurality of pixels 211, and each have a function of supplying a signal for driving the plurality of pixels 211. Note that in this specification, in some cases, "a peripheral circuit" or "a driver circuit" indicates all of the peripheral circuits 260, 270, 280, and 290. For example, the peripheral circuit 260 can be regarded as part of the peripheral circuit.

In addition, the imaging device 200 preferably includes a light source 291. The light source 291 can emit detection light P1.

Furthermore, the peripheral circuit includes at least one of a logic circuit, a switch, a buffer, an amplifier circuit, and a converter circuit. Furthermore, the peripheral circuit may be formed over a substrate where the pixel portion 210 is formed. Alternatively, a semiconductor device such as an IC chip may be used as part or the whole of the peripheral circuit. Note that as the peripheral circuit, one or more of the peripheral circuits 260, 270, 280, and 290 may be omitted.

Figure 33B:
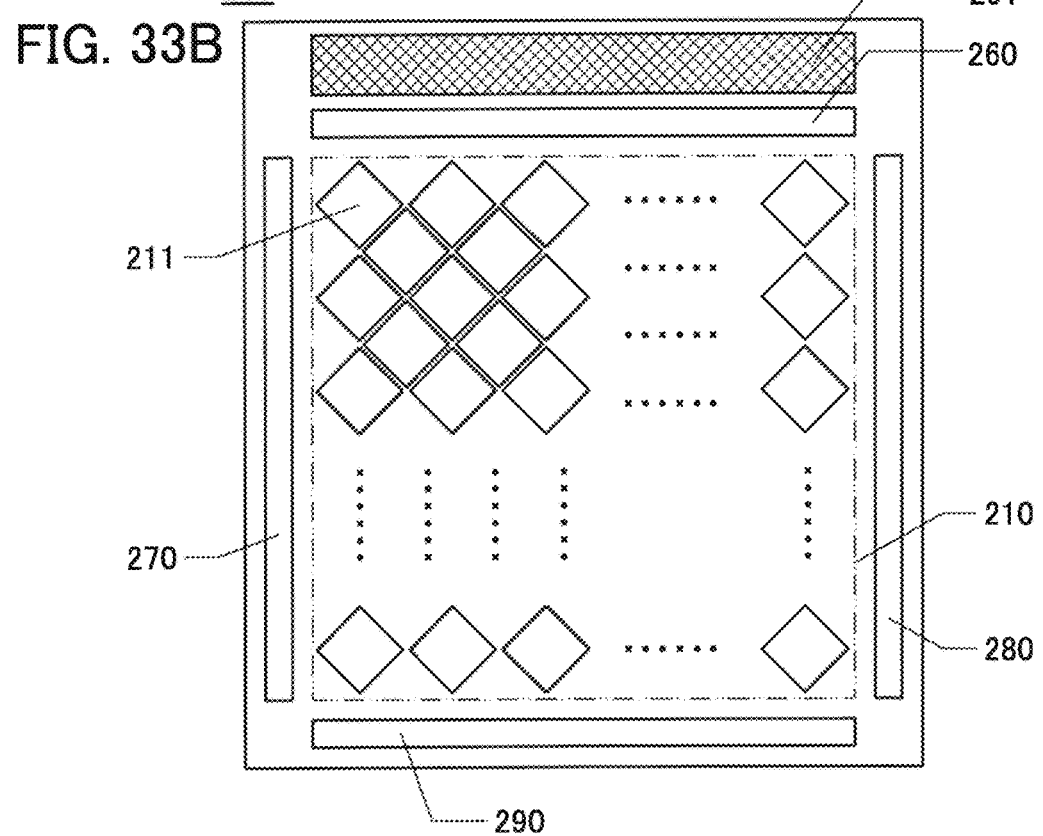

Furthermore, as illustrated in FIG. 33(B), the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter which transmits light with a specific wavelength band (color filter), whereby data for achieving color image display can be obtained.

Figure 34A:
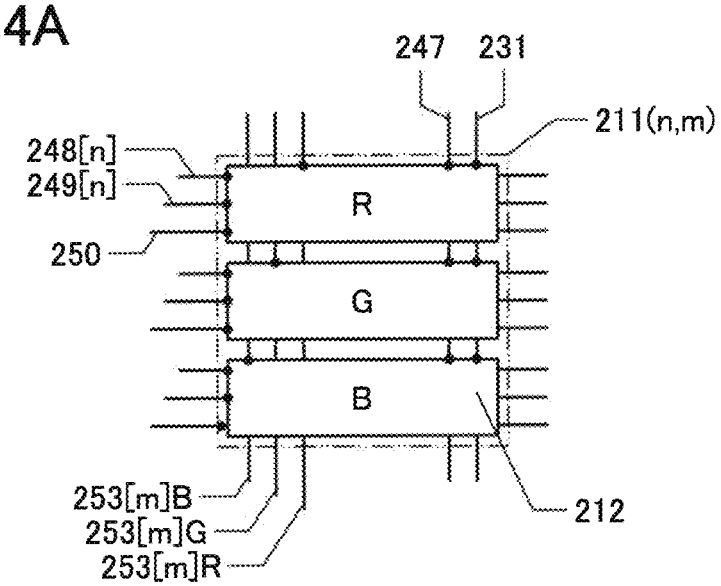
FIGS. 34A and 34B are plan views of pixels of an imaging device.

FIG. 34(A) is a top view showing an example of the pixel 211 with which a color image is obtained. The pixel 211 illustrated in FIG. 34(A) includes the subpixel 212 provided with a color filter that transmits light with a red (R) wavelength band (also referred to as a "subpixel 212R"), a subpixel 212 provided with a color filter that transmits light with a green (G) wavelength band (also referred to as a "subpixel 212G"), and a subpixel 212 provided with a color filter that transmits light with a blue (B) wavelength band (also referred to as a "subpixel 212B"). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independent from one another. Furthermore, in this specification and the like, for example, the wiring 248, the wiring 249, and the wiring 250 that are connected to the pixel 211 in the n-th row are referred to as a wiring 248[n], a wiring 249[n], and a wiring 250[n], respectively. Furthermore, for example, the wiring 253 connected to the pixel 211 in the m-th column is referred to as a wiring 253[m]. Note that in FIG. 34(A), the wiring 253 connected to the subpixel 212R is referred to as a wiring 253[m]R, the wiring 253 connected to the subpixel 212G is referred to as a wiring 253[m]G, and the wiring 253 connected to the subpixel 212B is referred to as a wiring 253[m]B. The subpixels 212 are electrically connected to the peripheral circuit through the above wirings.

Figure 34B:
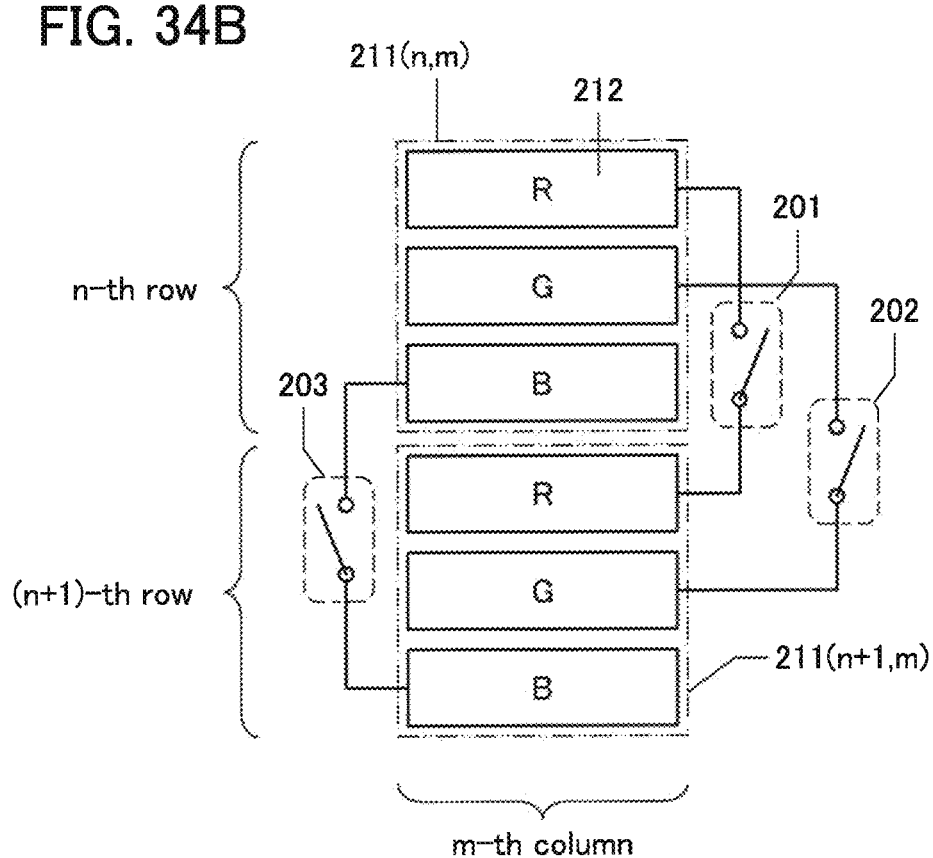

Furthermore, the imaging device 200 has a structure in which the subpixel 212 is electrically connected to the subpixel 212 in an adjacent pixel 211 which is provided with a color filter transmitting light with the same wavelength band as the subpixel 212, via a switch. FIG. 34(B) shows a connection example of the subpixels 212: the subpixel 212 in the pixel 211 arranged in an n-th row (n is an integer greater than or equal to 1 and less than or equal to p) and an m-th column (m is an integer greater than or equal to 1 and less than or equal to q) and the subpixel 212 in the adjacent pixel 211 arranged in an (n+1)-th row and the m-th column. In FIG. 34(B), the subpixel 212R arranged in the n-th row and the m-th column and the subpixel 212R arranged in the (n+1)-th row and the m-th column are connected to each other via a switch 201. Furthermore, the subpixel 212G arranged in the n-th row and the m-th column and the subpixel 212G arranged in the (n+1)-th row and the m-th column are connected to each other via a switch 202. Furthermore, the subpixel 212B arranged in the n-th row and the m-th column and the subpixel 212B arranged in the (n+1)-th row and the m-th column are connected to each other via a switch 203.

Note that the color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

Furthermore, the pixel 211 including the subpixel 212 provided with a color filter transmitting yellow (Y) light may be provided, in addition to the subpixels 212 provided with the color filters transmitting red (R), green (G), and blue (B) light. Furthermore, the pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light with four different wavelength bands are provided in one pixel 211, the reproducibility of colors of an obtained image can be increased.

Furthermore, for example, in FIG. 34(A), in regard to the subpixel 212 sensing light in a red wavelength band, the subpixel 212 sensing light in a green wavelength band, and the subpixel 212 sensing light in a blue wavelength band, the pixel number ratio (or the light receiving area ratio) thereof is not necessarily 1:1:1. For example, it is possible to employ the Bayer arrangement, in which the ratio of the number of pixels (the ratio of light-receiving areas) is set to red:green:blue=1:2:1. Alternatively, the pixel number ratio (the ratio of light receiving area) may be set to red:green:blue=1:6:1.

Note that although the number of subpixels 212 provided in the pixel 211 may be one, two or more subpixels are preferably provided. For example, when two or more subpixels 212 sensing light in the same wavelength range are provided, the redundancy is increased, and the reliability of the imaging device 200 can be increased.

When an IR (IR: Infrared) filter that transmits infrared light and absorbs or reflects visible light is used as the filter, the imaging device 200 that senses infrared light can be achieved.

Furthermore, when an ND (ND: Neutral Density) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Figure 35A:
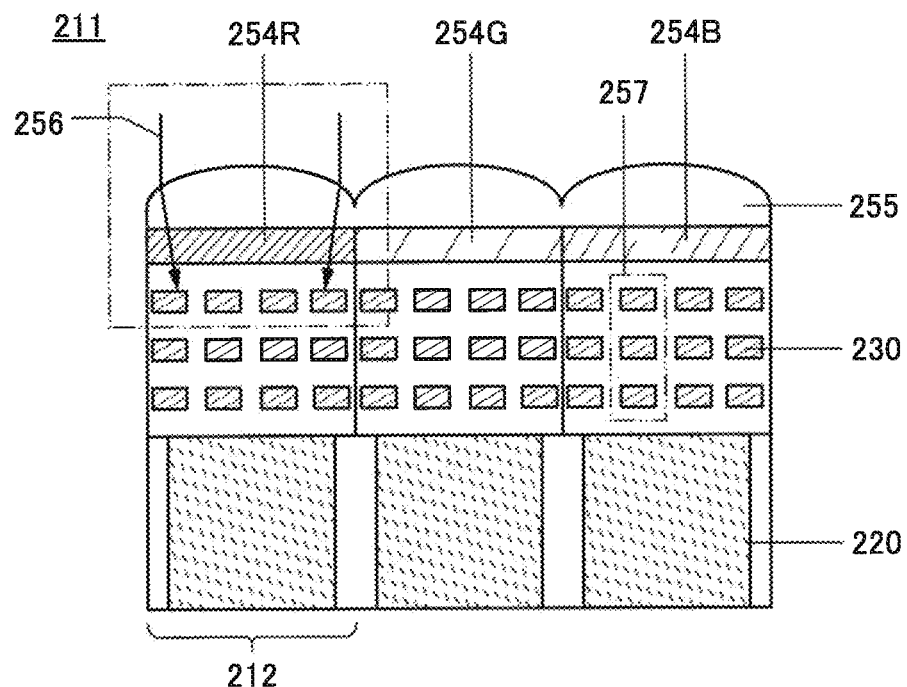
FIGS. 35A and 35B are cross-sectional views of an imaging device.

Furthermore, besides the above-described filter, the pixel 211 may be provided with a lens. Here, an arrangement example of the pixel 211, a filter 254, and a lens 255 is described with cross-sectional views in FIG. 35. With the lens 255, the photoelectric conversion element can receive incident light efficiently. Specifically, as illustrated in FIG. 35(A), light 256 enters a photoelectric conversion element 220 through the lens 255, the filter 254 (a filter 254R, a filter 254G, and a filter 254B), a pixel circuit 230, and the like which are provided in the pixel 211.

Figure 35B:
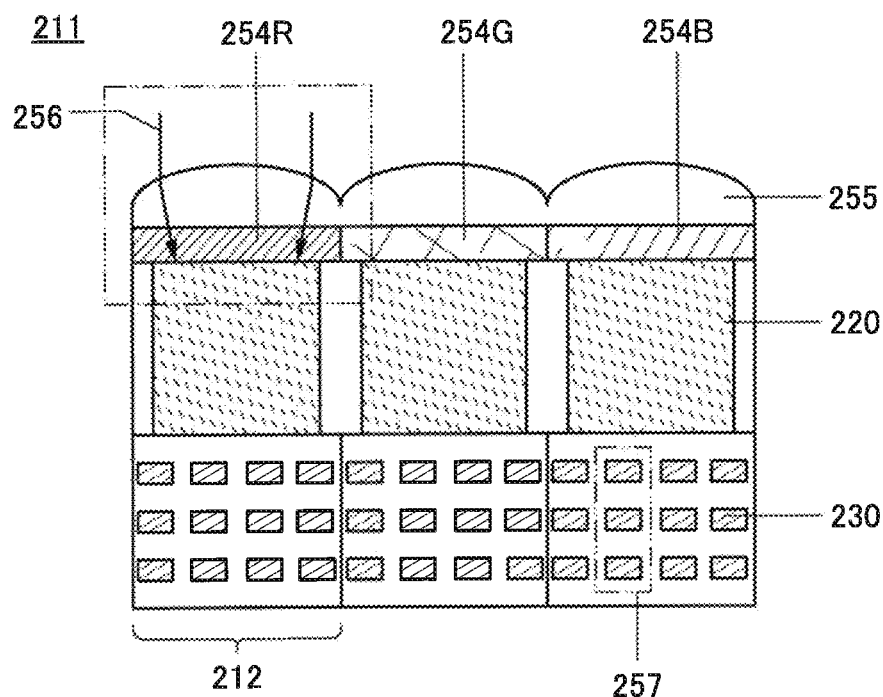

However, part of the light 256 indicated by arrows might be blocked by some wirings 257 as indicated by a region surrounded with dashed-dotted lines. Thus, a preferable structure is such that the lens 255 and the filter 254 are provided on the photoelectric conversion element 220 side as illustrated in FIG. 35(B), whereby the photoelectric conversion element 220 can efficiently receive the light 256. When the light 256 enters the photoelectric conversion element 220 from the photoelectric conversion element 220 side, the imaging device 200 with high sensitivity can be provided.

As the photoelectric conversion element 220 illustrated in FIG. 35, a photoelectric conversion element in which a p-n junction or a p-i-n junction is formed may be used.

Furthermore, the photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

The use of selenium for the photoelectric conversion element 220 enables the photoelectric conversion element 220 to have an absorption coefficient of light in a wide wavelength range including X-rays and gamma rays in addition to visible light, ultraviolet light, and infrared rays.

Here, one pixel 211 included in the imaging device 200 may include the subpixel 212 with a first filter in addition to the subpixel 212 illustrated in FIG. 35.

<Configuration Example 2 of Pixel>

An example of a pixel including a transistor using silicon and a transistor using an oxide semiconductor according to one embodiment of the present invention is described below.

Figure 36A:
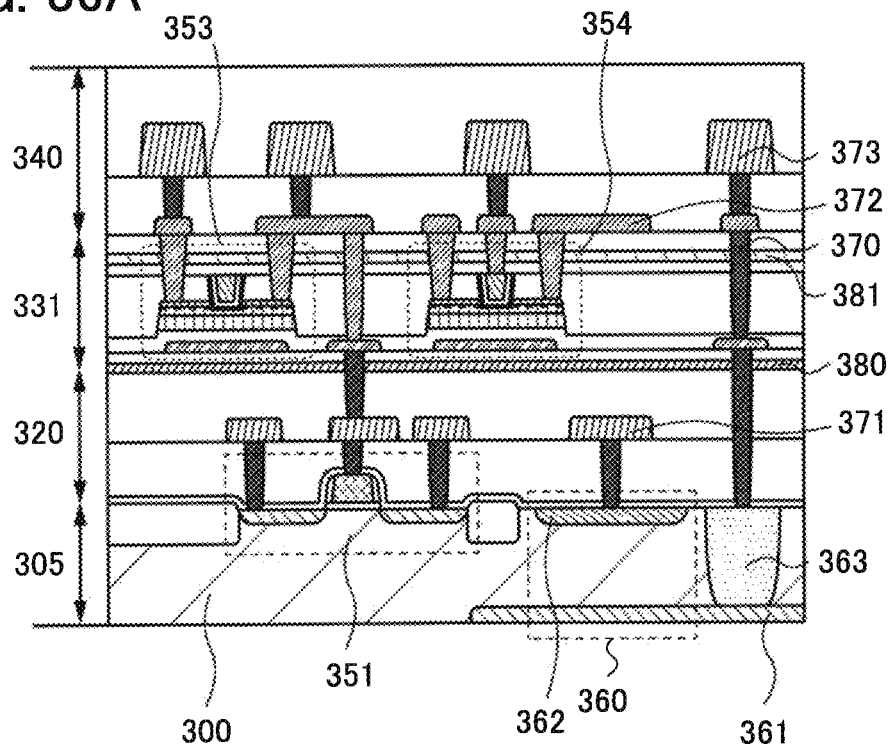
FIGS. 36A and 36B are cross-sectional views of an imaging device.
Figure 36B:
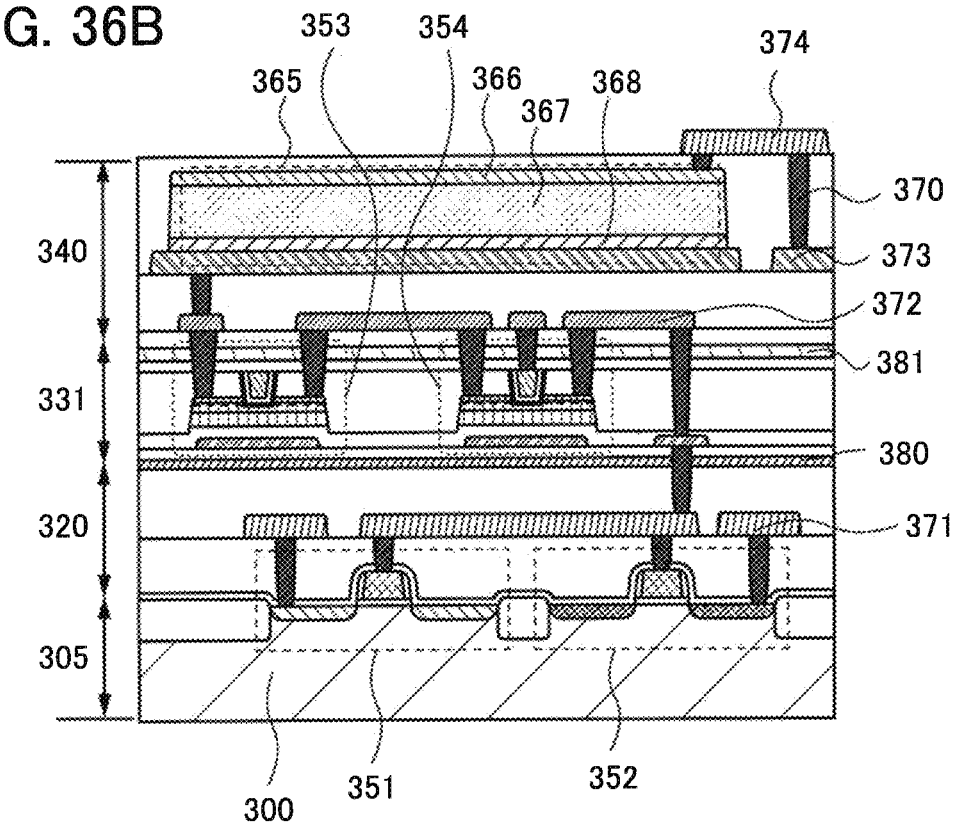

FIGS. 36(A) and 36(B) are each a cross-sectional view of an element included in an imaging device.

The imaging device illustrated in FIG. 36(A) includes a transistor 351 including silicon over a silicon substrate 300, transistors 353 and 354 which include an oxide semiconductor and are stacked over the transistor 351, and a photodiode 360 provided in the silicon substrate 300 and including an anode 361 and a cathode 362. The transistors and the photodiode 360 are electrically connected to various plugs 370 and wirings 371. In addition, the anode 361 of the photodiode 360 is electrically connected to the plug 370 through a low-resistance region 363.

Furthermore, the imaging device includes a layer 305 including the transistor 351 provided on the silicon substrate 300 and the photodiode 360 provided in the silicon substrate 300, a layer 320 which is in contact with the layer 305 and includes the wirings 371, a layer 331 which is in contact with the layer 320 and includes the transistors 353 and 354, and a layer 340 which is in contact with the layer 331 and includes a wiring 372 and a wiring 373.

Note that in the example of cross-sectional view in FIG. 36(A), a light-receiving surface of the photodiode 360 is provided on the side opposite to a surface of the silicon substrate 300 where the transistor 351 is formed. With the structure, an optical path can be obtained without the influence by the transistors or wirings. Thus, a pixel with a high aperture ratio can be formed. Note that the light-receiving surface of the photodiode 360 can be the same as the surface where the transistor 351 is formed.

Note that in the case where a pixel is formed with use of only transistors using an oxide semiconductor, the layer 305 may include the transistor using an oxide semiconductor. Alternatively, the layer 305 may be omitted, and the pixel may include only transistors using an oxide semiconductor.

In addition, in the cross-sectional view in FIG. 36(A), the photodiode 360 in the layer 305 and the transistor in the layer 331 can be formed so as to overlap with each other.

Thus, the degree of integration of pixels can be increased. In other words, the resolution of the imaging device can be increased.

Furthermore, an imaging device shown in FIG. 36(B) includes a photodiode 365 in the layer 340 side and over the transistor. In FIG. 36(B), the layer 305 includes the transistor 351 and a transistor 352 using silicon, the layer 320 includes the wiring 371, the layer 331 includes the transistors 353 and 354 using an oxide semiconductor layer, the layer 340 includes the photodiode 365. The photodiode 365 includes a semiconductor layer 366, a semiconductor layer 367, and a semiconductor layer 368, and is electrically connected to the wiring 373 and a wiring 374 through the plug 370.

The element structure illustrated in FIG. 36(B) can increase the aperture ratio.

Alternatively, a PIN diode element formed using an amorphous silicon film, a microcrystalline silicon film, or the like may be used as the photodiode 365. In the photodiode 365, an n-type semiconductor layer 368, an i-type semiconductor layer 367, and a p-type semiconductor layer 366 are stacked in this order. The i-type semiconductor layer 367 is preferably formed using amorphous silicon. Furthermore, the p-type semiconductor layer 366 and the n-type semiconductor layer 368 can each be formed using amorphous silicon, microcrystalline silicon, or the like which includes a dopant imparting the corresponding conductivity type. The photodiode 365 in which a photoelectric conversion layer is formed using amorphous silicon has high sensitivity in a visible light wavelength region, and therefore can easily sense weak visible light.

In FIGS. 36(A) and 36(B), an insulator 380 is provided between the layer 305 including the transistor 351 and the layer 331 including the transistors 353 and 354. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 353, the transistor 354, and the like becomes one of factors generating a carrier in the oxide semiconductor. Thus, the hydrogen may cause a reduction of the reliability of the transistor 353, the transistor 354, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a lower layer of the insulator 380 to an upper layer of the insulator 380; thus, the reliability of the transistor 353, the transistor 354, and the like can be increased. Furthermore, it is preferable to form an insulator 381 over the transistors 353 and 354 because oxygen diffusion can be prevented in the oxide semiconductor.

At least part of this embodiment can be implemented in combination with any of the other embodiments described in this specification as appropriate.

Embodiment 9

<Rf Tag>

In this embodiment, an RF tag that includes the transistor described in the above embodiments or the memory device described in the above embodiment is described with reference to FIG. 37.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag will be described with reference to FIG. 37. FIG. 37 is a block diagram illustrating a configuration example of an RF tag.

Figure 37:
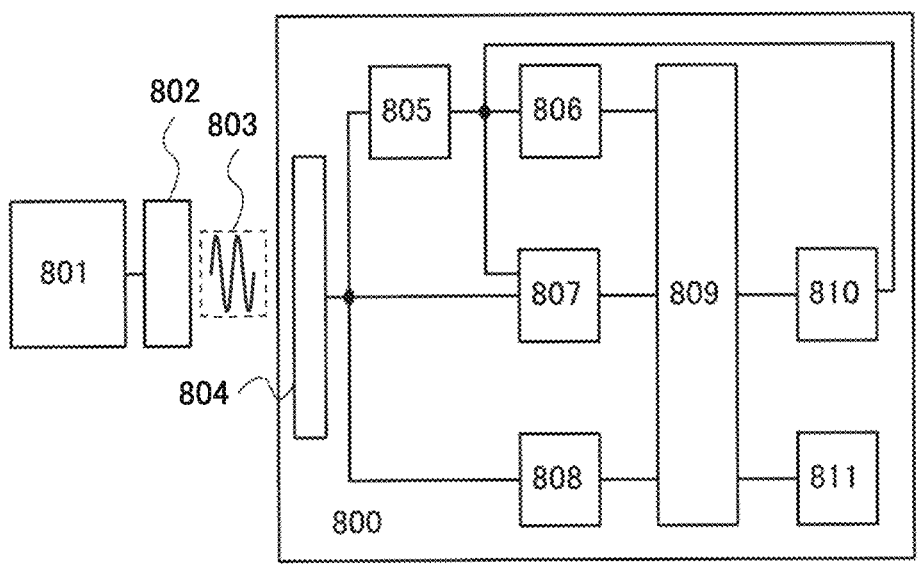
FIG. 37 is a configuration example of an RF tag.

As shown in FIG. 37, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. Note that a transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, a structure of each circuit will be described. The antenna 804 exchanges the radio signal 803 with the antenna 802 which is connected to the communication device 801. Furthermore, the rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Furthermore, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Furthermore, the ROM 811 stores an identification number (ID) or the like and outputs it in accordance with processing.

Note that whether each circuit described above is provided can be determined as appropriate as needed.

Here, the memory circuit described in the above embodiment can be used as the memory circuit 810. Since the memory circuit of one embodiment of the present invention can retain data even when not powered, the memory circuit can be favorably used for an RF tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

Note that this embodiment can be combined as appropriate with any of the other embodiments and an example in this specification.

Embodiment 10

<Display Device>

Figure 39A:
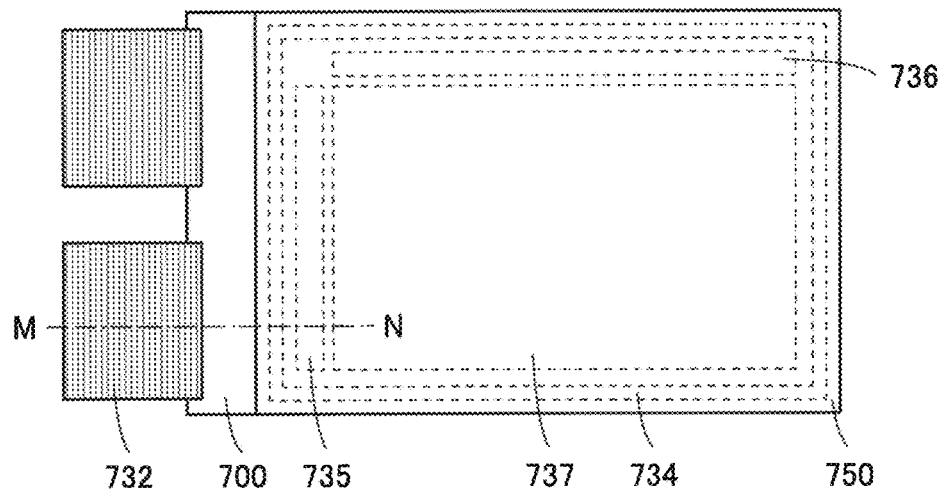
FIG. 39A is a top view and FIG. 39B is a cross-sectional view illustrating a semiconductor device of the present invention.
Figure 39B:
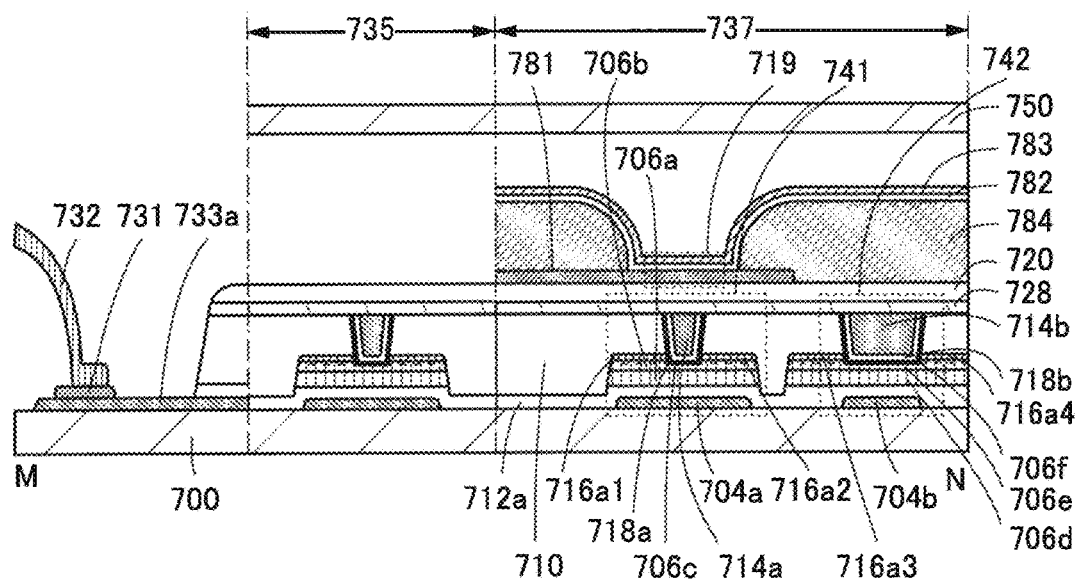
Figure 40:
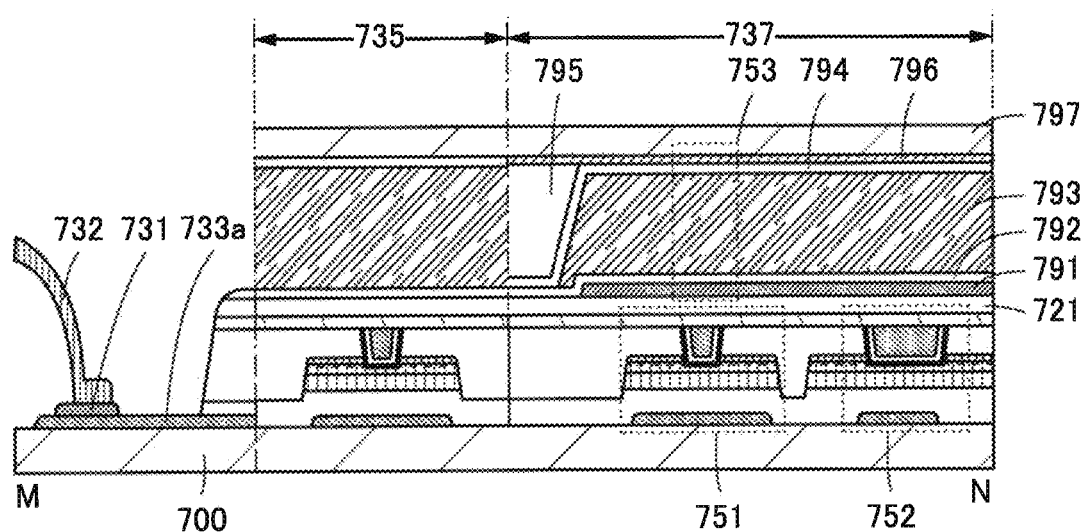
FIG. 40 is a cross-sectional view illustrating a semiconductor device of the present invention.

A display device of one embodiment of the present invention is described below with reference to FIG. 38, FIG. 39, and FIG. 40.

Examples of a display element provided in the display device include a liquid crystal element (also referred to as a liquid crystal display element) and a light-emitting element (also referred to as a light-emitting display element.). The light-emitting element includes, in its category, an element whose luminance is controlled by a current or voltage, and specifically includes, in its category, an inorganic EL (Electroluminescence), an organic EL, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

Furthermore, the display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 38A:
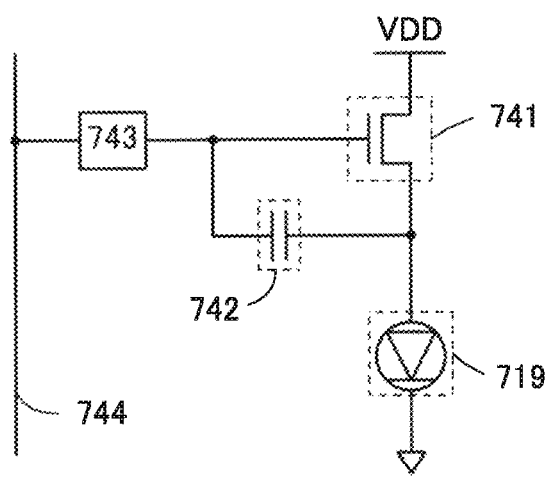
FIGS. 38A and 38B are circuit diagrams illustrating a semiconductor device of the present invention.

FIG. 38(A) is a circuit diagram of a pixel in an EL display device. FIG. 39(A) is a top view showing the whole of the EL display device. Furthermore, FIG. 39(B) is a cross-sectional view taken along part of dashed-dotted line M-N in FIG. 39(A).

Note that in this specification and the like, it might be possible for those skilled in the art to constitute one embodiment of the invention even when portions to which all the terminals of an active element (a transistor, a diode, or the like), a passive element (a capacitor, a resistor, or the like), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (a transistor, a diode, or the like), a passive element (a capacitor, a resistor, or the like), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 38(A) includes a switching element 743, a transistor 741, a capacitor 742, and a light-emitting element 719.

Note that FIG. 38(A) and the like each illustrate an example of a circuit structure; therefore, a transistor can be provided additionally. In contrast, for each node in FIG. 38(A), it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A power supply potential VDD is supplied to a drain of the transistor 741. The other terminal of the switching element 743 is electrically connected to a signal line 744. A constant potential is supplied to the other electrode of the light-emitting element 719. Note that the constant potential is a ground potential GND or a potential lower than the ground potential GND.

It is preferable to use a transistor as the switching element 743. When the transistor is used, the area of a pixel can be reduced, so that the EL display device can have high resolution. Furthermore, as the switching element 743, a transistor formed through the same step as the transistor 741 can be used, so that EL display devices can be manufactured with high productivity. Note that as the transistor 741 and/or the switching element 743, the transistor illustrated in FIG. 2 can be used, for example.

FIG. 39(A) is a top view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 39(B) is a cross-sectional view of the EL display device taken along part of dashed-dotted line M-N in FIG. 39(A).

FIG. 39(B) illustrates a structure of the transistor 741 including an insulator 712a over the substrate 700; a conductor 704a; an insulator 706a that is over the insulator 712a and the conductor 704a and partly overlaps with the conductor 704a; a semiconductor 706b over the insulator 706a; conductors 716a1 and 716a2 in contact with a top surface of the semiconductor 706b; an insulator 710 over the conductors 716a1 and 716a2; an insulator 706c over the semiconductor 706b; an insulator 718a over the insulator 706c; and a conductor 714a that is over the insulator 718a and overlaps with the semiconductor 706b. Note that the structure of the transistor 741 is just an example; the transistor 741 may have a structure different from that illustrated in FIG. 39(B).

In the transistor 741 illustrated in FIG. 39(B), the conductor 704a serves as a gate electrode, the insulator 712a serves as a gate insulator, the conductor 716a1 serves as a source electrode, the conductor 716a2 serves as a drain electrode, the insulator 718b serves as a gate insulator, and the conductor 714a serves as a gate electrode. Note that in some cases, electric characteristics of the insulator 706a, the semiconductor 706b, and the insulator 706c change if light enters the insulator 706a, the semiconductor 706b, and the insulator 706c. To prevent this, it is preferable that one or more of the conductor 704a, the conductor 716a1, the conductor 716a2, and the conductor 714a have a light-blocking property.

FIG. 39(B) illustrates a structure of the capacitor 742 including an insulator 706d that is over a conductor 704b and partly overlaps with the conductor 704b; a semiconductor 706e over the insulator 706d; conductors 716a3 and 716a4 in contact with a top surface of the semiconductor 706e; the insulator 710 over the conductors 716a3 and 716a4; an insulator 706f over the semiconductor 706e; the insulator 718b over the insulator 706f; and a conductor 714b that is over the insulator 718b and overlaps with the semiconductor 706e.

In the capacitor 742, the conductor 704b functions as one electrode and the conductor 714b functions as the other electrode.

Thus, the capacitor 742 can be formed using a film of the transistor 741. Furthermore, the conductor 704a and the conductor 704b are preferably conductors of the same kind, in which case the conductor 704a and the conductor 704b can be formed through the same step. Furthermore, the conductor 714a and the conductor 714b are preferably conductors of the same kind, in which case the conductor 714a and the conductor 714b can be formed through the same step.

The capacitor 742 illustrated in FIG. 39(B) has a large capacitance per area occupied by the capacitor. Therefore, the EL display device illustrated in FIG. 39(B) has high display quality. Note that note that the structure of the capacitor 742 is just an example and may be different from that illustrated in FIG. 39(B).

An insulator 728 is provided over the transistor 741 and the capacitor 742, and an insulator 720 is provided over the insulator 728. Here, the insulator 728 and the insulator 720 may have an opening portion reaching the conductor 716a1 that serves as the source electrode of the transistor 741. A conductor 781 is provided over the insulator 720. The conductor 781 may be electrically connected to the transistor 741 through the opening portion in the insulator 728 and the insulator 720.

A partition wall 784 having an opening portion reaching the conductor 781 is provided over the conductor 781. A light-emitting layer 782 in contact with the conductor 781 through the opening portion formed in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719. In FIG. 39(B), the FPC 732 is connected to a wiring 733a through a terminal 731. Note that the wiring 733a may be formed using the same kind of conductor or semiconductor as the conductor or semiconductor included in the transistor 741.

So far, examples of the EL display device are described. Next, an example of a liquid crystal display device is described.

Figure 38B:
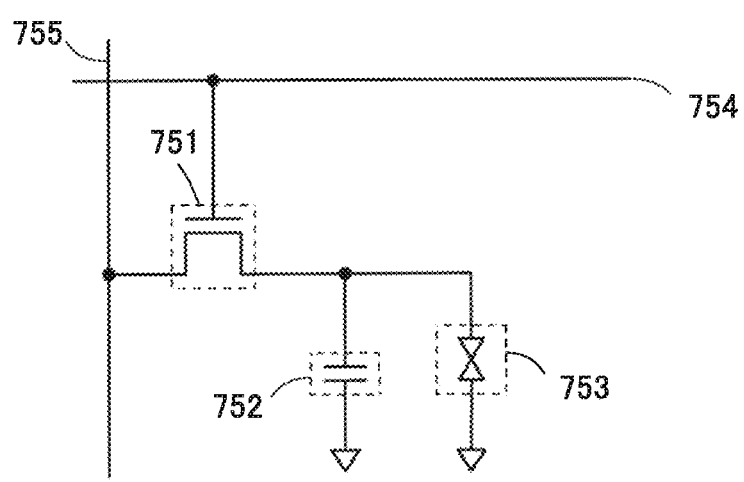

FIG. 38(B) is a circuit diagram showing a structural example of a pixel of the liquid crystal display device. A pixel illustrated in FIG. 38(B) includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of a liquid crystal element 753 is electrically connected to the other of the source and the drain of the transistor 751, and the other electrode of the liquid crystal element 753 is electrically connected to a wiring to which a common potential is supplied. Note that the common potential supplied to the wiring electrically connected to the other electrode of the capacitor 752 may be different from that supplied to the other electrode of the liquid crystal element 753.

Note the description of the liquid crystal display device is made on the assumption that the top view of the liquid crystal display device is similar to that of the EL display device. FIG. 39(A) is a cross-sectional view of the liquid crystal display device taken along dashed-dotted line M-N in FIG. 40. In FIG. 40, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. Furthermore, for the capacitor 752, the description of the capacitor 742 is referred to. Note that the structure of the capacitor 752 in FIG. 40 corresponds to, but is not limited to, the structure of the capacitor 742 in FIG. 39(B).

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. Here, the insulator 721 has an opening portion reaching the transistor 751. A conductor 791 is provided over the insulator 721. The conductor 791 is electrically connected to the transistor 751 through the opening portion in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality can be provided. Furthermore, a display device with high-resolution display device can be provided.

For example, in this specification and the like, a display element, a display device which is a device including a display element, a light-emitting element, and a light-emitting device which is a device including a light-emitting element can employ various modes or can include various elements. The display element, the display device, the light-emitting element, or the light-emitting device includes at least one of an EL element (an EL element including organic and inorganic materials, an organic EL element, or an inorganic EL element), an LED (a white LED, a red LED, a green LED, a blue LED, or the like), a transistor (a transistor that emits light depending on current), an electron-emissive element, a liquid crystal element, electronic ink, an electrophoretic element, a grating light valve (GLV), a plasma display panel (PDP), an MEMS (micro electro mechanical system), a digital micromirror device (DMD), a DMS (digital micro shutter), an IMOD (interferometric modulation) element, a MEMS shutter display element, an optical-interference-type MEMS display element, an electrowetting element, a piezoelectric ceramic display, a display element including a carbon nanotube, and the like. Other than the above, display media whose contrast, luminance, reflectivity, transmittance, or the like is changed by electrical or magnetic effect may be included.

Examples of display devices having EL elements include an EL display. Examples of a display device including an electron emitter include a field emission display (FED), an SED-type flat panel display (SED: Surface-conduction Electron-emitter Display), and the like. Examples of display devices including liquid crystal elements include a liquid crystal display (transmissive liquid crystal display, a transflective liquid crystal display, a reflective liquid crystal display, a direct-view liquid crystal display, or a projection liquid crystal display). Examples of a display device having electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. Furthermore, in such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. Note that the GaN semiconductors included in the LED may be formed by MOCVD. Note that when the graphene is provided, the GaN semiconductor included in the LED can also be formed by a sputtering method.

Note that this embodiment can be combined with any of the other embodiments and examples in this specification as appropriate.

Embodiment 11

In this embodiment, a display module using a semiconductor device of one embodiment of the present invention is described with reference to FIG. 41.
<Display Module>

Figure 41:
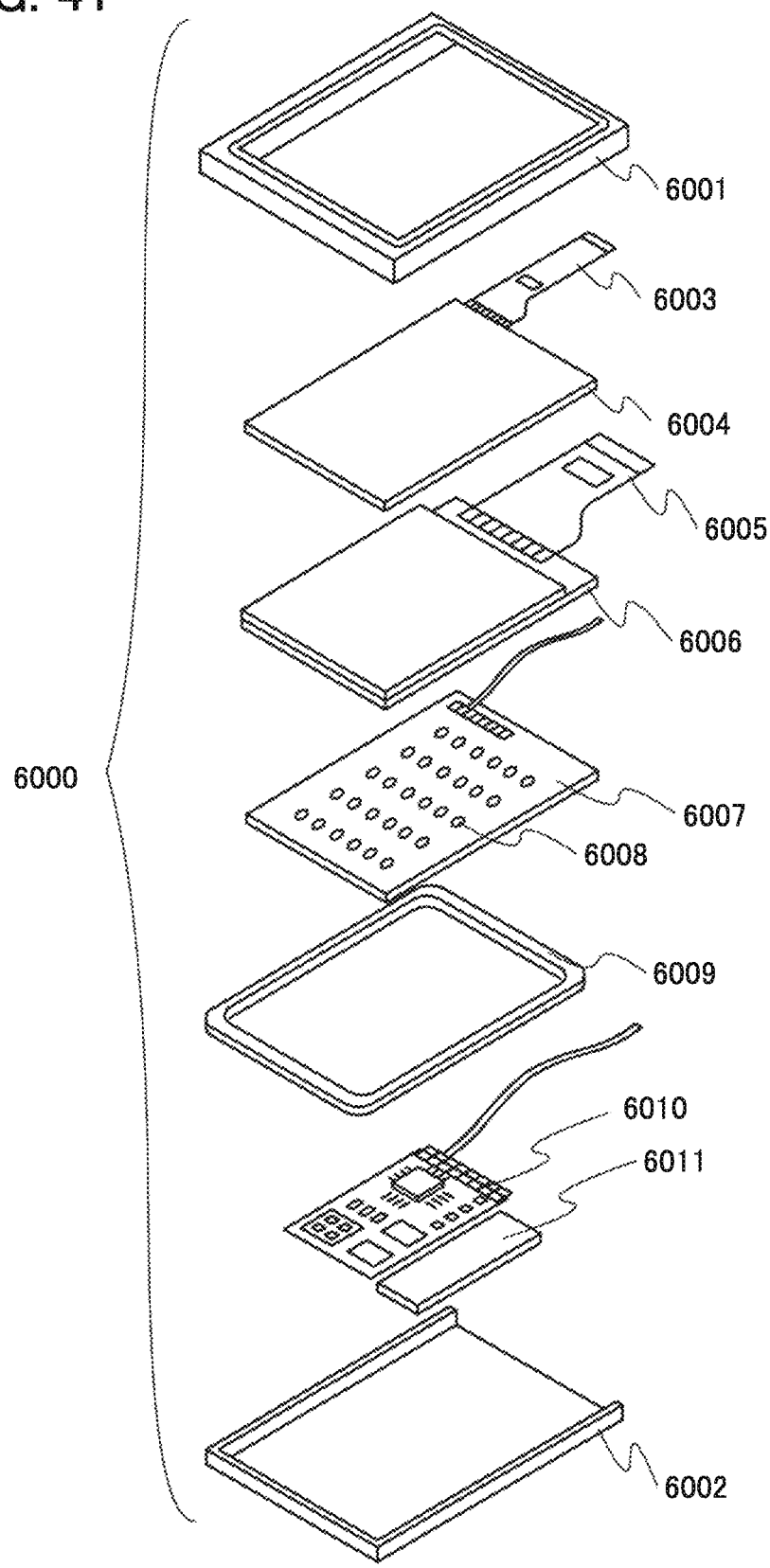
FIG. 41 is an image illustrating a display module.

In a display module 6000 in FIG. 41, a touch panel 6004 connected to an FPC 6003, a display panel 6006 connected to an FPC 6005, a backlight unit 6007, a frame 6009, a printed board 6010, and a battery 6011 are provided between an upper cover 6001 and a lower cover 6002. Note that the backlight unit 6007, the battery 6011, the touch panel 6004, and the like are not provided in some cases.

The semiconductor device of one embodiment of the present invention can be used for, for example, the display panel 6006 and an integrated circuit mounted on a printed circuit board.

The shapes and sizes of the upper cover 6001 and the lower cover 6002 can be changed as appropriate in accordance with the sizes of the touch panel 6004 and the display panel 6006.

The touch panel 6004 can be a resistive touch panel or a capacitive touch panel and may be formed to overlap with the display panel 6006. Furthermore, a counter substrate (sealing substrate) of the display panel 6006 can have a touch panel function. Furthermore, a photosensor may be provided in each pixel of the display panel 6006 so that an optical touch panel function is added. Furthermore, an electrode for a touch sensor may be provided in each pixel of the display panel 6006 so that a capacitive touch panel function is added.

The backlight unit 6007 includes a light source 6008. The light source 6008 may be provided at an end portion of the backlight unit 6007 and a light diffusing plate may be used.

The frame 6009 protects the display panel 6006 and also functions as an electromagnetic shield for blocking electromagnetic waves generated from the printed board 6010. Furthermore, the frame 6009 may function as a radiator plate.

The printed board 6010 has a power supply circuit and a signal processing circuit for outputting a video signal and a clock signal. As a power source for supplying power to the power supply circuit, an external commercial power source or the battery 6011 provided separately may be used. Note that the battery 6011 can be omitted in the case where a commercial power source is used.

Furthermore, the display module 6000 can be additionally provided with a member such as a polarizing plate, a retardation plate, or a prism sheet.

Note that this embodiment can be combined as appropriate with any of the other embodiments and an example in this specification.

Embodiment 12

<Package Using a Lead Frame Interposer>

Figure 42A:
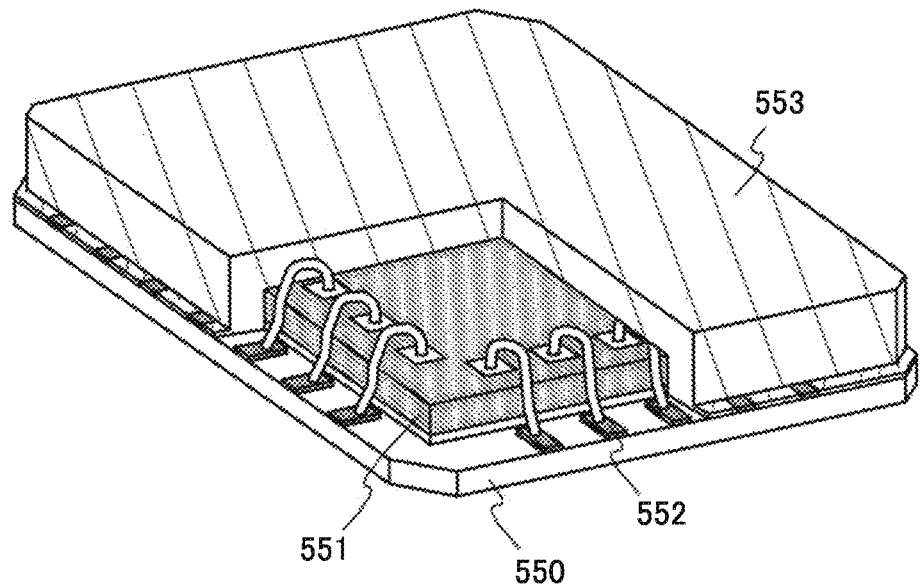
FIG. 42A is a perspective view illustrating a cross-sectional structure of a package using a lead frame interposer and FIG. 42B is an image illustrating mounting example.

FIG. 42(A) is a perspective view illustrating a cross-sectional structure of a package using a lead frame interposer. In the package illustrated in FIG. 42(A), a chip 551 corresponding to the semiconductor device of one embodiment of the present invention is connected to a terminal 552 over an interposer 550 by a wire bonding method. The terminal 552 is placed on a surface of the interposer 550 on which the chip 551 is mounted. The chip 551 may be sealed by a mold resin 553, in which case the chip 551 is sealed such that part of each of the terminals 552 is exposed.

Figure 42B:
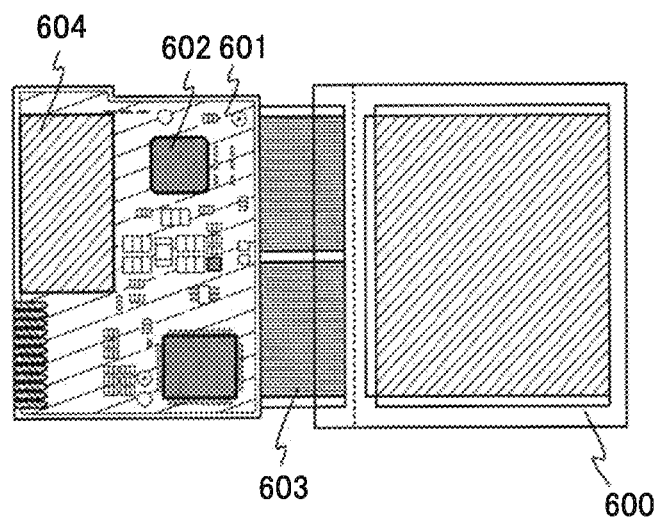

FIG. 42(B) illustrates the structure of a module of an electronic device (mobile phone) in which a package is mounted on a circuit board. In the module of the mobile phone in FIG. 42(B), a package 602 and a battery 604 are mounted on a printed wiring board 601. Furthermore, the printed wiring board 601 is mounted on a panel 600 including a display element by an FPC 603.

Note that this embodiment can be combined as appropriate with any of the other embodiments and an example in this specification.

Embodiment 13

In this embodiment, electronic devices and lighting devices of one embodiment of the present invention will be described with reference to drawings.
<Electronic Device>

Electronic devices and lighting devices can be fabricated using the semiconductor device of one embodiment of the present invention. In addition, highly reliable electronic devices and lighting devices can be fabricated using the semiconductor device of one embodiment of the present invention. Furthermore, electronic devices and lighting devices including touch sensors with improved detection sensitivity can be fabricated using the semiconductor device of one embodiment of the present invention.

Examples of electronic devices include a television set (also referred to as a television or a television receiver), a monitor of a computer or the like, a digital camera, a digital video camera, a digital photo frame, a mobile phone (also referred to as a mobile phone or a mobile phone device), a portable game machine, a portable information terminal, an audio reproducing device, a large game machine such as a pinball machine, and the like.

In the case of having flexibility, the electronic device or lighting device of one embodiment of the present invention can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

As examples of the secondary battery, a lithium ion secondary battery such as a lithium polymer battery (lithium ion polymer battery) using a gel electrolyte, a lithium ion battery, a nickel-hydride battery, a nickel-cadmium battery, an organic radical battery, a lead-acid battery, an air secondary battery, a nickel-zinc battery, and a silver-zinc battery can be given.

The electronic device of one embodiment of the present invention may include an antenna. When a signal is received by the antenna, the electronic device can display an image, data, or the like on a display portion. When the electronic device includes a secondary battery, the antenna may be used for non-contact power transmission.

Figure 43A:
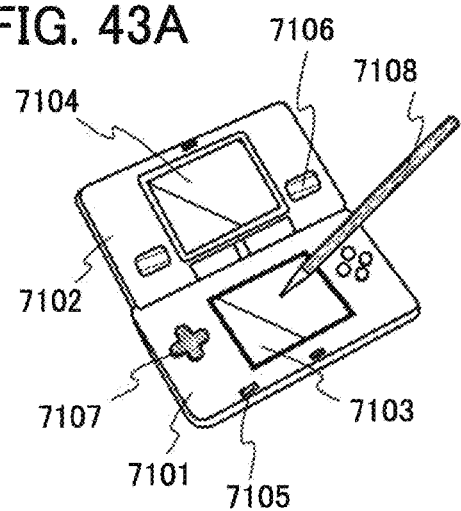
FIGS. 43A-43E are images each illustrating an electronic device of one embodiment of the present invention.

FIG. 43(A) illustrates a portable game machine including a housing 7101, a housing 7102, a display portion 7103, a display portion 7104, a microphone 7105, speakers 7106, an operation key 7107, a stylus 7108, and the like. The semiconductor device of one embodiment of the present invention can be used for an integrated circuit, a CPU, or the like incorporated in the housing 7101. When the light-emitting device according of one embodiment of the present invention is used as the display portion 7103 or 7104, it is possible to provide a user-friendly portable game machine with quality that hardly deteriorates. Note that although the portable game machine illustrated in FIG. 43(A) includes two display portions, the display portion 7103 and the display portion 7104, the number of display portions included in the portable game machine is not limited to two.

Figure 43B:

FIG. 43(B) illustrates a smart watch, which includes a housing 7302, a display portion 7304, operation buttons 7311 and 7312, a connection terminal 7313, a band 7321, a clasp 7322, and the like. The semiconductor device of one embodiment of the present invention can be used for a memory, a CPU, or the like incorporated in the display portion 7304 or the housing 7302.

Figure 43C:
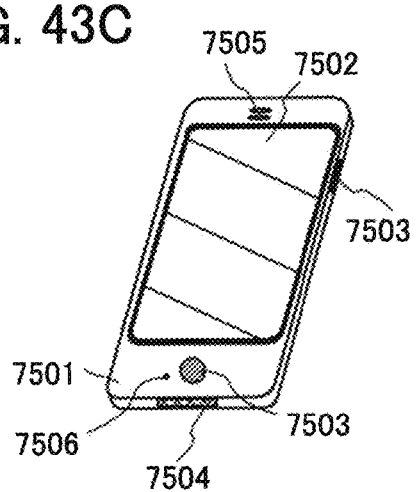

FIG. 43(C) illustrates a portable information terminal, which includes a display portion 7502 incorporated in a housing 7501, operation buttons 7503, an external connection port 7504, a speaker 7505, a microphone 7506, and the like. The semiconductor device of one embodiment of the present invention can be used for a mobile memory, a CPU, or the like incorporated in the housing 7501. Note that the display portion 7502 is small- or medium-sized but can perform full high vision, 4 k, or 8 k display because it has greatly high definition; therefore, a significantly clear image can be obtained.

Figure 43D:
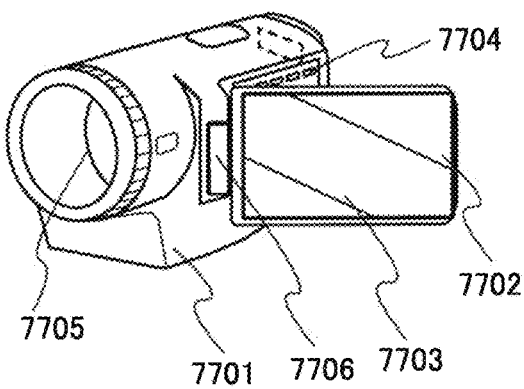

FIG. 43(D) illustrates a video camera, which includes a first housing 7701, a second housing 7702, a display portion 7703, operation keys 7704, a lens 7705, a joint 7706, and the like. The operation keys 7704 and the lens 7705 are provided for the first housing 7701, and the display portion 7703 is provided for the second housing 7702. Furthermore, the first housing 7701 and the second housing 7702 are connected to each other with the joint 7706, and the angle between the first housing 7701 and the second housing 7702 can be changed with the joint 7706. Images displayed on the display portion 7703 may be switched in accordance with the angle at the joint 7706 between the first housing 7701 and the second housing 7702. The imaging device in one embodiment of the present invention can be provided in a focus position of the lens 7705. The semiconductor device of one embodiment of the present invention can be used for an integrated circuit, a CPU, or the like incorporated in the first housing 7701.

Figure 43E:
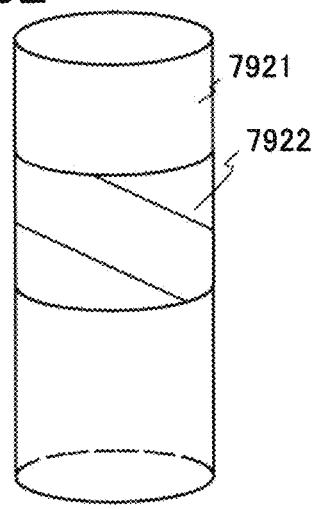

FIG. 43(E) illustrates a digital signage including a display portion 7922 provided on a utility pole 7921. The display device of one embodiment of the present invention can be used for a control circuit of the display portion 7922.

Figure 44A:
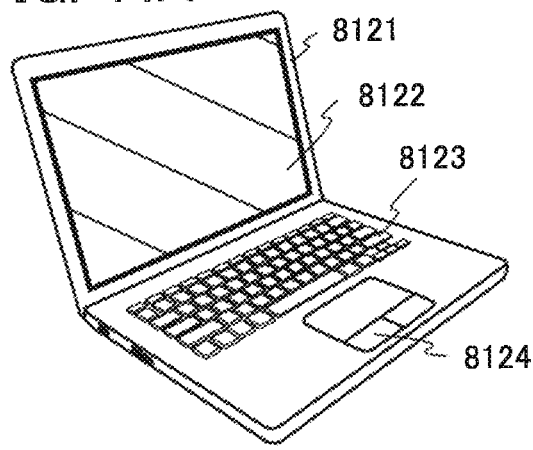
FIGS. 44A-44D are images each illustrating an electronic device of one embodiment of the present invention.

FIG. 44(A) illustrates a notebook personal computer, which includes a housing 8121, a display portion 8122, a keyboard 8123, a pointing device 8124, and the like. The semiconductor device of one embodiment of the present invention can be used for a CPU, a memory, or the like incorporated in the housing 8121. Note that the display portion 8122 is small- or medium-sized but can perform $8k$ display because it has greatly high definition; therefore, a significantly clear image can be obtained.

Figure 44B:
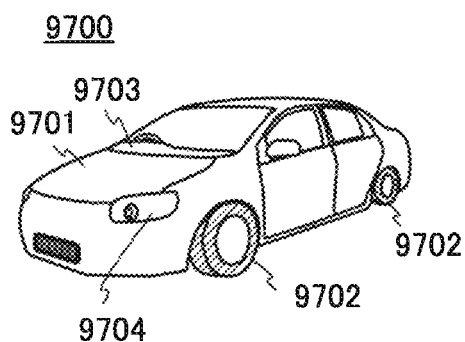
Figure 44C:
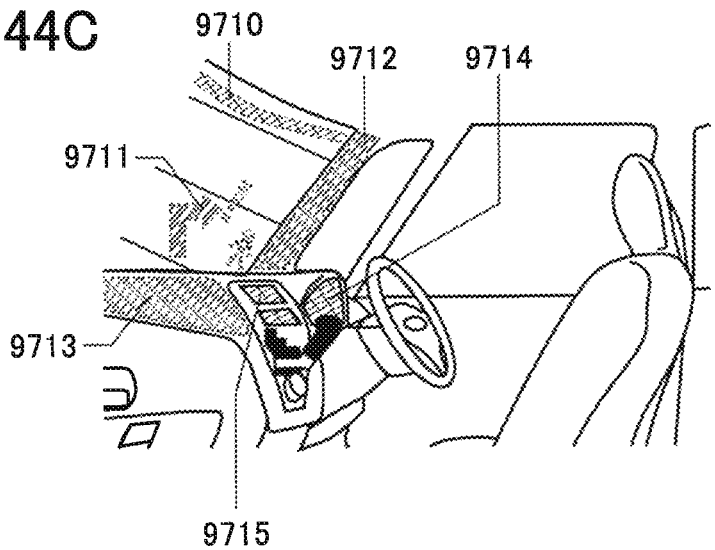

FIG. 44(B) is an external view of an automobile 9700. FIG. 44(C) illustrates a driver's seat of the automobile 9700. The automobile 9700 includes a car body 9701, wheels 9702, a dashboard 9703, lights 9704, and the like. The semiconductor device of one embodiment of the present invention can be used in a display portion and a control integrated circuit of the automobile 9700. For example, the semiconductor device of one embodiment of the present invention can be used in display portions 9710 to 9715 illustrated in FIG. 44(C).

The display portion 9710 and the display portion 9711 are display devices or input/output devices provided in an automobile windshield. The display device or input/output device of one embodiment of the present invention can be a see-through display device or input/output device, through which the opposite side can be seen, by using a light-transmitting conductive material for its electrodes. Such a see-through display device or input/output device does not hinder driver's vision during the driving of the automobile 9700. Therefore, the display device or input/output device of one embodiment of the present invention can be provided in the windshield of the automobile 9700. Note that in the case where a transistor or the like for driving the display device or input/output device is provided in the display device or input/output device, a transistor having light-transmitting properties, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar can be compensated. A display portion 9713 is a display device provided on the dashboard portion. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Furthermore, displaying an image to compensate for the area which a driver cannot see, makes it possible for the driver to confirm safety easily and comfortably.

Figure 44D:
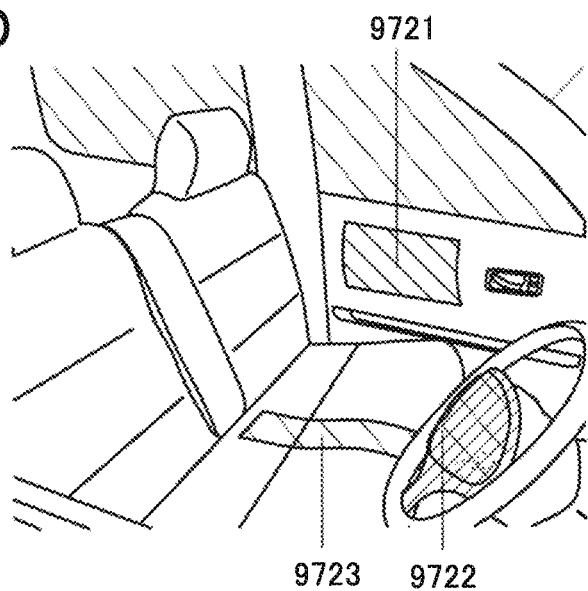

FIG. 44(D) illustrates the inside of a car in which a bench seat is used as a driver seat and a front passenger seat. A display portion 9721 is a display device or input/output device provided in a door portion. For example, an image taken by an imaging unit provided in the car body is displayed on the display portion 9721, whereby the view hindered by the door can be compensated. Furthermore, a display portion 9722 is a display device provided in a steering wheel. A display portion 9723 is a display device provided in the middle portion of a seating face of the bench seat. Note that the display device can be used as a seat heater by providing the display device on the seating face or backrest and by using heat generation of the display device as a heat source.

The display portion 9714, the display portion 9715, and the display portion 9722 can display a variety of kinds of information such as navigation data, a speedometer, a tachometer, a mileage, a fuel meter, a gearshift indicator, and air-condition setting. Furthermore, the content, layout, or the like of the display on the display portions can be changed freely by a user as appropriate. Note that the information listed above can also be displayed on the display portion 9710 to the display portion 9713, the display portion 9721, and the display portion 9723. Furthermore, the display portion 9710 to the display portion 9715 and the display portion 9721 to the display portion 9723 can also be used as lighting devices. Furthermore, the display portion 9710 to the display portion 9715 and the display portion 9721 to the display portion 9723 can also be used as heating devices.

Figure 45A:
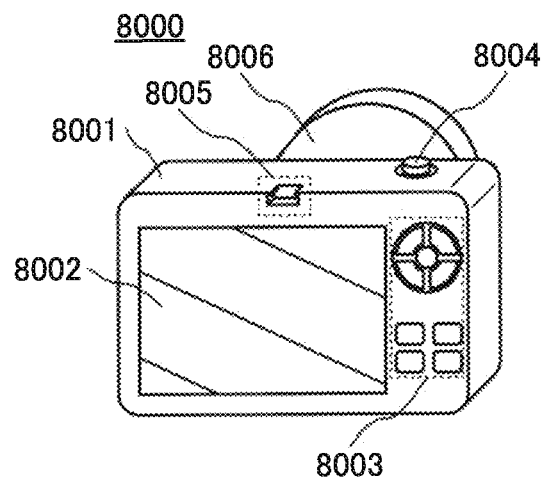
FIGS. 45A-45C are images, each illustrating an electronic device of one embodiment of the present invention.

Furthermore, FIG. 45(A) illustrates an external view of a camera 8000. The camera 8000 includes a housing 8001, a display portion 8002, an operation button 8003, a shutter button 8004, a connection portion 8005, and the like. Furthermore, a lens 8006 can be put on the camera 8000.

The connection portion 8005 includes an electrode to connect with a finder 8100, which is described below, a stroboscope, or the like.

Although the lens 8006 of the camera 8000 here is detachable from the housing 8001 for replacement, the lens 8006 may be included in a housing.

Images can be taken at the touch of the shutter button 8004. In addition, images can be taken at the touch of the display portion 8002, which serves as a touch panel.

The display device or input/output device of one embodiment of the present invention can be used in the display portion 8002.

Figure 45B:
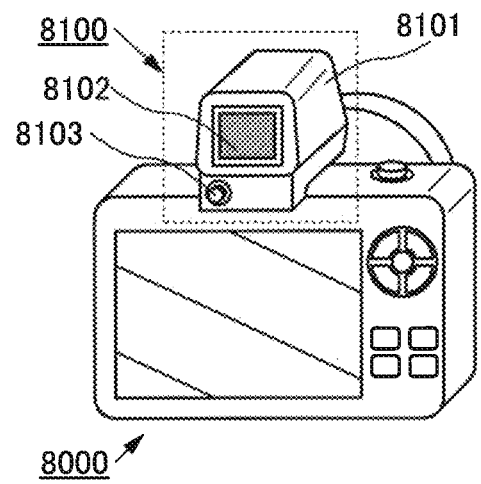

As an example, the case where the camera 8000 with the finder 8100 connected is shown in FIG. 45(B).

The finder 8100 includes a housing 8101, a display portion 8102, a button 8103, and the like.

The housing 8101 includes a connection portion for the camera 8000 and the connection portion 8005, and the finder 8100 can be connected to the camera 8000. Furthermore, the connection portion includes an electrode, and an image or the like received from the camera 8000 through the electrode can be displayed on the display portion 8102.

The button 8103 functions as a power supply button. With the button 8103, the display portion 8102 can be turned on and off.

The semiconductor device of one embodiment of the present invention can be used for an integrated circuit and an image sensor included in the housing 8101.

Note that although the camera 8000 and the finder 8100 are separate and detachable electronic devices in FIGS. 45(A) (B), the housing 8001 of the camera 8000 may include a finder having the display device or input/output device of one embodiment of the present invention.

Figure 45C:
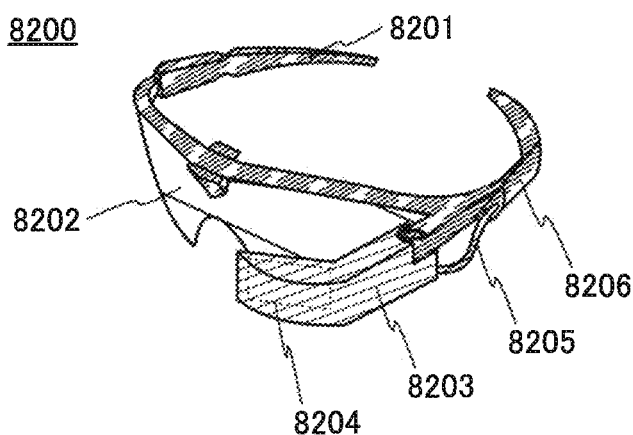

FIG. 45(C) illustrates an external view of a head-mounted display 8200.

The head-mounted display 8200 includes a mounting portion 8201, a lens 8202, a main body 8203, a display portion 8204, a cable 8205, and the like. Furthermore, the mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. In addition, the movement of the eyeball and the eyelid of a user can be captured by a camera in the main body 8203 and then coordinates of the points the user looks at can be calculated using the captured data to utilize the eye of the user as an input means.

Furthermore, the mounting portion 8201 may include a plurality of electrodes so as to be in contact with the user. The main body 8203 may be configured to sense current flowing through the electrodes with the movement of the user's eyeball to recognize the direction of his or her eyes. Furthermore, the main body 8203 may be configured to sense current flowing through the electrodes to monitor the user's pulse. Furthermore, the mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The semiconductor device of one embodiment of the present invention can be used for an integrated circuit included in the main body 8203.

At least part of this embodiment can be implemented in combination with any of the embodiments described in this specification as appropriate.

Embodiment 14

In this embodiment, application examples of an RF tag using the semiconductor device of one embodiment of the present invention will be described with reference to FIG. 46.

<Application Examples of RF Tag>

The RF tag is widely used and can be provided for, for example, products such as bills, coins, securities, bearer bonds, documents (driver's licenses, resident's cards, or the like, see FIG. 46(A)), vehicles (bicycles or the like, see FIG. 46(B)), packaging containers (wrapping paper, bottles, or the like, see FIG. 46(C)), recording media (DVD, video tapes, or the like, see FIG. 46(D)), personal belongings (bags, glasses, or the like), foods, plants, animals, human bodies, clothing, household goods, medical supplies such as medicine and chemicals, and electronic devices (liquid crystal display devices, EL display devices, television sets, or cellular phones), or tags on products (see FIGS. 46(E) and 46(F)).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Furthermore, vehicles can also have higher security against theft or the like by being provided with the RF tag of one embodiment of the present invention.

As described above, by using the RF tag including the semiconductor device of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Note that this embodiment can be combined as appropriate with any of the other embodiments and an example in this specification.

Example 1

In this example, a sample was fabricated to evaluate the variations of the processings of the insulator 410, the conductor 416a1, and the conductor 416a2 using a hard mask (see FIG. 17 to FIG. 19) and the processings of the insulator 410, the conductor 416a1, and the conductor 416a2 without using the hard mask but a resist mask according to the present invention.

First, a sample was fabricated in such a manner that a first silicon oxynitride film was formed on a single crystal silicon wafer to a thickness of 100 nm by a CVD method. Then, a first In—Ga—Zn oxide was formed on the silicon oxynitride film to a thickness of 20 nm by a sputtering method, and a second In—Ga—Zn oxide was formed on the first In—Ga—Zn oxide to a thickness of 15 nm by a sputtering method. Then, a first tungsten film was formed on the second In—Ga—Zn oxide to a thickness of 20 nm by a sputtering method.

Next, a 20-nm-thick first organic coating film was applied on the first tungsten film, and the first organic coating film and the first tungsten film were processed by a lithography method. Next the second In—Ga—Zn oxide and the first In—Ga—Zn oxide were processed using the first tungsten film as a mask.

Next, on the first silicon oxynitride film and the first tungsten film, a second silicon oxynitride film was formed to a thickness of 320 nm by a CVD method.

Then, the second silicon oxynitride film was subjected to CMP treatment so that the thickness of the second silicon oxynitride film located over the first tungsten film was planarized to have a thickness of 100 nm and the thickness located over the first silicon oxynitride film was planarized to have a thickness of 160 nm.

Then, in Sample 2, a second tungsten film was formed over the planarized second silicon oxynitride film to a thickness of 30 nm by a sputtering method, and a third silicon oxynitride film was formed over the second tungsten film to a thickness of 50 nm by a CVD method. The above formation was not performed on Sample 1.

After that, a second organic coating film was applied to Sample 1 and Sample 2, and a resist mask was formed by a lithography method.

Next, first processing for etching the second organic coating film, second processing for etching the third silicon oxynitride film, and third processing for etching the second tungsten film were performed in Sample 2 using the resist mask as a mask. The first processing, the second processing, and the third processing were performed using a dry etching apparatus. At that time, the resist mask and the second organic coating film were eliminated by the first processing, the second processing, and the third processing. Through the above steps, a hard mask including the third silicon oxynitride film and the second tungsten film was formed in Sample 1.

The dry etching apparatus that was used has a structure in which high frequency power sources with different frequencies are connected to respective parallel plate type electrodes. For the etching of the second organic coating film, the first processing was performed in which 500 W high frequency power was applied to the upper electrode and 100 W high frequency power was applied to the lower electrode at a pressure of 3 Pa for 13 seconds using a $CF_4$ gas with a flow rate of 80 sccm. For the etching of the third silicon oxynitride film, the second processing was performed in which 550 W high frequency power was applied to the upper electrode and 350 W high frequency power were applied to the lower electrode at a pressure of 5.3 Pa for 28 seconds using a mixed gas containing an oxygen gas with a flow rate of 13 sccm and a $CHF_3$ gas with a flow rate of 67 sccm. For the etching of the second tungsten film, the third processing was performed in which 1000 W high frequency power was applied to the upper electrode and 100 W high frequency power was applied to the lower electrode at a pressure of 0.6 Pa for 13 seconds using a mixed gas containing a chlorine gas with a flow rate of 11 sccm, a $CF_4$ gas with a flow rate of 22 sccm, and an oxygen gas with a flow rate of 22 sccm.

Next, in Sample 2, using the same dry etching apparatus as that in the first processing, the second processing, and the third processing, fourth processing for forming an opening portion was performed until the second silicon oxynitride film reached top surfaces of the first tungsten film and the first silicon oxynitride film using the hard mask including the third silicon oxynitride film and the second tungsten film as a mask formed as described above. By the fourth processing, the third silicon oxynitride film included in the hard mask was eliminated.

For the etching of the third silicon oxynitride film, the fourth processing was performed in which 500 W high frequency power was applied to the upper electrode and 1150 W high frequency power was applied to the lower electrode at a pressure of 3.3 Pa for 42 seconds using a mixed gas containing a $C_4F_6$ gas with a flow rate of 22 sccm, an oxygen gas with a flow rate of 30 sccm, and an argon gas with a flow rate of 800 sccm.

Then, by using the second tungsten film as the mask, the fifth processing was performed on the first tungsten film to form an opening portion reaching the top surface of the second In—Ga—Zn oxide by using the same dry etching apparatus as that used in the first processing, the second processing, the third processing, and the fourth processing.

As the etching of the first tungsten film, the fifth processing was performed in which 1000 W high frequency power was applied to the upper electrode and 50 W high frequency power was applied to the lower electrode at a pressure of 0.6 Pa for 12 seconds using a mixed gas containing a chlorine gas with a flow rate of 11 sccm, a $CF_4$ gas with a flow rate of 22 sccm, and an oxygen gas with a flow rate of 22 sccm. By performing the fifth processing, the second tungsten film serving as the hard mask was eliminated.

Then, oxygen plasma treatment was performed by using the same dry etching apparatus as that used in the first processing, the second processing, the third processing, the fourth processing, and the fifth processing. The oxygen plasma treatment was performed in which 500 W high frequency power was applied to the upper electrode and 100 W high frequency power was applied to the lower electrode at a pressure of 1.3 Pa for 40 seconds using an oxygen gas with a flow rate of 200 sccm.

The above-described first processing, the second processing, the third processing, the fourth processing, the fifth processing, and the oxygen plasma treatment were successively performed using the same dry etching apparatus.

Furthermore, with the use of the resist mask as the mask, processing was successively performed on Sample 1 by using the same dry etching apparatus as that used in the first processing, the fourth processing, the fifth processing, and the oxygen plasma treatment.

Accordingly, Sample 1 and Sample 2 were manufactured.

Next, critical dimension-scanning electron microscope OG 4500 (critical dimension-SEM: Critical Dimension-Scanning Electron Microscope) manufactured at Hitachi High-Technologies Corporation was used to measure the length of opening portions by Sample 1 and Sample 2.

Figure 47A:
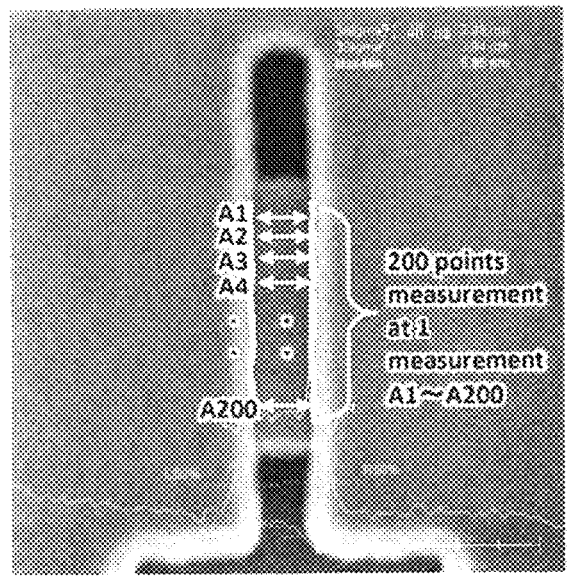
FIGS. 47A-47C are critical dimension-SEM images of examples.

To measure the length of the opening portion, six areas in samples of Sample 1 and Sample 2 were set and then measurements were performed three times in each area, that is, 18 times in total. The length of the opening portion shown in FIG. 47(A) was measured. Furthermore, at one measurement, 200 points were measured at a pitch of 1.35 nm (see FIG. 47(A).).

Figure 47B:
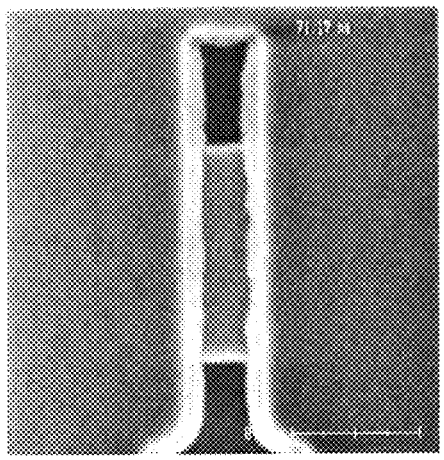
Figure 47C:
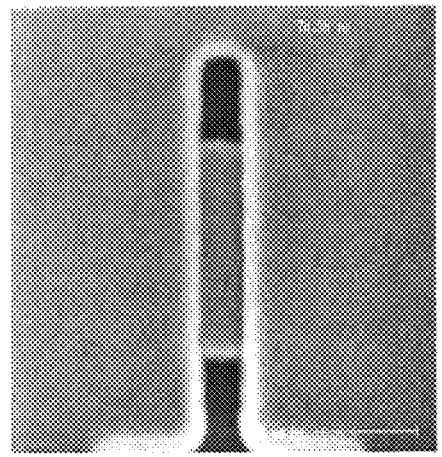
Figure 48A:
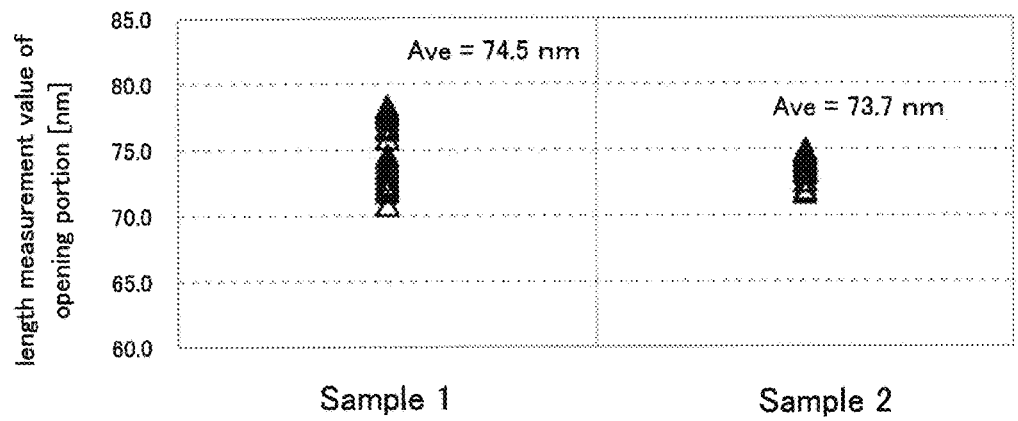
FIGS. 48A-48C are graphs showing critical dimension results of examples.
Figure 48B:
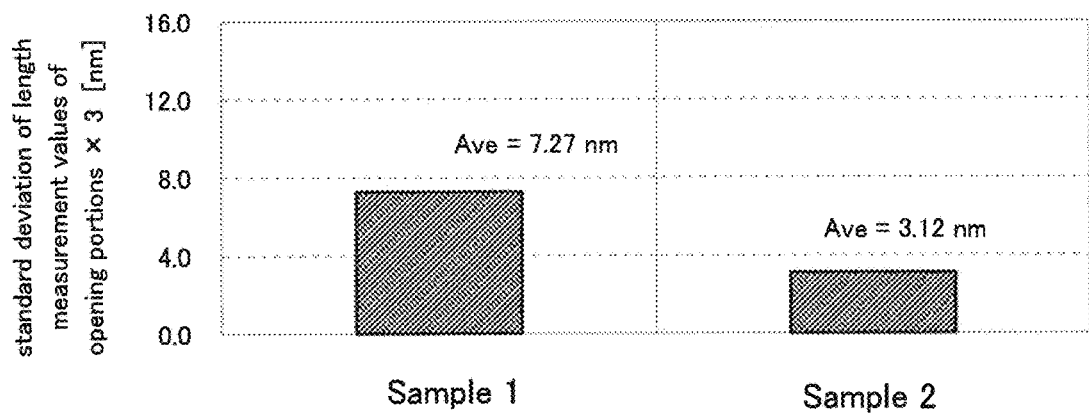

FIG. 47(B) is a critical dimension-SEM image of an opening portion of Sample 1. Furthermore, FIG. 47(C) is a critical dimension-SEM image of an opening portion of Sample 2. Measurements of lengths of the opening portions of Sample 1 and Sample 2 were performed at 6 areas×3 measurements, that is, 18 measurements in total. FIG. 48(A) shows a graph in which average values of each measurement (200 points measurement) are plotted. It was found that the total average value of Sample 1 is 74.5 nm and the total average value of Sample 2 is 73.7 nm and the difference between these Samples is small; however, Sample 2 has a smaller width and smaller variation of the plots. FIG. 48(B) is a graph in which the values of Sample 1 and Sample 2 that are three times the standard deviations of the average values of 18 measurements=6 areas×3 measurements are compared. Accordingly, it was found that the variation of the lengths of the opening portion of Sample 2 is smaller than that of Sample 1.

Figure 48C:
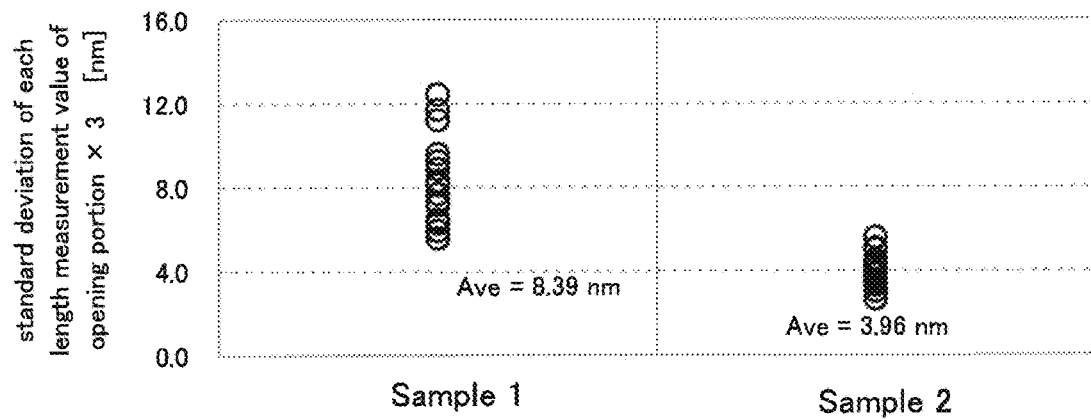

FIG. 48(C) shows a graph in which values that are three times the standard deviations of each measurement (200 points measurement) of 18 measurements=6 areas×3 measurements are plotted. The value that is three times the standard deviation of Sample 1 is 8.39 nm, and the value that is three times the standard deviation of Sample 2 is 3.96 nm, which shows that the variation of Sample 2 is small. Hence, it was found that variation of the opening portion of Sample 1 is large and small and has a large variation width, whereas variation of Sample 2 is small and has a small variation width.

According to these results, when processing is performed with the use of the hard mask as a mask, processing with less variation can be performed than when processing is performed with the use of the resist mask as the mask.

Example 2

In this example, cross-sectional shapes of the opening portions according to the present invention were observed with a scanning transmission electron microscope HD2300 (STEM: Scanning Transmission Electron Microscope) manufactured by Hitachi High-Technologies Corporation.

The following process was performed on Sample 1 and Sample 2 used in Example 1, so that the samples were fabricated. A third In—Ga—Zn oxide was formed over each of Sample 1 and Sample 2 to a thickness of 5 nm by a sputtering method, and a fourth silicon oxynitride film was formed over the third In—Ga—Zn oxide to a thickness of 10 nm by a CVD method.

Next, a titanium nitride film was formed on the fourth silicon oxynitride film to a thickness of 5 nm by a CVD method, and a third tungsten film was formed over the titanium nitride film to a thickness of 250 nm by a CVD method. Note that the titanium nitride film and the second tungsten film were successively formed.

Then, CMP treatment was performed until the third tungsten film, the titanium nitride film, and the fourth silicon oxynitride film reached the top surface of the second silicon oxynitride film, whereby the second tungsten film, the titanium nitride film, and the fourth silicon oxynitride film were embedded in the opening portion of the second oxynitride film. In such a manner, the sample was fabricated.

Figure 49A:
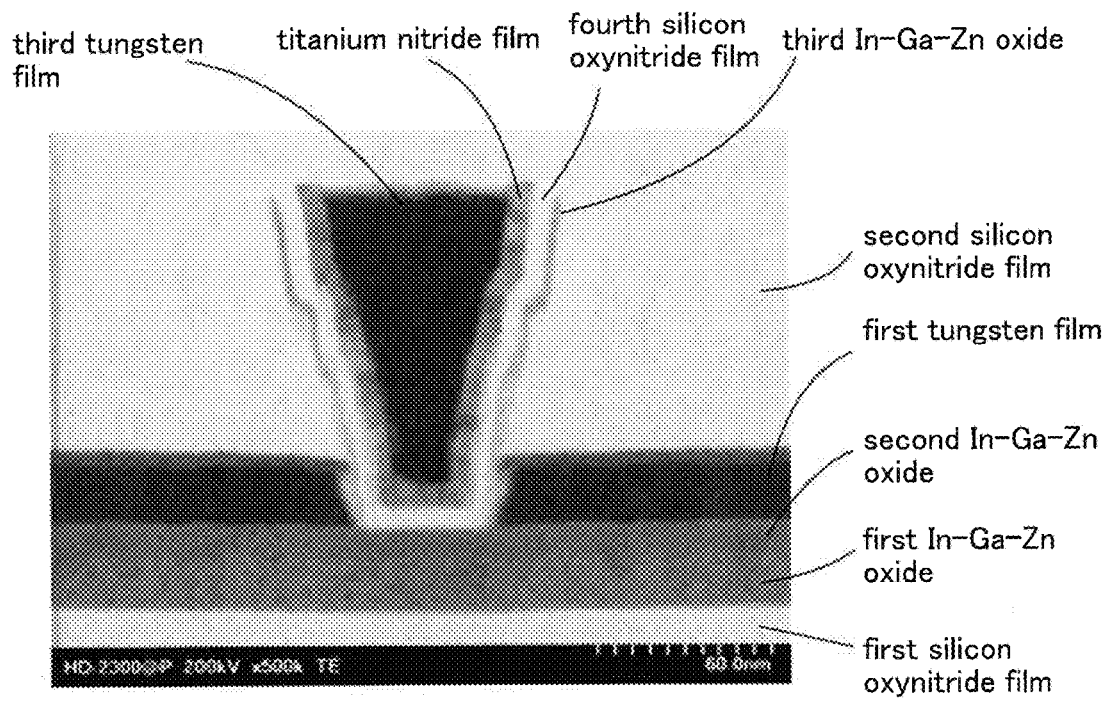
FIGS. 49A and 49B are cross-sectional STEM images of examples.
Figure 49B:
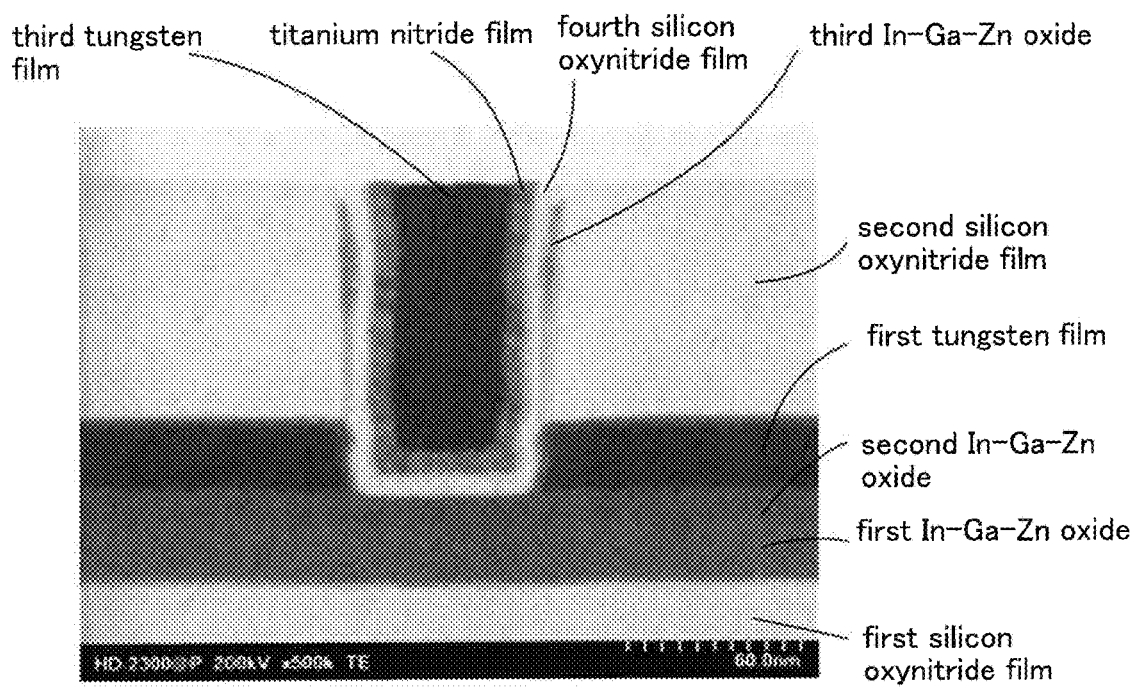

Then, the cross sections of Sample 1 and Sample 2 were observed by STEM. FIG. 49(A) is a STEM cross-sectional image of Sample 1 having an opening portion formed in the second oxynitride film and the first tungsten film with the use of the resist mask as the mask. FIG. 49(B) is a STEM cross-sectional image of Sample 2 having an opening portion formed in the second oxynitride film and the first tungsten film with the use of the hard mask as the mask.

From the cross-sectional observation by STEM, it was found that the cross section of Sample 1 has a wide opening portion in the top portion of the second silicon oxynitride film and has a shape that gets narrower to the bottom portion of the opening portion. From the cross section of Sample 2, it was found that the opening portion in the top portion of the second silicon oxynitride film and the bottom portion of the opening portion have substantially the same shape. Accordingly, it was found that a certain sized opening portion can be formed regardless of the thickness of the second silicon oxynitride film when the opening portion in the second silicon oxynitride film and the first tungsten film is formed with the use of the hard mask as the mask.

Example 3

In this example, cross sections were observed by STEM by manufacturing samples with more minute opening portions than that of Example 2.

First, a sample was fabricated in such a manner that a first silicon oxynitride film was formed on a single crystal silicon wafer to a thickness of 100 nm by a CVD method. Then, a first In—Ga—Zn oxide was formed on the silicon oxynitride film to a thickness of 20 nm by a sputtering method, and a second In—Ga—Zn oxide was formed on the first In—Ga—Zn oxide to a thickness of 15 nm by a sputtering method. Then, a first tungsten film was formed on the second In—Ga—Zn oxide to a thickness of 20 nm by a sputtering method.

Next, a 20-nm-thick first organic coating film was applied on the first tungsten film, and the first organic coating film and the first tungsten film were processed by a lithography method. Next the second In—Ga—Zn oxide and the first In—Ga—Zn oxide were processed using the first tungsten film as a mask.

Next, on the first silicon oxynitride film and the first tungsten film, a second silicon oxynitride film was formed to a thickness of 130 nm by a CVD method.

Then, a first titanium nitride film was formed on the second silicon oxynitride film to a thickness of 5 nm by a CVD method, and a second tungsten film was formed on the first titanium nitride film to a thickness of 50 nm by a CVD method. Note that the first titanium nitride film and the second tungsten film were successively formed.

Then, on the second tungsten film, a third silicon oxynitride film was formed to a thickness of 120 nm by a CVD method.

Next, first CMP treatment for polishing the third silicon oxynitride film was performed. Next, the second tungsten film and the first titanium nitride film were polished by second CMP treatment until the second silicon oxynitride film was exposed so that the second silicon oxynitride film located over the first tungsten film was planarized to have a thickness of 45 nm and a thickness of 100 nm located over first silicon oxynitride film.

Then, a third tungsten film was formed on the planarized second silicon oxynitride film to a thickness of 30 nm by a sputtering method, and a fourth silicon oxynitride film was formed on the third tungsten film to a thickness of 50 nm by a CVD method.

After that, a second organic coating film was applied to the fourth silicon oxynitride film, and a resist mask was formed by a lithography method.

Next, first processing for etching the second organic coating film, second processing for etching the fourth silicon oxynitride film, and third processing for etching the third tungsten film were performed using the resist mask as a mask. The first processing, the second processing, and the third processing were performed using a dry etching apparatus. At that time, the resist mask and the second organic coating film were eliminated by the first processing, the second processing, and the third processing. Through the above steps, a hard mask including the fourth silicon oxynitride film and the third tungsten film was formed.

The dry etching apparatus that was used has a structure in which high frequency power sources with different frequencies are connected to respective parallel plate type electrodes. For the etching of the second organic coating film, the first processing was performed in which 500 W high frequency power was applied to the upper electrode and 100 W high frequency power was applied to the lower electrode at a pressure of 3 Pa for 13 seconds using a $CF_4$ gas with a flow rate of 80 sccm. For the etching of the fourth silicon oxynitride film, the second processing was performed in which 550 W high frequency power was applied to the upper electrode and 350 W high frequency power was applied to the lower electrode at a pressure of 5.3 Pa for 28 seconds using a mixed gas containing an oxygen gas with a flow rate of 13 sccm and a $CHF_3$ gas with a flow rate of 67 sccm. For the etching of the third tungsten film, the third processing was performed in which 1000 W high frequency power was applied to the upper electrode and 100 W high frequency power was applied to the lower electrode at a pressure of 0.6 Pa for 10 seconds using a mixed gas containing a chlorine gas with a flow rate of 11 sccm, a $CF_4$ gas with a flow rate of 22 sccm, and an oxygen gas with a flow rate of 22 sccm.

Next, using the same dry etching apparatus as that in the first processing, the second processing, and the third processing, fourth processing for forming an opening portion was performed until the second silicon oxynitride film reached top surfaces of the first tungsten film and the first silicon oxynitride film using the hard mask including the fourth silicon oxynitride film and the third tungsten film as a mask. By the fourth processing, the fourth silicon oxynitride film included in the hard mask was eliminated.

For the etching of the second silicon oxynitride film, fourth processing was performed in which 500 W high frequency power was applied to the upper electrode and 1150 W high frequency power was applied to the lower electrode at a pressure of 3.3 Pa for 26 seconds using a mixed gas containing a $C_4F_6$ gas with a flow rate of 22 sccm, an oxygen gas with a flow rate of 30 sccm, and an argon gas with a flow rate of 800 sccm.

Next, using the third tungsten film as a mask, fifth processing for etching the first tungsten film was performed until the first tungsten film reached a top surface of the second In—Ga—Zn oxide to separate the first tungsten film into a fourth tungsten film and a fifth tungsten film with the use of the same dry etching apparatus as that in the first processing, the second processing, the third processing, and the fourth processing.

For the etching of the first tungsten film, fifth processing was performed in which 1000 W high frequency power was applied to the upper electrode and 25 W was applied to the lower electrode at a pressure of 0.6 Pa for 11 seconds using a mixed gas containing a chlorine gas with a flow rate of 11 sccm, a $CF_4$ gas with a flow rate of 33 sccm, and an oxygen gas with a flow rate of 11 sccm. By the fifth processing, the second tungsten film in the hard mask was eliminated.

Next, the oxygen plasma treatment was performed using the same dry etching apparatus as that used in the first processing, the second processing, the third processing, the fourth processing, and the fifth processing. The oxygen plasma treatment was performed in which 500 W high frequency power was applied to the upper electrode and 25 W high frequency power was applied to the lower electrode at a pressure of 1.3 Pa for 40 seconds using an oxygen gas with a flow rate of 200 sccm.

The first processing, the second processing, the third processing, the fourth processing, the fifth processing, and the oxygen plasma treatment were successively performed using the same dry etching apparatus.

Next, a third In—Ga—Zn oxide was formed to a thickness of 5 nm by a sputtering method, and a fifth silicon oxynitride film was formed on the third In—Ga—Zn oxide to a thickness of 10 nm by a CVD method.

Next, a second titanium nitride film was formed on the fifth silicon oxynitride film to a thickness of 5 nm by a CVD method, and a sixth tungsten film was formed on the second titanium nitride film to a thickness of 250 nm by a CVD method. Note that the second titanium nitride film and the sixth tungsten film were successively formed.

Next, third CMP treatment was performed until the sixth tungsten film, the second titanium nitride film, and the fifth silicon oxynitride film reached a top surface of the second silicon oxynitride film, whereby the sixth tungsten film, the second titanium nitride film, and the fifth silicon oxynitride film were embedded in the opening portion of the second oxynitride film. In such a manner, the sample was fabricated.

Figure 50:
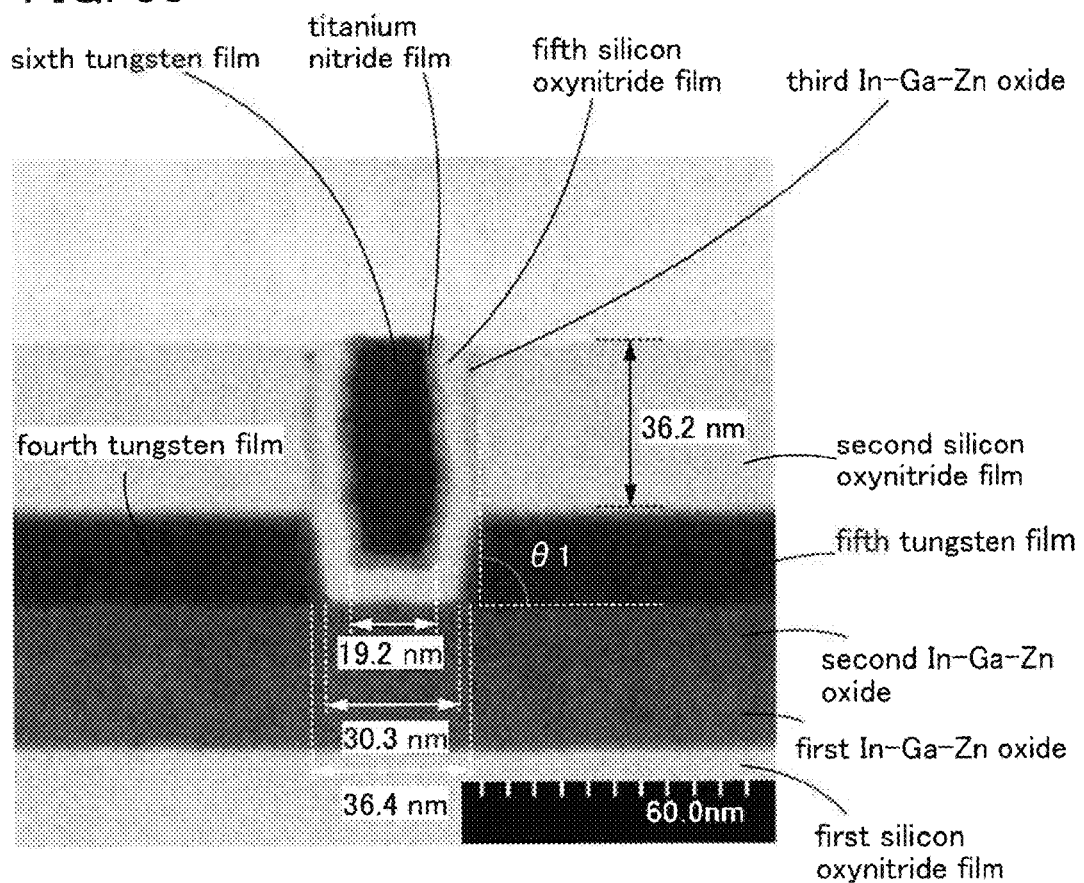
FIG. 50 is a cross-sectional STEM image of an example.

Then, a cross section of the sample was observed by STEM and length measurement was performed. FIG. 50 shows the cross-sectional photograph and the result of the length measurement.

From the cross-sectional observation by STEM and the length measurement were performed, the length of the region where the sixth tungsten and the second titanium nitride film function as the gate electrode overlaps with the second In—Ga—Zn oxide with the third In—Ga—Zn oxide and the fifth silicon oxynitride film which functions as the gate insulating film provided therebetween, in other words, the gate line width was approximately 19.2 nm.

Furthermore, in the fourth tungsten film or the fifth tungsten film having the function as the source electrode or the drain electrode, the length of the portion between the end portion of the fourth tungsten film and the end portion of the fifth tungsten film facing each other, in other words, the length corresponding to an L length of the transistor was approximately 30.3 nm when including the tungsten oxide film formed on the side surface of the fourth tungsten film or the fifth tungsten film and was approximately 36.4 nm when not including the tungsten oxide film. The thickness of the second silicon oxynitride film was approximately 36.2 nm.

Furthermore, it was found that the opening portion of the top portion in the second silicon oxynitride film and the bottom portion of the opening portion have substantially the same sized shape and an angle θ1 between the bottom portion of the first tungsten film and the side surface of the second silicon oxynitride film is substantially perpendicular. Accordingly, it was found that by forming an opening portion in the second silicon oxynitride film and the first tungsten film with the use of the hard mask as the mask, a more minute opening portion can be favorably formed.

EXPLANATION OF REFERENCE 200 imaging device
201 switch
202 switch
203 switch
210 pixel portion
211 pixel
212 subpixel
212B subpixel
212G subpixel
212R subpixel
220 photoelectric conversion element
230 pixel circuit
231 wiring
247 wiring
248 wiring
249 wiring
250 wiring
253 wiring
254 filter
254B filter
254G filter
254R filter
255 lens
256 light
257 wiring
260 peripheral circuit
270 peripheral circuit
280 peripheral circuit
290 peripheral circuit
291 light source
300 silicon substrate
301 insulator
302 insulator
303 electron trap layer
305 layer
310a conductor
310b conductor
310c conductor
320 layer
331 layer
340 layer
351 transistor
352 transistor
353 transistor
354 transistor
360 photodiode
361 anode
362 cathode
363 low-resistance region
365 photodiode
366 semiconductor layer
367 semiconductor layer
368 semiconductor layer
370 plug
371 wiring
372 wiring
373 wiring
374 wiring
380 insulator
381 insulator
400 substrate
401 insulator
402 insulator
403w opening size
404 conductor
404a conductor
404w distance
406a insulator
406a_1 insulator
406b semiconductor
406b_1 semiconductor
406c insulator
406c_1 insulator
407 region
408 insulator
410 insulator
410a insulator
412 insulator
412a insulator
414 conductor
415 conductor
416a1 conductor
416a2 conductor
417 conductor
417a conductor
418 insulator
419 insulator
419a insulator
420 resist mask
421a organic coating film
428 insulator
429 conductor
430 conductor
431 conductor
432 conductor
433 conductor
434 conductor
437 conductor
438 conductor
440 conductor
442 conductor
444 conductor
450 semiconductor substrate
454 conductor
460 region
462 insulator
464 insulator
465 insulator
466 insulator
467 insulator
468 insulator
469 insulator
470 insulator 472 insulator
474a region
474b region
475 insulator
476a conductor
476b conductor
476c conductor
477a conductor
477b conductor
477c conductor
478a conductor
478b conductor
478c conductor
479a conductor
479b conductor
479c conductor
480a conductor
480b conductor
480c conductor
483a conductor
483b conductor
483c conductor
483d conductor
483e conductor
483f conductor
484a conductor
484b conductor
484c conductor
484d conductor
485a conductor
485b conductor
485c conductor
485d conductor
487a conductor
487b conductor
487c conductor
488a conductor
488b conductor
488c conductor
489a conductor
489b conductor
490a conductor
490b conductor
491a conductor
491b conductor
491c conductor
492a conductor
492b conductor
492c conductor
494 conductor
496 conductor
498 insulator
550 interposer
551 chip
552 terminal
553 mold resin
600 panel
601 printed wiring board
602 package
603 FPC
604 battery
700 substrate
704a conductor
704b conductor
706a insulator
706b semiconductor
706c insulator
706d insulator
706e semiconductor
706f insulator
710 insulator
712a insulator
714a conductor
714b conductor
716a1 conductor
716a2 conductor
716a3 conductor
716a4 conductor
718a insulator
718b insulator
719 light-emitting element
720 insulator
721 insulator
728 insulator
731 terminal
732 FPC
733a wiring
734 sealant
735 driver circuit
736 driver circuit
737 pixel
741 transistor
742 capacitor
743 switching element
744 signal line
750 substrate
751 transistor
752 capacitor
753 liquid crystal element
754 scan line
755 signal line
781 conductor
782 light-emitting layer
783 conductor
784 partition wall
791 conductor
792 insulator
793 liquid crystal layer
794 insulator
795 spacer
796 conductor
797 substrate
800 RF tag
801 communication device
802 antenna
803 radio signal
804 antenna
805 rectifier circuit
806 constant voltage circuit
807 demodulation circuit
808 modulation circuit
809 logic circuit
810 memory circuit
811 ROM
1189 ROM interface
1190 substrate
1191 ALU
1192 ALU controller
1193 instruction decoder
1194 interrupt controller
1195 timing controller
1196 register
1197 register controller
1198 bus interface 1199 ROM
1200 memory element
1201 circuit
1202 circuit
1203 switch
1204 switch
1206 logic element
1207 capacitor
1208 capacitor
1209 transistor
1210 transistor
1213 transistor
1214 transistor
1220 circuit
2100 transistor
2200 transistor
2201 insulator
2202 wiring
2203 plug
2204 insulator
2205 wiring
2207 insulator
2208 insulator
2211 semiconductor substrate
2212 insulator
2213 gate electrode
2214 gate insulator
2215 source and drain regions
3001 wiring
3002 wiring
3003 wiring
3004 wiring
3005 wiring
3200 transistor
3300 transistor
3400 capacitor
4000 RF tag
4500 OG
6000 display module
6001 upper cover
6002 lower cover
6003 FPC
6004 touch panel
6005 FPC
6006 display panel
6007 backlight unit
6008 light source
6009 frame
6010 printed circuit board
6011 battery
7101 housing
7102 housing
7103 display portion
7104 display portion
7105 microphone
7106 speaker
7107 operation key
7108 stylus
7302 housing
7304 display portion
7311 operation button
7312 operation button
7313 connection terminal
7321 band
7322 clasp
7501 housing
7502 display portion
7503 operation button
7504 external connection port
7505 speaker
7506 microphone
7701 housing
7702 housing
7703 display portion
7704 operation key
7705 lens
7706 joint
7921 utility pole
7922 display portion
8000 camera
8001 housing
8002 display portion
8003 operation button
8004 shutter button
8005 connection portion
8006 lens
8100 finder
8101 housing
8102 display portion
8103 button
8121 housing
8122 display portion
8123 keyboard
8124 pointing device
8200 head-mounted display
8201 mounting portion
8202 lens
8203 main body
8204 display portion
8205 cable
8206 battery
9700 automobile
9701 car body
9702 wheels
9703 dashboard
9704 lights
9710 display portion
9711 display portion
9712 display portion
9713 display portion
9714 display portion
9715 display portion
9721 display portion
9722 display portion
9723 display portion

The invention claimed is:
1. A method for manufacturing a semiconductor device, comprising the steps of:
forming a second insulator over a first insulator;
forming a semiconductor over the second insulator;
forming a first conductor over the semiconductor;
etching part of the first conductor, part of the semiconductor, and part of the second insulator, thereby forming a multilayer film comprising the first conductor, the semiconductor, and the second insulator;
forming a third insulator over the first insulator and the multilayer film;
forming a second conductor over the third insulator;
forming a fourth insulator over the second conductor;
forming a resist mask over the fourth insulator by a lithography method;
etching part of the fourth insulator using the resist mask, thereby forming a first insulating layer;

etching part of the second conductor using the resist mask and the first insulating layer as a first mask, thereby forming a first conductive layer and removing the resist mask;

etching the third insulator using the first insulating layer and the first conductive layer as a second mask, thereby forming an opening portion in the third insulator and removing the first insulating layer;

etching the first conductor until the semiconductor is exposed using the first conductive layer as a third mask, thereby dividing the first conductor into a second conductive layer and a third conductive layer and removing the first conductive layer;

forming a fifth insulator over the third insulator and the semiconductor;

forming a sixth insulator over the fifth insulator;

forming a third conductor over the sixth insulator; and performing chemical mechanical polishing on the third conductor, the sixth insulator, and the fifth insulator, thereby exposing the third insulator, wherein the first conductor comprises a main constituent element contained in the second conductor.

2. The method according to claim 1, wherein each of the third insulator and the fourth insulator comprises silicon oxide.

3. The method according to claim 1, wherein the semiconductor comprises an oxide semiconductor.

4. A method for manufacturing a semiconductor device, comprising the steps of:

forming a second insulator over first insulator;

forming a semiconductor on the second insulator;

forming a first conductor over the semiconductor;

forming a multilayer film comprising the first conductor, the semiconductor, and the second insulator by etching part of the first conductor, part of the semiconductor, and part of the second insulator;

forming a third insulator on the second insulator and the multilayer film;

forming a second conductor over the third insulator;

forming a fourth insulator over the second conductor;

forming a resist mask over the fourth insulator by a lithography method;

etching part of the fourth insulator using the resist mask, thereby forming an etched fourth insulator;

etching part of the second conductor using the resist mask and the etched fourth insulator, thereby forming an etched second conductor and removing the resist mask;

etching the third insulator using the etched fourth insulator and the etched second conductor, thereby forming an opening portion in the third insulator and removing the etched fourth insulator;

etching the first conductor until the semiconductor is exposed using the etched second conductor, thereby dividing the first conductor into a first conductive layer and a second conductive layer and removing the etched second conductor;

forming a fifth insulator over the third insulator and the semiconductor;

forming a sixth insulator over the fifth insulator;

forming a third conductor over the sixth insulator; and performing chemical mechanical polishing on the third conductor, the sixth insulator, and the fifth insulator, thereby exposing the third insulator.

5. The method according to claim 4, wherein the first conductor comprises a main constituent element contained in the second conductor.

6. The method according to claim 4, wherein each of the third insulator and the fourth insulator comprises silicon oxide.

7. The method according to claim 4, wherein the semiconductor comprises an oxide semiconductor.

* * * * *